United States Patent
Tsuchi

(10) Patent No.: US 7,667,538 B2
(45) Date of Patent: *Feb. 23, 2010

(54) DIFFERENTIAL AMPLIFIER, DATA DRIVER AND DISPLAY

(75) Inventor: Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 300 days.

This patent is subject to a terminal disclaimer.

(21) Appl. No.: 11/410,576

(22) Filed: Apr. 25, 2006

(65) Prior Publication Data

US 2006/0238243 A1    Oct. 26, 2006

(30) Foreign Application Priority Data

Apr. 26, 2005   (JP)   ............... 2005-128056

(51) Int. Cl.
*H03F 1/14* (2006.01)
(52) U.S. Cl. .................. 330/51; 330/124 R; 330/53; 330/260
(58) Field of Classification Search ............ 330/51, 330/124 R, 53, 260
See application file for complete search history.

(56) References Cited

U.S. PATENT DOCUMENTS

| | | | |
|---|---|---|---|
| 6,331,846 B1 | 12/2001 | Nakao | |
| 6,373,419 B1 | 4/2002 | Nakao | |
| 6,535,189 B1 | 3/2003 | Akiyama | |
| 6,822,599 B2 | 11/2004 | Yoshioka et al. | |
| 2005/0088329 A1 | 4/2005 | Tsuchi | |
| 2005/0088390 A1 | 4/2005 | Tsuchi | |

FOREIGN PATENT DOCUMENTS

| | | |
|---|---|---|
| JP | 11-249623 | 9/1999 |
| JP | 11-305735 | 11/1999 |
| JP | 2000-183747 | 6/2000 |
| JP | 2001-34234 | 2/2001 |
| JP | 2001-343948 | 12/2001 |
| JP | 2004-194201 | 7/2004 |
| JP | 2005-130332 | 5/2005 |
| JP | 2005-160034 | 6/2005 |

*Primary Examiner*—Patricia Nguyen
(74) *Attorney, Agent, or Firm*—Scully, Scott, Murphy & Presser, P.C.

(57) ABSTRACT

A differential amplifier comprises terminals for receiving signals, and outputting a signal, and differential pairs, each having an input and output pair, the differential pairs supplied with currents, respectively, a load circuit connected to the differential pairs, an amplifier stage for receiving input, a signal of at least one connection node of the load circuit and output pairs of the differential pairs, the amplifier stage having an output connected to a terminal and a connection switching circuit for controlling switching between connection states of a first differential pair and second differential pair.

11 Claims, 43 Drawing Sheets

FIG.2

| | 1ST TIME PERIOD | 2ND TIME PERIOD |
|---|---|---|
| SWITCHES 121,123,151,153,155,157 | on | off |
| SWITCHES 122,124,152,154,156,158 | off | on |

FIG. 4

| | 1ST TIME PERIOD | 2ND TIME PERIOD |
|---|---|---|
| SWITCHES 121,123,161,163,165,167 | on | off |
| SWITCHES 122,124,162,164,166,168 | off | on |

FIG. 6

| | 1ST TIME PERIOD | 2ND TIME PERIOD |
|---|---|---|
| SWITCHES 121,123,131,133,135,137 | on | off |
| SWITCHES 122,124,132,134,136,138 | off | on |

FIG. 8

|  | 1ST TIME PERIOD | 2ND TIME PERIOD |
|---|---|---|
| SWITCHES 121,123,141,143,145,147 | on | off |
| SWITCHES 122,124,142,144,146,148 | off | on |

FIG. 10

| OFFSET | +Vf1<br>1ST TIME PERIOD | -Vf1<br>2ND TIME PERIOD | +Vf2<br>3RD TIME PERIOD | -Vf2<br>4TH TIME PERIOD |
|---|---|---|---|---|
| SWITCHES 121,123,151,155 | on | off | on | off |
| SWITCHES 122,124,154,158 | off | on | off | on |
| SWITCHES 153,157 | on | off | off | off |
| SWITCHES 152,156 | off | on | off | off |
| SWITCHES 173,177 | off | off | on | off |
| SWITCHES 172,176 | off | off | off | on |

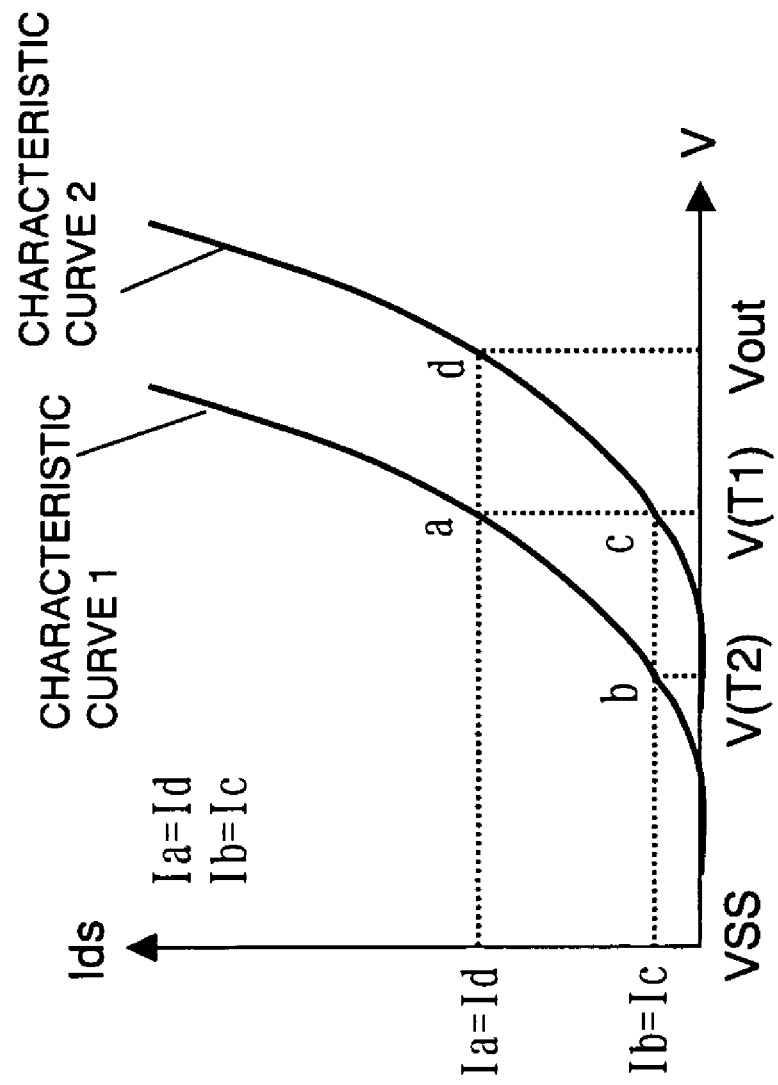

FIG. 34A

| LEVEL | REFERENCE VOLTAGE | V(T1) | V(T2) | B2,B1 |
|---|---|---|---|---|
| 1 |  | V2 | V3 | 0,0 |
| 2 | V2 | V2 | V2 | 0,1 |
| 3 | V3 | V3 | V3 | 1,0 |
| 4 |  | V3 | V2 | 1,1 |

FIG. 34B

| LEVEL | REFERENCE VOLTAGE | V(T1) | V(T2) | B4,B3,B2,B1 |
|---|---|---|---|---|
| 1 |  | V06 | V11 | 0,0,0,0 |
| 2 |  | V06 | V10 | 0,0,0,1 |
| 3 |  | V07 | V11 | 0,0,1,0 |
| 4 |  | V07 | V10 | 0,0,1,1 |
| 5 |  | V06 | V7 | 0,1,0,0 |
| 6 | V06 | V06 | V06 | 0,1,0,1 |
| 7 | V07 | V07 | V07 | 0,1,1,0 |
| 8 |  | V07 | V06 | 0,1,1,1 |
| 9 |  | V10 | V11 | 1,0,0,0 |
| 10 | V10 | V10 | V10 | 1,0,0,1 |
| 11 | V11 | V11 | V11 | 1,0,1,0 |
| 12 |  | V11 | V10 | 1,0,1,1 |
| 13 |  | V10 | V07 | 1,1,0,0 |
| 14 |  | V10 | V06 | 1,1,0,1 |
| 15 |  | V11 | V07 | 1,1,1,0 |
| 16 |  | V11 | V06 | 1,1,1,1 |

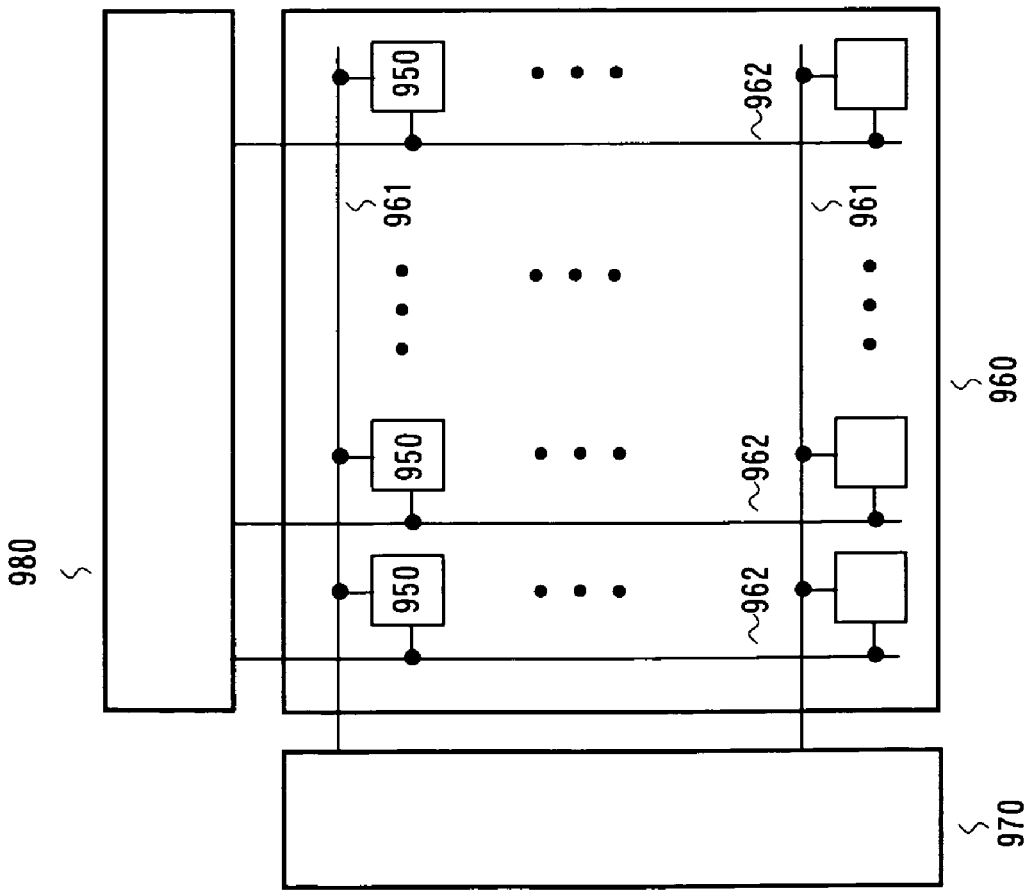

FIG. 43

| DIFFERENTIAL AMPLIFIER OF GROUP 1 | N'TH TIME PERIOD | (N+1)ST TIME PERIOD |
|---|---|---|
| SWITCHES 121,123,151,153,155,157 | on | off |
| SWITCHES 122,124,152,154,156,158 | off | on |
| DIFFERENTIAL AMPLIFIER OF GROUP 2 | N'TH TIME PERIOD | (N+1)ST TIME PERIOD |
| SWITCHES 121,123,151,153,155,157 | off | on |
| SWITCHES 122,124,152,154,156,158 | on | off |

DIFFERENTIAL AMPLIFIER, DATA DRIVER AND DISPLAY

FIELD OF THE INVENTION

This invention relates to a differential amplifier, a data driver and a display device employing the differential amplifier.

BACKGROUND OF THE INVENTION

Liquid crystal display devices (LCDs) characterized by their thin design, light weight and low power consumption have come into widespread use in recent years and are utilized in the display units of mobile devices such as portable telephones (mobile telephones or cellular telephones), PDAs (Personal Digital Assistants) and laptop personal computers. Recently, however, liquid crystal display devices have come to be provided with large-size screens and techniques for dealing with moving pictures have become more advanced, thus making it possible to realize not only mobile applications but also stay-at-home large-screen display devices and large-screen liquid crystal televisions. Liquid crystal display devices that adopts an active matrix drive system and are capable of presenting a high-definition display are being utilized as these liquid crystal displays devices.

The typical structure of an active-matrix liquid crystal display device will be described with reference to FIGS. 35A and 35B. Referring to first to FIG. 35A, a display unit 960 of a display of the active matrix driving system is formed by a semiconductor substrate on which pixel parts 950 are arranged in the form of a matrix and on which scan lines 961 and data lines 962 are arranged in a lattice. In the case of an SXGA color panel, for example, the matrix is composed of 1280×3 pixel columns by 1024 pixel rows. The scan lines 961 and the data lines 962 are connected to a gate driver 970 and to a data driver 980, respectively. The gate driver 970 supplies scan signals to the pixel parts 950 via the scan lines 961, while the data driver 980 supplies gray scale voltage signals, corresponding to video data, to the pixel parts 950 via the data lines 962.

The gate driver 970 and the data driver 980 are controlled by a display controller, not shown, so as to be thereby supplied with a clock signal CLK, as necessary, control signals or with the power supply voltage. The video data are supplied to the data driver 980. At the present time, video is principally digital data.

In FIG. 35B, the essential portions of the pixel part 950 (one pixel) in a liquid crystal display is schematically shown by an equivalent circuit. Thus, the pixel part 950 includes a TFT (thin-film transistor) 951, a pixel electrode 952, a liquid crystal (capacitance) 953, and a common electrode 954. The TFT 951 is connected, as a switching device, between the data line 962 and the pixel electrode 952, and has its control end connected to the scan line 961. As for the liquid crystal (capacitance) 953, the liquid crystal, sandwiched between the pixel electrode 952 and the common electrode 954, operates as a capacitance device. In general, the common electrode 954 is formed as a sole transparent electrode on an entire surface of an opposing substrate, which is mounted facing the semiconductor substrate. The liquid crystal is sealed in a space between the semiconductor substrate and the opposing substrate.

The mechanism of display is now briefly described. The TFT 951, having the switching function, is on/off controlled by the scan signal. When the TFT 951 is turned on, a grayscale voltage signal, corresponding to a video data signal, is supplied to the pixel electrode 952. The liquid crystal is varied in its light transmittance by the potential difference between the pixel electrode 952 and the common electrode 954. This potential difference is kept for a preset time period by the liquid crystal (capacitance) 953, even after turning off the TFT 951, to display a picture. Meanwhile, storage capacitance, for example, may be provided between the pixel electrode 952 and the common electrode 954 for holding the potential in stability.

Rewriting of one screen of data is carried out over one frame (1/60 of a second), data is selected sequentially every pixel row (every line) by each scan line, and a grayscale signal voltage is supplied from each data line within the selection period.

The scan line 961 and the data line 962 have respective interconnection resistances and interconnection capacitances which includes capacitances at the intersections therebetween and the capacitance of the liquid crystal sandwiched between the semiconductor substrate and the opposing substrate. Hence, a high driving capability is required of the gate driver 970 and the data driver 980. It is noted that the larger the display size and/or the higher the resolution, the higher is the driving capability required.

It is sufficient that the gate driver 970 supplies at least binary scan signals. It is however required of the data driver 980 to drive the data line with a multi-valued gray scale voltage signal corresponding to the number of gray scales. Hence, the data driver 980 includes a decoder for converting a video data signal into a gray-scale voltage signal, and a digital-to-analog converter (DAC) which includes an OP (operational) amplifier for amplifying the gray-scale voltage signal and for outputting the so amplified voltage signal to the data line 962.

With the progress that has been made in raising image quality (increasing the number of colors) in liquid crystal display devices, there is now growing demand for at least 260,000 colors (video data of six bits per each of the colors R, G, B) and preferably 26,800,000 colors (video data of eight bits per each of the colors R, G, B) or more.

For this reason, a data driver that outputs a grayscale signal voltage corresponding to a multiple-bit video data signal is required to output the voltage with an extremely high accuracy and the number of devices of the circuitry for processing video data is increased. This increases the chip area of the data-driver LSI chip and invites an increase in cost.

The configuration in which the chip area of the data driver LSI is suppressed from increasing despite the use of larger numbers of bits is shown in Patent Document 1, indicated below. FIG. 36 hereof corresponds to FIG. 16 of the Patent Document 1, and shows an example of the constitution of a data driver proposed in the Patent Document 1.

Referring to FIG. 36, this data driver includes a latch address selector 981, a latch 982, a gray-scale voltage generator 986, a decoder 987 and an amplifier circuit 988.

The latch address selector 981 decides on the timing of data latching, responsive to a clock signal CLK.

The latch 982 latches digital video data based on the timing, as set by the latch address selector 981, and outputs data to the decoders 987, in unison, responsive to an STB signal (strobe signal).

The gray-scale voltage generator 986 generates gray-scale voltages V0, V2, V4, . . . , V(m−2), and V(m), every two gray-scale levels, thereby decreasing the total number of the gray-scale voltage lines of the decoder 987 to approximately one-half of that used heretofore, more specifically, used at the time of filing of Patent Document 1, indicated below.

The decoder 987 selects two gray-scale voltages, responsive to the video data, to output the so selected voltages to the amplifier circuit 988. The amplifier circuit 988 is able to amplify and output two input gray-scale voltages and a gray-scale voltage which is intermediate between the two gray-scale voltages.

The configuration shown in the Patent Document 1, is provided with the amplifier circuit 988 which amplifies one of the two input gray-scale voltages and the intermediate voltage. With this configuration, the number of the gray scale voltages of the decoder 987 may be halved to reduce the circuit size of the decoder 987, thereby saving the space and reducing the cost. The result is that the chip area of the data driver LSI may be suppressed from increasing, in the face of increase in the number of bits in the video data signal.

Meanwhile, FIG. 5(b) of the Patent Document 1 shows an amplifier suited for use as the amplifier circuit 988. The configuration shown in FIG. 5(b) of Patent Document 1, in which outputs of the differential pair are supplied to the input of a current mirror, connected in the form of diode connection, is thought to be not operating as a differential amplifier. According to analyses by the present inventor, the feature of the amplifier circuit 988 is like that of an amplifier shown at 85-1 of FIG. 15 of Patent Document 3, indicated below, despite the difference in the polarities.

The configuration for realization of high accuracy of the output voltage of the data driver adapted for multi-bits, has been proposed in Patent Document 2, indicated below. In this Patent Document 2, showing a method for driving a liquid crystal display, a video signal voltage, plus an offset voltage, and a video signal voltage, less the offset voltage, are alternately output from an amplifier output, each preset period, to video signal lines (data lines), thereby balancing out the increase and the decrease of luminance of the liquid crystal display caused by the offset.

As an amplifier circuit for implementing the driving method, the Patent Document 2, discloses an embodiment of a voltage follower circuit. However, area saving cannot be achieved in the amplifier circuit of the voltage follower circuit. There is proposed in Patent Document 3, indicated below, a configuration for implementing the driving method of Patent Document 2 in an amplifier circuit, which is supplied with two gray-scale voltages to output one of the two gray-scale voltages and an intermediate voltage.

FIG. 37 is a diagram showing the configuration of an amplifier circuit of an output unit of the data driver proposed in Patent Document 3. This configuration corresponds to the configuration shown in FIG. 15 of the Patent Document 3. Referring to FIG. 37, this amplifier circuit includes an amplifier 85-1 and a switch circuit 42. In the amplifier 85-1, transistors Q14 and Q13, constituting a second differential pair, are connected in parallel with transistors Q11 and Q12, constituting a first differential pair. The first and second differential pairs are driven by a common current source Q1. A current mirror (Q3, Q4) is connected in common, as a load circuit, to output pairs of the respective differential pairs. The common connection nodes of an output end of the current mirror (Q3, Q4) (the drain of transistor Q4) and the transistors Q12 and Q13 is an output of the differential stage and is connected to the gate of a transistor amplifier Q5. The gates of the transistors Q12 and Q13 operate as non-inverting input ends, while the gates of the transistors Q11 and Q14 operate as inverting input ends. The gates of the transistors Q11 and Q14 are connected to an output end OUT. When two gray-scale voltages are input to the gates of the transistors Q12 and Q13, an intermediate voltage between the two gray-scale voltages can be output at the output end OUT.

With the amplifier of the above configuration,
in case the two input gray-scale voltages are equal to each other, the output voltage is equal to the input gray-scale voltage and
in case the two input gray-scale voltages are different from each other, the output voltage is intermediate between the two input gray-scale voltages.

That is, such amplifier is desirable for use as the amplifier circuit 988 of FIG. 36.

According to the description of Patent Document 3, the connection across the differential input ends of the amplifier 85-1, the terminals IN1 and IN2 for receiving the first and second gray-scale voltages, and the output end OUT, is controlled by the switch circuit 42, and a first state in which the gates of the transistors Q12 and Q13 are connected to IN1 and IN2, respectively, and the gates of the transistors Q11 and Q14 are connected to OUT;

a second state in which the gates of the transistors Q12 and Q13 are connected to IN2 and IN1, respectively, and the gates of the transistors Q11 and Q14 are connected to OUT;

a third state in which the gates of the transistors Q11 and Q14 are connected to IN1 and IN2, respectively, and the gates of the transistors Q12 and Q13 are connected to OUT;

a fourth state in which the gates of the transistors Q1 and Q14 are connected to IN2 and IN1, respectively, and the gates of the transistors Q12 and Q13 are connected to OUT;

are changed over at a preset cycle.

It is stated that, by periodically changing over these four states, output offsets ascribable to transistor threshold variations making up the amplifier 85-1 may be time-averaged and thereby canceled.

However, it may be surmised that, in the third and fourth states, desired voltages cannot be output correctly, because two gray-scale voltages are entered to the inverting input ends. It may also be surmised that, in FIG. 37, output offset may be canceled to a certain extent in case of changeover to the first and second states.

[Patent Document 1]
JP Patent Kokai Publication No. JP-P2001-34234A (FIGS. 5 and 16)

[Patent Document 2]
JP Patent Kokai Publication No. JP-A-11-249623

[Patent Document 3]
JP Patent Kokai Publication No. JP-P2001-343948A (FIG. 15)

SUMMARY OF THE DISCLOSURE

It has been pointed out that the amplifier 85-1, shown in FIG. 37, suffers from the problem that, if, in the first or second state, an intermediate voltage between the two input gray-scale voltages is output, with the voltage difference between the two input values being of a large value, the output voltage is not an intermediate voltage, but is offset to one or the other of the two input voltages (see the description on page 13 of Patent Document 1, paragraph [0113]).

The present inventor has conducted investigation of the characteristic and problem of the amplifier 85-1 of FIG. 37, disclosed in Patent Document 3. The results are described hereinbelow.

FIG. 38 is a graph showing the operation in which, in the aforementioned first or second state, the amplifier 85-1 of FIG. 37 outputs the intermediate voltage Vout which is intermediate between the two gray-scale voltages IN1 and IN2. In the following description, reference is to be made to FIG. 38.

It is assumed that the transistors of the two differential pairs (Q11, Q12) and (Q13, Q14) of the amplifier 85-1 are of the same size. The currents flowing through the transistors Q11, Q12, Q13 and Q14 are labeled I11, I12, I13 and I14, respectively. FIG. 38 shows a case where the values of the input voltages IN1 and IN2 satisfies IN1<IN2. FIG. 38 shows the relationship between the absolute values of the drain-to-source current Ids (ordinate) and the gate voltage V of each transistor of the differential pairs (abscissa). Specifically, the figure shows a characteristic curve of the transistors Q11 to Q14 (|Ids|-Vg characteristic).

The two differential pairs (Q11, Q12) and (Q13, Q14) have sources connected in common, with the respective transistors being of the same size. Hence, the transistors of the two differential pairs have operating points on the common characteristic curve shown in FIG. 38. Since the input and output currents of the current mirrors (Q3, Q4) are equal to each other, the currents flowing through the respective transistors of the two differential pairs satisfy the following equation:

$$I11+I14=I12+I13$$

Moreover, since the transistors Q11 and Q14 have sources and drains connected in common, while having gates connected in common and to the output end OUT, the currents flowing therethrough are equal. Hence, we obtain the following equation:

$$I11=I14$$

From the above two equations, the currents I11 and I14, flowing through the transistors Q1 and Q14, respectively, are each equal to bisection of the sum of the currents I12 and I13, which flow through the transistors Q12 and Q13, respectively, with the corresponding voltage being Vout.

The characteristic curve of the transistor is approximately a quadratic curve. Thus, as may be seen from FIG. 38, the characteristic curve may be approximated by a straight line when the voltage difference between the voltages IN1 an IN2 is small. Hence, the voltage Vout is of a value bisecting the voltages IN1 an IN2 (intermediate voltage).

However, as the voltage difference between the voltages IN1 an IN2 increases, the voltage Vout is shifted towards the low potential side voltage IN1.

Thus, with the amplifier 85-1 of FIG. 37, the intermediate voltage between the two gray-scale voltages can be output with a high accuracy only when the voltage difference between the two input values is extremely small, even in the absence of variations in the transistor thresholds.

Moreover, the data driver of FIG. 36 suffers from a problem that, with the use of the amplifier 85-1 of FIG. 37, the number of the gray-scale voltage supply lines of the decoder 987 can be decreased only up to one-half of that of the conventional decoder, while it is impossible to decrease its number less than one-half to save the chip area.

Accordingly, it is an object of the present invention to provide a differential amplifier capable of outputting four different voltages for two different input voltages with high accuracy, even in case of increase in the difference between two input voltages.

It is another object of the present invention to provide a differential amplifier in which output offsets ascribable to variations in transistor characteristics may effectively be canceled by time averaging.

It is a further object of the present invention to provide an area-saving data driver in which, through the use of the differential amplifier capable of outputting the voltage with high accuracy over a wide voltage range, the number of gray-scale voltages as well as the number of devices used in the decoder may appreciably be reduced.

It is yet another object of the present invention to provide a display in which a narrow frame in mounting the data driver as well as reduction in cost may be achieved.

The above and other objects are attained by the present invention as follows:

A differential amplifier according to one aspect of the present invention comprises first and second differential pairs having output pairs connected to a common load circuit, and an amplifier stage receiving, as input, a signal in at least one connection node of a connection node pair to output pairs of the first and second differential pairs, and outputting an output signal of the differential amplifier at an output end. The first and second differential pairs are driven by current sources associated therewith. The output signal is fed back to one of inputs of input pairs of the first and second differential pairs. The first and second input signals are supplied to the other inputs of the input pairs of the first and second differential pairs. The differential amplifier according to the present invention also includes a switching circuit for switching between at least two states in connection with the combinations of input signals to the input pairs of the first and second differential pairs. More specifically, the differential amplifier of the present invention includes first and second input terminals, receiving signals, a third terminal, outputting a signal, first and second differential pairs, having output pairs connected to a common load circuit, and an amplifier stage. The first and second differential amplifiers are driven by associated current sources. The amplifier stage receives, as input, a signal in at least one connection node of a connection node pair of the load circuit and output pairs of the first and second differential pairs. The differential amplifier also includes a connection switching circuit for controlling the switching between a first connection state in which first and second inputs of an input pair of the first differential pair are connected to the first and second terminals, respectively, and in which first and second inputs of an input pair of the second differential pair are connected to the first terminal and to the third terminal, respectively, and a second connection state in which the first and second inputs of the input pair of the first differential pair are connected to the third and first terminals, respectively, and in which the first and second inputs of the input pair of the second differential pair are connected to the second terminal and to the first terminal, respectively.

A differential amplifier according to another aspect of the present invention may comprise first and second terminals, receiving signals, a third terminal outputting a signal, first and second differential pairs having an output pair connected to a common load circuit, and being driven by corresponding current sources, and an amplifier stage. The amplifier stage receives, as an input, a signal in at least one connection node of a connection node pair of the load circuit and output pairs of the first and second differential pairs, and has an output connected to the third terminal. The differential amplifier according to the present invention may also comprise a connection switching circuit for controlling the switching between a first connection state and a second connection state. The first connection state is such a one in which first and second inputs of an input pair of the first differential pair are connected to the first and second terminals, respectively, and in which first and second inputs of an input pair of the second differential pair are connected to the first terminal and to the third terminal, respectively. The second connection state is such a one in which the first and second inputs of the input pair of the first differential pair are connected to the second and first terminals, respectively, and in which the first and second inputs of the input pair of the second differential pair are connected to the third terminal and to the first terminal, respectively.

The present invention may be of the following configuration. It is noted that reference numerals in parentheses are for clarifying the configuration of the present invention and are not intended for limiting the invention.

A differential amplifier in one aspect of the present invention is shown in FIGS. 1 and 3 in common, in which a second differential pair of FIG. 1 is a first differential pair of FIG. 3. The differential amplifier comprises first and second terminals (T1, T2) receiving two signal voltages, a third terminal (3) outputting an output signal, first and second differential pairs, a current to voltage converter and an amplifier circuit (109). The first and second differential pairs are driven by first and second current sources, one ends of which are connected to a first power supply. The current to voltage converter is connected between output pairs of the first and second differential pairs and the second power supply and combines output currents flowing through the first and second differential pairs to output a voltage based on the currents combined.

The amplifier circuit is connected between an output end of the current to voltage converter and the terminal which outputs the output signal (Vout). The differential amplifier further includes a first connection state in which first input of an input pair of the first differential pair is connected to the first terminal, second input is connected to the second terminal, first input of an input pair of the second differential pair is connected to the first terminal, second input being connected to the third terminal, and a second connection state in which the first input of the input pair of the first differential pair is connected to the third terminal, the second input is connected to the first terminal, the first input of the input pair of the second differential pair is connected to the second terminal, and in which the second input is connected to the first terminal. The differential amplifier further includes a connection switching circuit for switching between the first and second connection states.

According to the present invention, the connection switching circuit includes first and second switches connected between the first input of the input pair of the first differential pair on one hand and the first and third terminals, respectively, on the other, third and fourth switches connected between the second input of the input pair of the first differential pair on one hand and the second and first terminals, respectively, on the other, fifth and sixth switches connected between the first input of the input pair of the second differential pair on one hand and the first and second terminals, respectively, on the other, and seventh and eighth switches connected between the second input of the input pair of the second differential pair on one hand and the third and first terminals, respectively, on the other.

According to the present invention, the first, third, fifth and seventh switches are turned on and the second, fourth, sixth and eighth switches are turned off in the first connection state, and the first, third, fifth and seventh switches are turned off and the second, fourth, sixth and eighth switches are turned on in the second connection state.

A differential amplifier in one aspect of the present invention is shown in FIGS. 5 and 7 in common, in which a second differential pair of FIG. 5 is a first differential pair of FIG. 7. The differential amplifier comprises first and second terminals (T1, T2) receiving two signal voltages, a third terminal (3) outputting an output signal, first and second differential pairs, a current to voltage converter and an amplifier circuit (109). The first and second differential pairs are driven by first and second current sources, one ends of which are connected to a first power supply, respectively. The current to voltage converter is connected between output pairs of the first and second differential pairs and a second power supply, and combines output currents through the first and second differential pairs to output a voltage based on the combined currents. The amplifier circuit is connected between an output end of the current to voltage converter and the terminal outputting the output signal (Vout). The differential amplifier according to the present invention further comprises a connection switching circuit for switching between a first connection state and a second connection state. The first connection state is such a one in which first input of an input pair of the first differential pair is connected to the first terminal, second input is connected to the second terminal, first input of an input pair of the second differential pair is connected to the first terminal, and in which second input is connected to the third terminal. The second connection state is such a one in which the first input of the input pair of the first differential pair is connected to the second terminal, the second input is connected to the first terminal, the first input of an input pair of the second differential pair is connected to the third terminal, and in which the second input is connected to the first terminal.

According to the present invention, the connection switching circuit includes first and second switches connected between the first input of the input pair of the first differential pair on one hand and the first and second terminals, respectively, on the other, third and fourth switches connected between the second input of the input pair of the first differential pair on one hand and the second and first terminals, respectively, on the other, fifth and sixth switches connected between the first input of the input pair of the second differential pair on one hand and the first and third terminals, respectively, on the other, and seventh and eighth switches connected between the second input of the input pair of the second differential pair on one hand and the third and first terminals, respectively, on the other.

According to the present invention, the first, third, fifth and seventh switches are turned on and the second, fourth, sixth and eighth switches are turned off, in the first connection state, and the first, third, fifth and seventh switches are turned off and the second, fourth, sixth and eighth switches are turned on, in the second connection state.

A differential amplifier in a first aspect of the present invention comprises first and second terminals (T1, T2) receiving two signal voltages, a third terminal (T3) outputting an output signal, first and second differential pairs, a current to voltage converter and an amplifier circuit (109). The first and second differential pairs are respectively driven by first and second current sources, one ends of which are connected to a first power supply. The current to voltage converter is connected between output pairs of the first and second differential pairs and a second power supply, and combines output currents through the first and second differential pairs to output a voltage based on the currents combined. The amplifier circuit is connected between an output end of the current to voltage converter and the terminal outputting the output voltage (Vout). The differential amplifier further comprises a connection switching circuit for switching among first, second, third and fourth states. The first connection state is such a one in which first input of an input pair of the first differential pair is connected to the first terminal, second input is connected to the second terminal, first input of an input pair of the second differential pair is connected to the first terminal, and in which second input is connected to the third terminal. The second connection state is such a one in which the first input of the input pair of the first differential pair is connected to the third terminal, the second input is connected to the first terminal, the first input of the input pair of the second differential pair is connected to the second terminal, and in which the second input is connected to the first terminal. The third connection state is such a one in which the first input of the input pair of the first differential pair is connected to the first terminal, the second input is connected to the third terminal, the first input of the input pair of the second differential pair is connected to the first terminal, and in which the second input is connected to the second terminal. The fourth connection state is such a one in which the first input of the input pair of the first differential pair is connected to the second terminal, the second input is connected to the first terminal, the first input of the input pair of the second differential pair is connected to the third terminal, and in which the second input is connected to the first terminal. The connection switching circuit switches among the first, second, third and fourth connection states in a preset sequence.

According to the present invention, the connection switching circuit includes first, second and third switches, connected between the first input of the input pair of the first differential pair on one hand and the first, second and third terminals, respectively, on the other, fourth, fifth and sixth switches, connected between the second input of the input pair of the first differential pair on one hand and the first, second and third terminals, respectively, on the other, seventh, eighth and ninth switches, connected between the first input of the input pair of the second differential pair on one hand and the first, second and third terminals, respectively, on the other, and tenth, eleventh and twelfth switches, connected between the second input of the input pair of the second differential pair on one hand and the first, second and third terminals, respectively, on the other.

According to the present invention, the first, fifth, seventh and twelfth switches, out of the first to twelfth switches, are turned on, with the remaining switches being turned off, in the first connection state, and the third, fourth, eighth and tenth switches, out of the first to twelfth switches, are turned on, with the remaining switches being turned off in the second connection state. Moreover, the first, sixth, seventh and eleventh switches, out of the first to twelfth switches, are turned on, with the remaining switches being turned off, in the third connection state, and the second, fourth, ninth and tenth switches, out of the first to twelfth switches, are turned on, in the fourth connection state, with the remaining switches being turned off.

According to the present invention, the above two signals are a first input signal (V(T1)), entered to the first terminal, and a second input signal (V(T2)), entered to the second terminal. The output signal (Vout) is a voltage externally dividing or extrapolating the first input signal (V(T1)) and the second input signal (V(T2)) at a preset ratio. In the present invention, the preset ratio is 1:2, as an example.

A data driver according to the present invention, driving data lines based on input digital data signals, comprises the aforementioned differential amplifier. The data driver also comprises a plurality of the differential amplifiers for driving the data lines and connection switching signals for controlling the connection switching circuits. The differential amplifiers are divided into first and second groups. When controlling the first group of the differential amplifiers to first connection state, the connection switching signals controls the second group of the differential amplifiers to the second connection state. When controlling the first group of the differential amplifiers to second connection state, the connection switching signals control the second group of the differential amplifiers to the first connection state.

The display according to the present invention includes a data driver, including the differential amplifier and a display panel, and drives the data lines of the display panel, based on output signals of the data driver.

A display according to the present invention comprises a plurality of data lines extending in one direction parallel to one another, a plurality of scan lines extending parallel to one another in a direction perpendicular to the one direction, a plurality of pixel electrodes arranged in a matrix configuration at points of intersection of the data lines and the scan lines, a plurality of transistors, a gate driver and a data driver. The transistors are associated with the pixel electrodes so that ones of drain inputs and source inputs of the transistors are connected to the pixel electrodes associated therewith, the remaining ones of the source inputs and drain inputs are connected to the data lines, and so that gates of the transistors are connected to the scan lines. The gate driver supplies scan signals to the scan lines and the data driver supplies gray-scale signals, associated with input data, to the data lines. The data driver is the data driver for the above display.

The meritorious effects of the present invention are summarized as follows.

With the differential amplifier according to the present invention, four different voltages may be output for two different input voltages. Output voltages may be obtained with high accuracy even if the difference between the input voltages is increased.

With the differential amplifier according to the present invention, output offsets ascribable to variations in transistor characteristics may be effectively canceled by time averaging.

According to the present invention, the number of reference voltages may be decreased significantly with the use of the above differential amplifier capable of providing output voltages with high accuracy over a wide voltage range, thereby achieving an area-saving data driver capable of significantly reducing the number of the devices of the decoder.

Moreover, according to the present invention, it is possible to provide a display in which area saving in the data driver may be achieved and in which the frame width in mounting the data driver may be decreased as the cost is reduced.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2 is a diagram showing a method for on/off control of switches of the differential amplifier of FIG. 1.

FIG. 4 is a diagram showing a method for on/off control of switches of the differential amplifier of FIG. 3.

FIG. 6 is a diagram showing a method for on/off control of switches of the differential amplifier of FIG. 5.

FIG. 8 is a diagram showing a method for on/off control of switches of the differential amplifier of FIG. 7.

FIG. 10 is a diagram showing a method for on/off control of switches of the differential amplifier of FIG. 9.

FIG. 33 is a graph for illustrating the operation of a differential amplifier of FIG. 11.

FIGS. 34A and 34B are diagrams for illustrating the correlation between the input and output levels and the reference voltage in the differential amplifier of FIG. 11.

FIGS. 35A and 35B are diagrams showing a typical configuration of a display apparatus of the active matrix driving system.

FIG. 43 is a diagram for illustrating a method for on/off control of the switches of the differential amplifier of FIG. 1 as applied to a data driver.

PREFERRED EMBODIMENTS OF THE INVENTION

Figure 1:
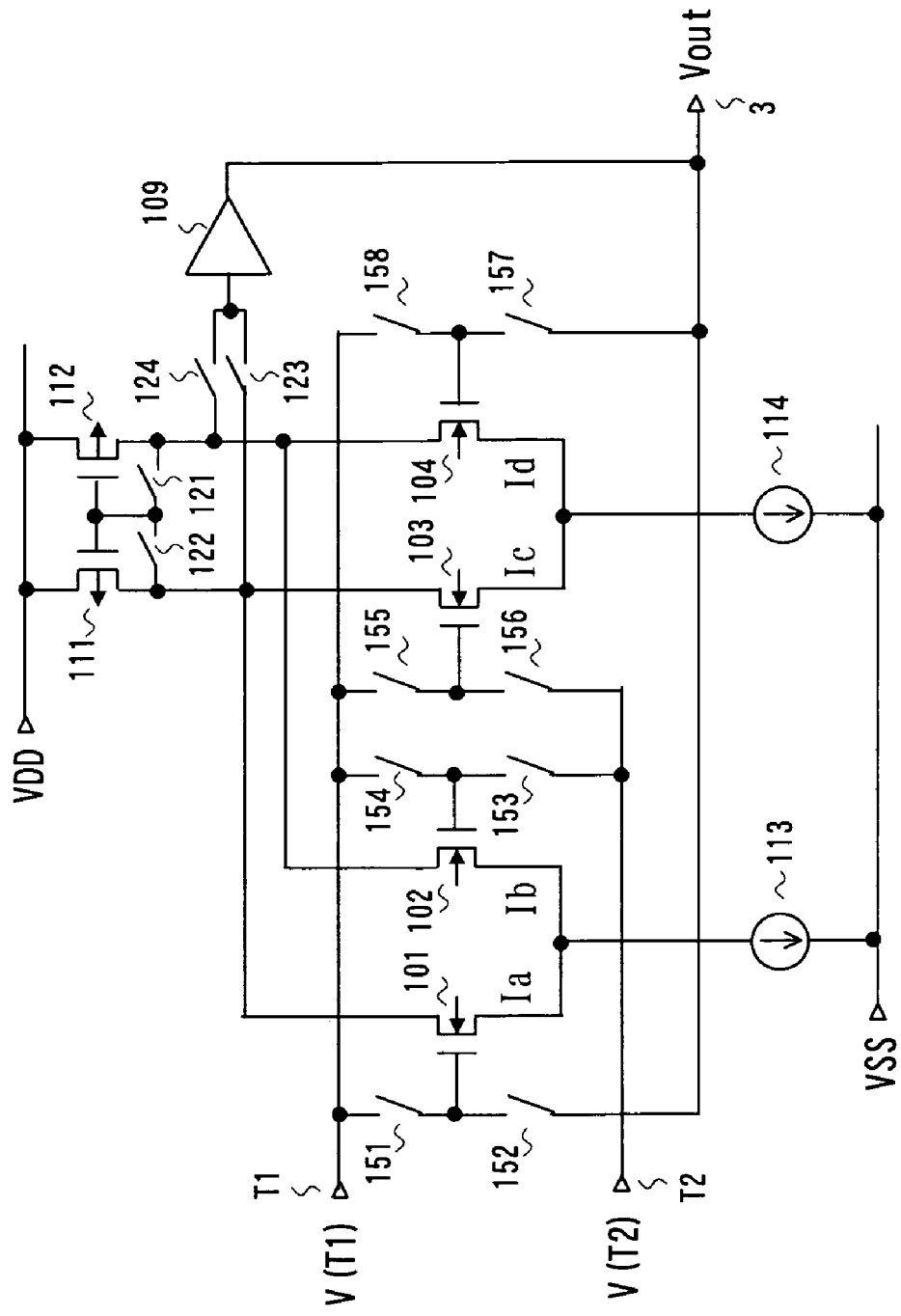
FIG. 1 is a diagram showing a differential amplifier according to an embodiment of the present invention.

Preferred embodiments of the present invention will now be described. A differential amplifier according to an embodiment of the present invention includes first and second differential pairs (101, 102) and (103, 104), and an amplifier stage (109). The first and second differential pairs are driven by associated current sources (113, 114), respectively. Output pairs of the first and second differential pairs are connected to a common load circuit (111, 112). The input and the output of the amplifier stage (109) are connected to at least one of connection nodes of the load circuit (111, 112) and the output pairs of the first and second differential pairs (101, 102) and (103, 104), and to an output terminal (3), respectively. There is provided a connection switching circuit (switches 151 to 158) for switching the circuit connection between first and second connection states.

In the first connection state, the first and second inputs of the first differential pair (101, 102) are connected to first and second input terminals (T1, T2), respectively, and the first and second inputs of the second differential pair (103, 104) are connected to the first input terminal and the output terminal (T1, 3), respectively.

In the second connection state, the first and second inputs of the first differential pair (101, 102) are connected to the output terminal and the first input terminal (3, T1), respectively, and the first and second inputs of the second differential pair (103, 104) are connected to the second input terminal and the first input terminal (T2, T1), respectively.

Figure 11:
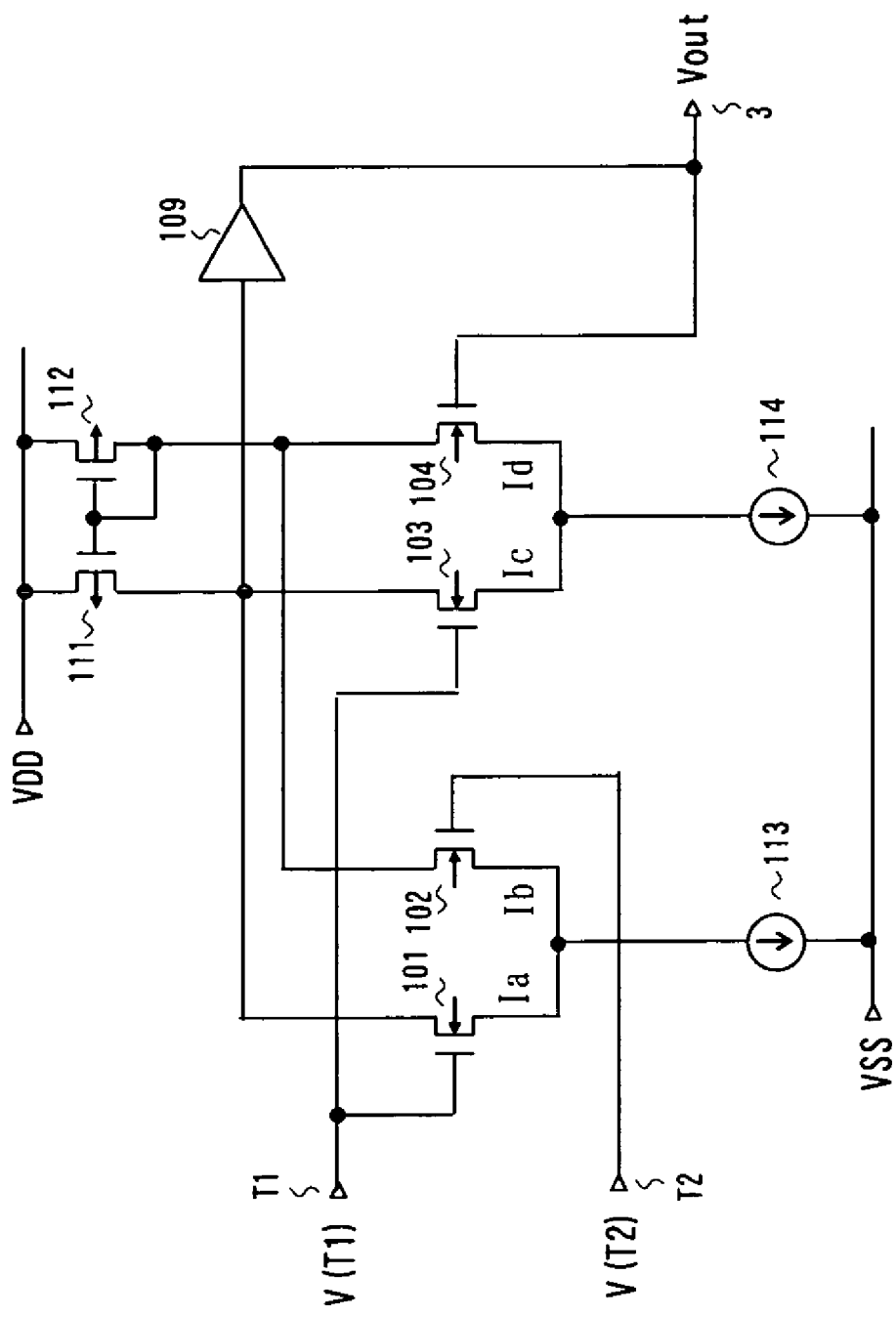
FIG. 11 is a diagram showing an equivalent circuit of a differential amplifier of FIG. 1 or FIG. 5 during the first time period of FIG. 2 or FIG. 6.

In the present invention, a differential amplifier, shown in FIG. 11, is used as a differential amplifier capable of outputting four different voltages against two different input voltages. The differential amplifier of FIG. 11 will now be described.

FIG. 11 is a diagram showing a differential amplifier capable of amplifying and outputting a voltage for extrapolating (externally dividing) two voltages V(T1) and V(T2), supplied to the terminals T1 and T2, respectively, with a ratio of 1:2. This differential amplifier forms the subject-matter of Japanese Patent Application No. 2003-365639 (now published as JP Patent Kokai Publication No. JP-P2005-130332A) by the present inventor.

FIG. 11 is a diagram showing an equivalent circuit in the aforementioned first connection state. There are two differential pairs (101, 102) and (103, 104). The two transistors constituting input pairs of the differential pairs are connected to the terminal T1, while the other two transistors constituting the input pairs of the differential pairs are connected to the terminal T2 and to the output terminal 3. In more detail, the two differential pairs, which are made up of the differential transistor pair 101 and 102, current source transistor 113, differential transistor pair 103 and 104 and the current source transistor 114, have output pairs connected in common to a current mirror, made up of the transistors 111 and 112, constituting the load circuit. The gates of the transistors 101 and 102, constituting a non-inverting input and an inverting input of the differential pair (101, 102), respectively, are connected to the terminals T1 and T2, respectively. The non-inverting input and the inverting input of the differential pair (103, 104), that is, the gates of the transistors 103 and 104, are connected to the terminal T1 and to the output terminal 3, respectively. The amplifier 109 is supplied with the voltage at an output terminal of the current mirror (111, 112) (connection node of the transistors 111, 101 and 103), and has its output end connected to the output terminal 3.

If, in FIG. 11, two pairs of differential amplifiers are formed by transistors of the same size, and the current sources 113 and 114, driving the respective differential pairs, are set to be equal in characteristics, the voltage corresponding to the extrapolation of the voltages V(T1) and V(T2) with a ratio of 1:2 may be output as an output voltage Vout.

The circuit operation will now be described with reference to FIG. 33, illustrating the operation for a case where V(T1) ≧V(T2). In FIG. 33, two curves which show the relationship between the source-to-drain current Ids and the gate voltage V, are a characteristic curve 1 for the transistors 101 and 102 and a characteristic curve 2 for the transistors 103 and 104. It is known in general that these curves are approximately quadratic curves. The operating points of the respective transistors are on the respective characteristic curves. It is noted that, as the respective source potentials of the two differential pairs are separately changed, the two characteristic curves are simply shifted along the abscissa direction.

The transistors 101 to 104 of the two differential pairs are of the same size and the currents flowing through the current sources 113 and 114 are the same.

If the currents at the operating points a, b, c and d of the transistors 101 to 104 (drain-to-source currents) are labeled Ia, Ib, Ic and Id, respectively, we obtain the following equations (1) and (2):

$$Ia+Ib=Ic+Id \quad (1)$$

$$Ia+Ic=Ib+Id \quad (2)$$

as the relationship among the currents of the respective transistors in FIG. 11.

It is noted that the equation (1) is derived from the fact that the currents flowing through the current sources 113 and 114 are equal to each other, and that the equation (2) is derived from the fact that the input/output currents flowing through the current mirror (111, 112) are equal to each other.

Solving the above equations, the following equation (3) is derived:

$$Ia=Id, Ib=Ic \quad (3)$$

From the equation (3), the four operating points a to d may be determined as shown in FIG. 33.

The operating points a and c of the transistors 101 and 103 have V=V(T1) in common on the abscissa for V of FIG. 33. Additionally, a line segment ad and a line segment bc, connecting the operating points, are equal in length, each other. Hence, the output voltage Vout is a voltage which extrapolates or externally divides the voltages V(T1) and V(T2) with a ratio of 1:2.

FIG. 33 shows the operation for the case where V(T1)≧V(T2). However, for a case where V(T1)≦V(T2), the output voltage Vout is similarly a voltage which extrapolates or externally divides the voltages V(T1) and V(T2) with a ratio of 1:2. The relationship between the input and the output voltages for this case is represented by the following equation:

$$Vout=2 \cdot V(T1)-V(T2) \quad (4)$$

Since the operation shown in FIG. 33 holds even in case the potential difference of two voltages V(T1) and V(T2) is enlarged, the differential amplifier of FIG. 11 allows for a high precision output.

The input/output characteristics of the differential amplifier of FIG. 11 will now be described with reference to FIGS. 34A and 34B. FIG. 34A is an input/output level correspondence map for a case where four voltage levels are output by the differential amplifier of FIG. 11 from two different reference voltages.

If two voltages are selected, inclusive of a case where the same voltage are selected as two voltage, as the input voltages V(T1) and V(T2) of the differential amplifier of FIG. 11, four voltage levels may be obtained from the equation (4). If the two reference voltages are set as second and third levels V2 and V3, four voltage levels may be obtained as linear outputs. The two reference voltages may be selected on the basis of two bit data (B2, B1).

FIG. 34A shows the relationship of the output voltage level, 2-bit data (B2, B1), and combinations of the reference voltages V2 and V3, as selected as V(T1) and V(T2). Meanwhile, in the input/output level correspondence map of FIG. 34A, the level indicates an output level, with its voltage level being shown as the symbol V followed by the numbers of the voltage levels. Specifically, when (V2, V3), (V2, V2), (V3, V3) and (V3, V2) are selected as V(T1) and V(T2), by the 2-bit data (B2, B1), the output voltage Vout is V1, V2, V3 and V4, respectively, from the equation (4). Thus, it can be confirmed that four linear voltages may be output from the two reference voltages V2 and V3.

FIG. 34B is an input/output level correspondence map showing the input/output level correspondence in case of selecting and outputting 16 voltage levels by four-bit data (B4, B3, B2 and B1). If, in FIG. 34B, four reference voltages are set to the sixth, seventh, tenth and eleventh levels V6, V7, V10 and V11, respectively, 16 voltage levels may be provided as linear outputs.

If two out of the four reference voltages (V6, V7, V10 and V11), shown in FIG. 34B, are selected, inclusive of the same voltage, as V(T1) and V(T2), and substituted into the equation (4), output voltages V1 to V16 are obtained, as output voltages Vout. Hence, it can be confirmed that 16 linear voltages may be output by the four reference voltages (V6, V7, V10 and VII).

FIGS. 34A and 34B show the input/output level relationship for the case of two reference voltages (corresponding to 2-bit data input) and four reference voltages (corresponding to 4-bit data input), respectively. However, this may be extended to larger numbers of reference voltages. For example, $4^K$ voltage levels may be output by selection from $2^K$ reference voltages, based on 2K bit data (B(2k), B(2k−1), . . . , B3, B2 and B1).

Meanwhile, if these $4^K$ voltage levels are to be provided as linear outputs, $2^K$ reference voltages $V_{REF}$ may be set by the following equation:

$$V_{REF} = 1 + (\varepsilon_0 \cdot 4^0) + (\varepsilon_1 \cdot 4^1) + (\varepsilon_2 \cdot 4^2) + \ldots + (\varepsilon_{K-1} \cdot 4^{K-1}) \quad (5)$$

$$= 1 + \sum_{x=0}^{K-1} (\varepsilon_X \cdot 4^X)$$

where $\varepsilon_X = 1, 2$

Figure 36:
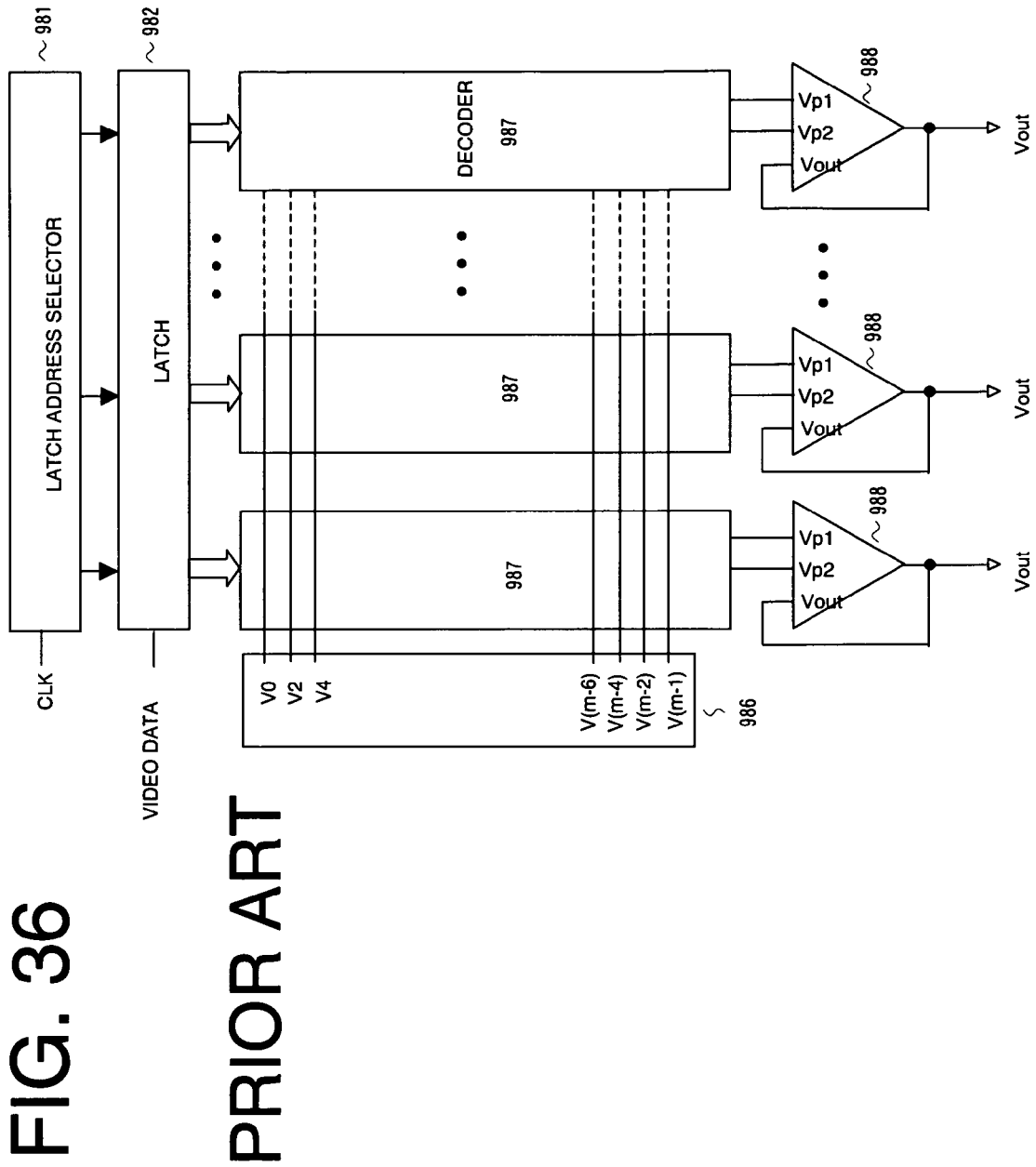
FIG. 36 is a diagram corresponding to FIG. 16 of Patent Document 1 and showing an exemplary configuration of a data driver as proposed in Patent Document 1.
Figure 37:
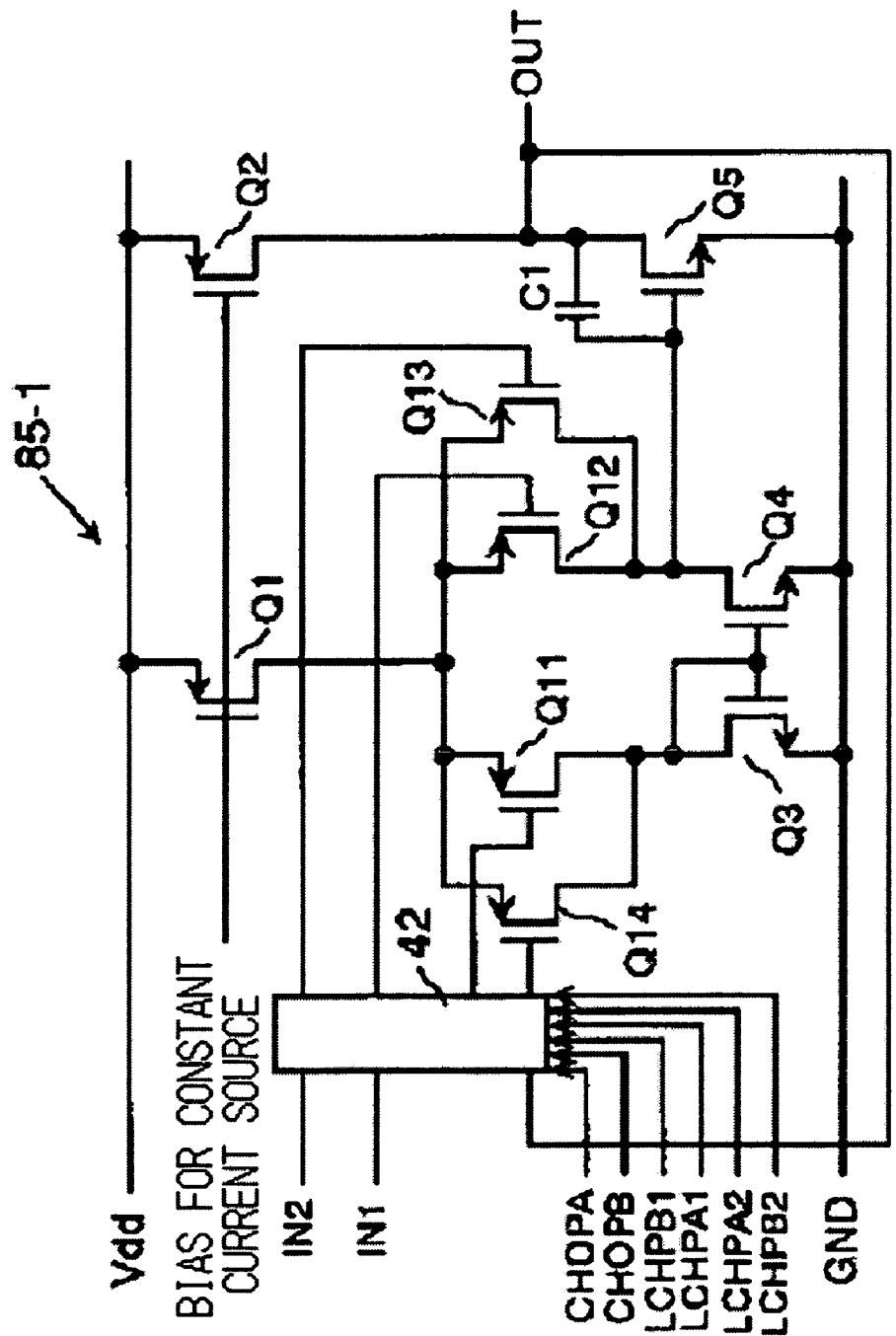
FIG. 37 is a diagram corresponding to FIG. 15 of Patent Document 3 and showing an exemplary configuration of a data driver as proposed in Patent Document 3.
Figure 38:
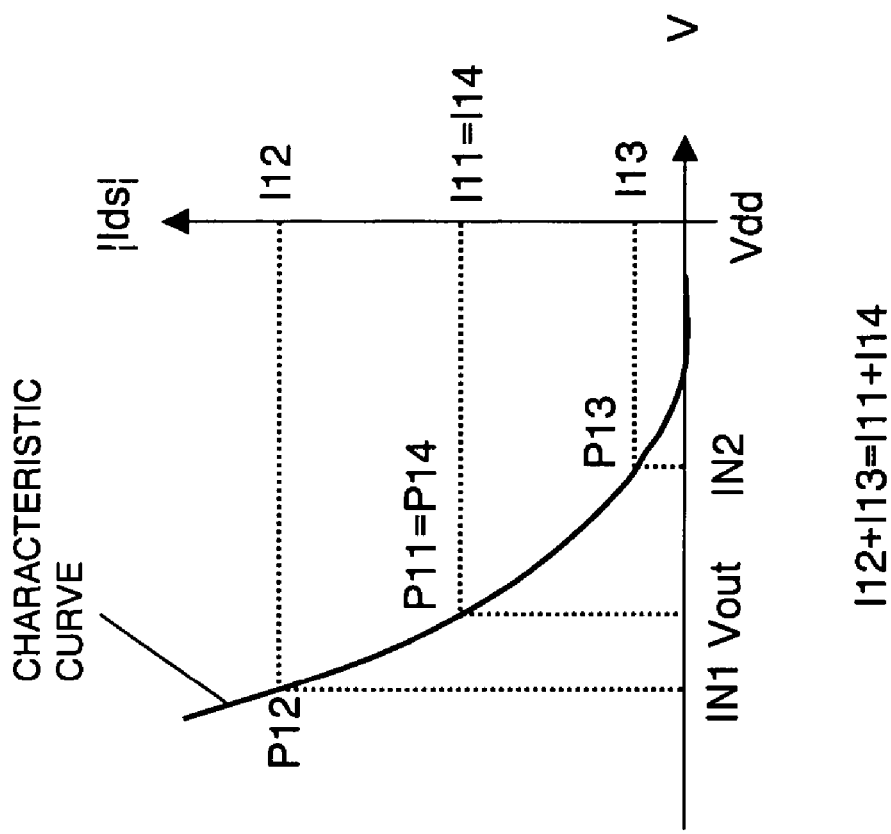
FIG. 38 is a graph for illustrating the operation for a case where an intermediate voltage of two gray-scale voltages IN1 and IN2 is output as Vout with an amplifier 85-1 of FIG. 37 in the first or second state.

By employing the differential amplifier of FIG. 11, the number of reference voltages (equivalent to the number of gray levels generated by the gray level voltage generating circuit of FIG. 36) may be appreciably decreased relative to the number of output voltages. The number of transistors of the decoder selecting them may also be appreciably decreased to save the chip area significantly. The digital-to-analog converter and the data driver, employing the differential amplifier of FIG. 11, has already been proposed by the present inventor in Japanese Patent Application No. 2003-365640, now published as JP Patent Kokai Publication No. JP-P2005-160034A.

The present invention aims to achieve comparable results in connection with variations in transistor characteristics for practical realization of the performance and the effects of the aforementioned differential amplifier of FIG. 11.

Figure 12:
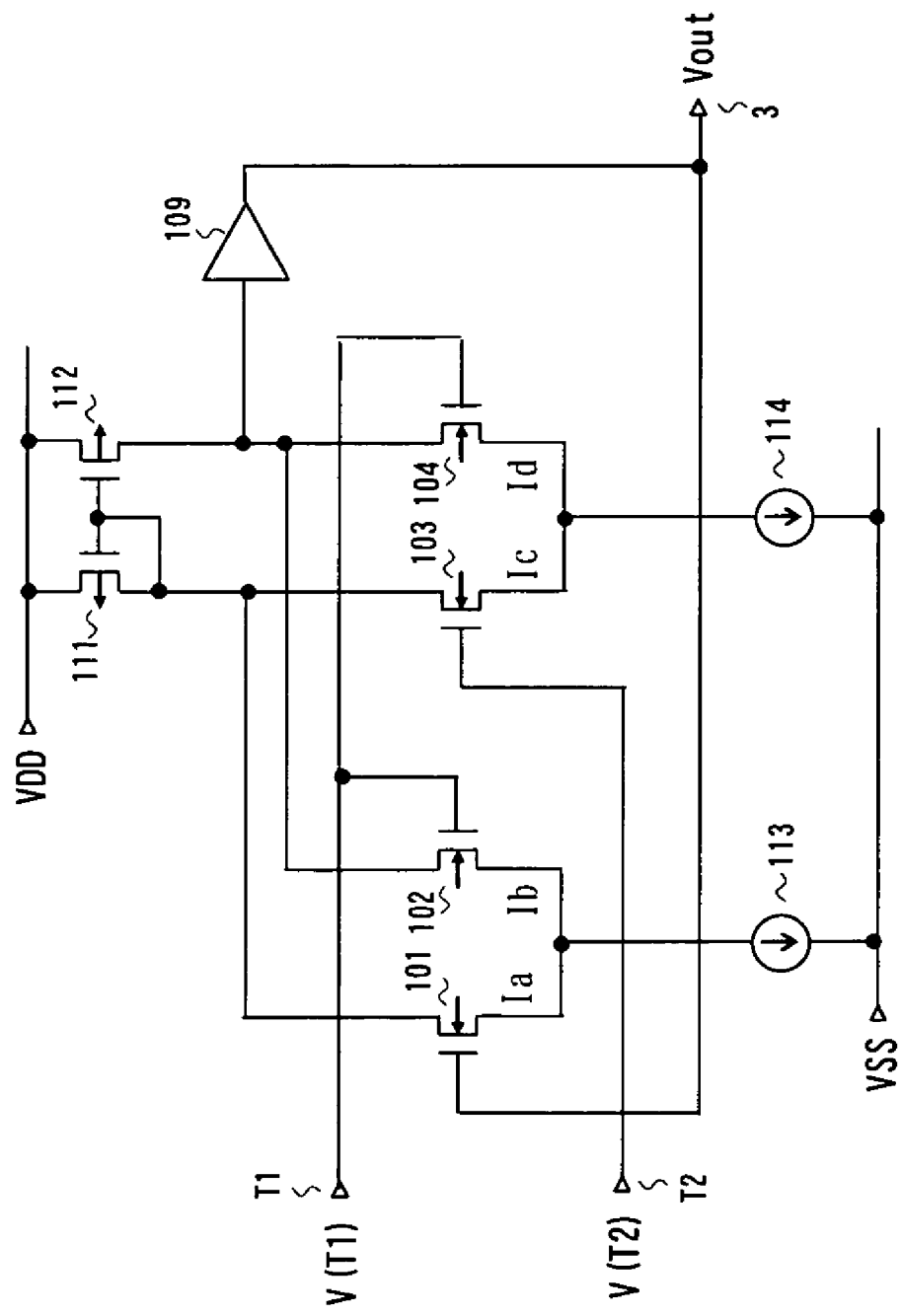
FIG. 12 is a diagram showing an equivalent circuit of a differential amplifier of FIG. 1 or FIG. 7 during the second time period of FIG. 2 or FIG. 8.

In the circuit configuration of FIG. 12, which shows an equivalent circuit in the second connection state, the input signal and the output of the differential pair (101, 102) and the differential pair (103, 104) of FIG. 11 have been interchanged. That is, the gates of the transistors 101 and 102 are an inverting input and a non-inverting input of the differential pair (101, 102), and connected to the output terminal 3 and to the terminal T1, respectively. The gates of the transistors 103 and 104 are an inverting input and a non-inverting input of the differential pair (103, 104), and connected to the terminals T2 and T1, respectively. The drains of the transistors 111 and 112 of the current mirror (111, 112) are an input end and an output end, respectively. The voltage of the output end (connection node of the transistors 112, 102 and 104) is supplied to the amplifier 109. Similarly to the differential amplifier of FIG. 11, the differential amplifier of FIG. 12 is able to amplify and output a voltage which externally divides (extrapolates) the voltages V(T1) and V(T2) at the terminals T1 and T2 with a ratio of 1:2. The configuration of FIG. 12 allows for high precision output even in case the difference between V(T1) and V(T2) is increased. The configuration of FIG. 12 also is able to cope with the input and output levels shown in FIG. 34. The differential amplifiers according to preferred embodiments of the present invention each include a circuit (switches 121 to 124 and 151 to 158) for performing control for switching between the configuration of FIG. 11 and that of FIG. 12. Several embodiments of the present invention will now be described more in detail.

FIG. 1 shows an amplifier of a first embodiment of the present invention. Referring to FIG. 1, the differential amplifier of the present embodiment includes n-channel transistors 101 and 102, as a first differential pair, which have sources connected in common, n-channel transistors 103 and 104, as a second differential pair, which have sources connected in common, a constant current source 113, which is connected between the coupled sources of the first differential pair (101, 102) and a low potential power supply VSS, and a constant current source 114, which is connected between the coupled sources of the second differential pair (103, 104) and the low potential power supply VSS. The differential amplifier of the present embodiment also includes p-channel transistors 111 and 112, which have drains connected respectively to connection nodes of an output pair of the first differential pair (101, 102) and an output pair of the second differential pair (103, 104), have sources connected in common to a high voltage power supply VDD and have gates coupled, and an amplifier stage 109. The differential amplifier of the present embodiment also includes a switch 151 which is connected between the terminal T1 and the gate of the n-channel transistor 101, and a switch 152 which is connected between the gate of the n-channel transistor 101 and the output terminal 3. The differential amplifier also includes a switch 153 which is connected between the terminal T2 and the gate of the n-channel transistor 102, and a switch 154 which is connected between the gate of the n-channel transistor 102 and the terminal T1. The differential amplifier also includes a switch 155 which is connected between the terminal T1 and the gate of an n-channel transistor 103, a switch 156 which is connected between the gate of the n-channel transistor 103 and the terminal T2, and a switch 158 which is connected between the terminal T1 and the gate of an n-channel transistor 104, a switch 157 which is connected between the gate of the n-channel transistor 104 and the output terminal 3. The differential amplifier further includes a switch 121 which is connected between the gate and the drain of the p-channel transistor 112, a switch 122 which is connected between the gate and the drain of the p-channel transistor 111, a switch 123 which is connected between a connection node of the drain of the n-channel transistor 101, the drain of the n-channel transistor 103 and the drain of the p-channel transistor 111 and the input terminal of the amplifier stage 109, and a switch 124 which is connected between a connection node of the drain of the n-channel transistor 102, the drain of the n-channel transistor 104 and the drain of the p-channel transistor 112 and the input terminal of the amplifier stage 109.

FIG. 2 is a diagram illustrating the on/off control method for the switches 121 to 124 and 151 to 158 of the differential amplifier of FIG. 1. The first and second time periods are changed over at a preset cycle. The differential amplifier during the first time period and that during the second time period in FIG. 1 are of the configurations shown by equivalent circuits of FIGS. 11 and 12, respectively.

That is, the configuration in which, during the first time period of FIG. 2, the switches 121, 123, 151, 153, 155 and 157 are in an on state and the switches 122, 124, 152, 154, 156 and 158 are in an off state, in FIG. 1, is the equivalent circuit of FIG. 11. At this time, the gates of the transistors of the first differential pair (101, 102) are connected to the input terminals T1 and T2, respectively, and the gates of the transistors of the second differential pair (103, 104) are connected to the input terminal T1 and to the output terminal 3, respectively. Out of the transistors 111 and 112, constituting the current mirror, the transistor 112 is an input side of the current mirror and has a gate and a drain connected together and connected to a connection node of the drains of the transistors 102 and 104. The output side transistor 111 has a drain connected to a connection node of the drains of the transistors 101 and 103 and connected to the input end of the amplifier stage 109.

On the other hand, the configuration in which, during the second time period of FIG. 2, the switches 121, 123, 151, 153, 155 and 157 are in an off state and the switches 122, 124, 152, 154, 156 and 158 are in an on state, in FIG. 1, is the equivalent circuit of FIG. 12. At this time, the gates of the transistors of the first differential pair (101, 102) are connected to the output terminal 3 and to the input terminal T1, respectively, and the gates of the transistors of the second differential pair (103, 104) are connected to T2 and T1, respectively. Out of the transistors 111 and 112, constituting the current mirror, the transistor 111, is an input side of the current mirror and has a gate and a drain connected together and connected to a connection node of the drains of the transistors 101 and 103. The output side transistor 112 of the current mirror has a drain connected to a connection node of the drains of the transistors 102 and 104 and connected to the input end of the amplifier stage 109.

In FIGS. 11 and 12, there is shown a differential amplifier, including two differential pairs, one of which has input pairs connected to the terminal T1 and the terminal T2, respectively, and the other of which has input pairs connected to the terminal T1 and the output terminal 3, respectively. The differential amplifier is capable of amplifying and outputting a voltage externally dividing (extrapolating) the voltages V(T1) and V(T2) at the terminals T1 and T2 with a ratio of 1:2.

In FIGS. 11 and 12, the first differential pair (101, 102) and second differential pair (103, 104) are equivalent if the transistors composing the differential pairs are free of variations and of the same characteristics. However, if the transistor characteristics have variations, the transistor operations become different.

These variations in transistor characteristics are produced due to the semiconductor fabrication processor the like. More specifically, the variations in a transistor threshold value or the variation in an inclination of a transistor characteristic curve are produced.

The operation for canceling out the output offset ascribable to the variations in transistor characteristics, in the differential amplifier shown in FIG. 1, is hereinafter described. For simplicity in the description, the operation in which the threshold value of the transistor 104, out of the transistors of the first differential pair (101, 102) and the second differential pair (103, 104), has become offset from those of the other transistors, will be described. It is assumed that the current sources 113 and 114 and the current mirror (111, 112) are free of variations.

In the following description, as in the description of FIG. 33, it is assumed that the transistors 101 to 104 are of the same size, the currents for the operating points a to d (drain-to-source currents) are named Ia, 1b, Ic and Id, respectively, and that $V(T1) \geqq V(T2)$.

Figure 15:
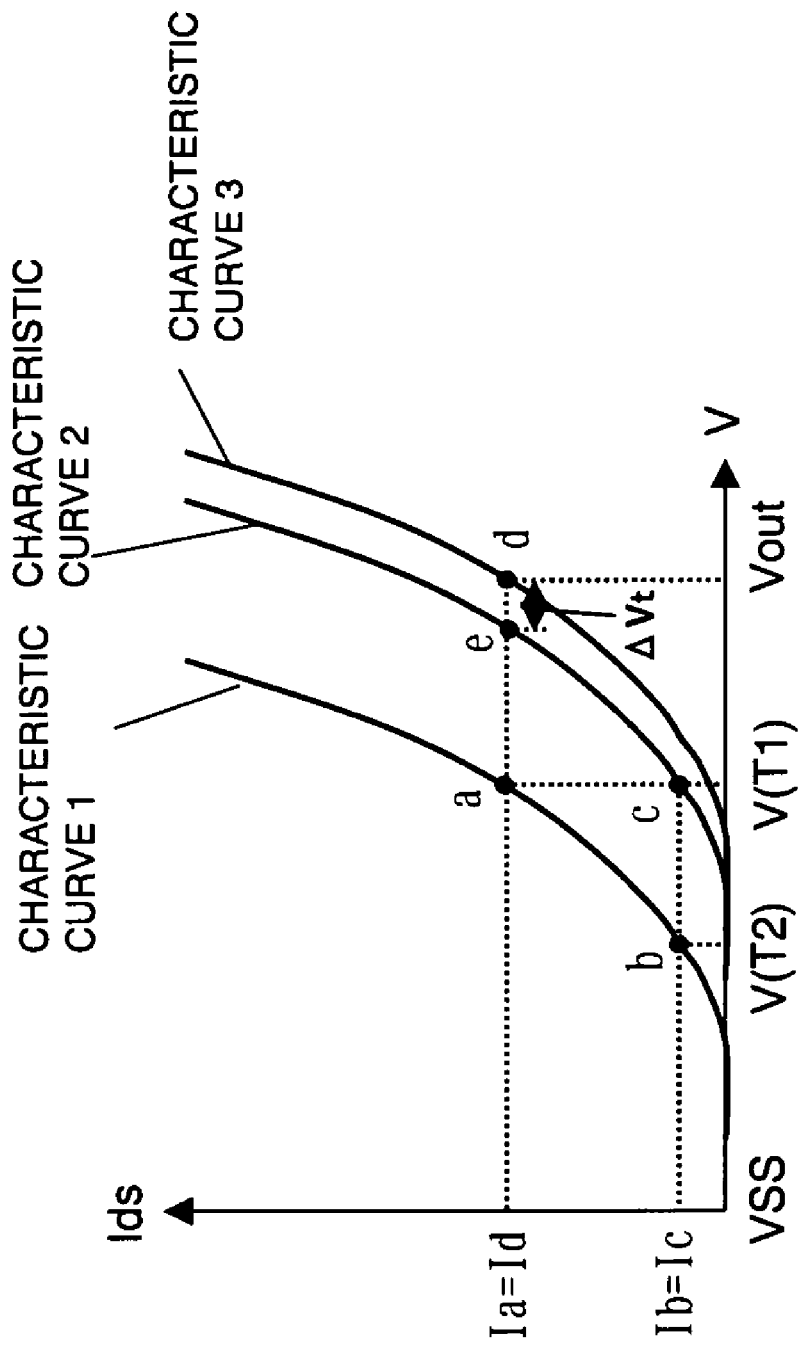
FIG. 15 is a graph for illustrating the operation of FIG. 11 in the case of variations in Vt.

FIG. 15 is a graph illustrating the operation of the circuit of FIG. 11. Specifically, FIG. 15 depicts, in a graph showing the relationship between the source-to-drain current Ids and the gate voltage V, a characteristic curve 1 for the transistors 101 and 102, a characteristic curve 2 for the transistor 103, and a characteristic curve 3 for the transistor 104, the threshold value of which is higher by ΔVt than that of the other transistors. The operating points of the respective transistors are on the respective characteristic curves. Meanwhile, the characteristic curve 1 on one hand and the characteristic curves 2 and 3 on the other are shifted from each other along the abscissa by the source potential of each differential pair being varied individually. Moreover, the characteristic curves 2 and 3 are deviated from each other by variation ΔVt in the threshold voltage value. It is assumed that there is no variation other than the variation in the threshold voltage value in the respective characteristic curves.

In FIG. 11, the relationship of the above equations (1) to (3), described with reference to FIG. 33, is valid. Thus, the four operating points a to d are determined, as shown in FIG. 15. In this case, the operating points a and c of the transistors 101 and 103 are both V(T1) on the abscissa V, while the operating points b and d of the transistors 102 and 104 are V(T2) and Vout on the abscissa V, respectively.

If a point of intersection of a straight line passing through the operating points a and d and the characteristic curve 2 is denoted e, a line segment ed is equal to ΔVt.

Since a line segment ae and a line segment bc, interconnecting the operating points, are equal to each other, the output voltage Vout is equal to a voltage, externally dividing (extrapolating) the voltages V(T1) and V(T2) with a ratio of 1:2, plus ΔVt, and thus may be expressed by the following equation (6):

$$V\text{out}=2 \cdot V(T1)-V(T2)+\Delta Vt \quad (6)$$

Figure 16:
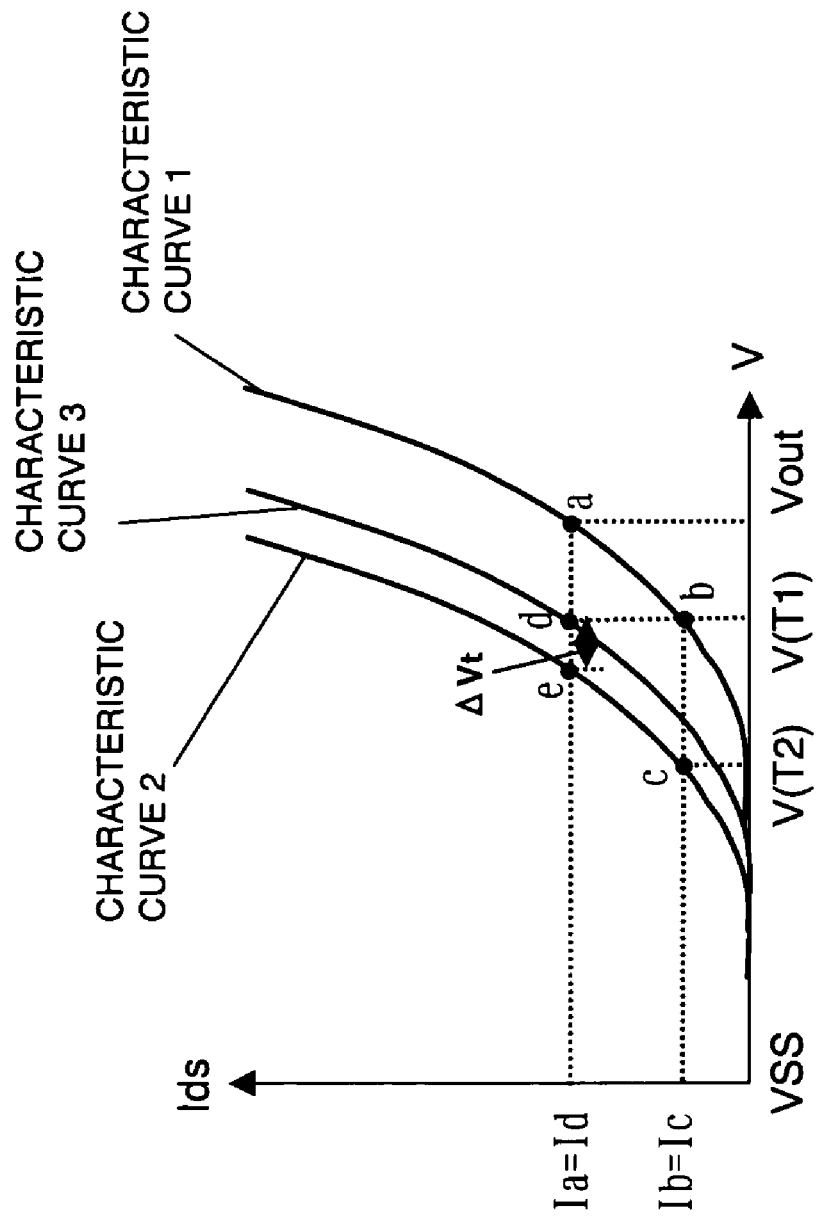
FIG. 16 is a graph for illustrating the operation of FIG. 12 in the case of variations in Vt.

FIG. 16 is a graph illustrating the operation of the circuit of FIG. 12. In FIG. 12, the relationship of the equations (1), (2) and (3) holds and the four operating points a to d are determined as shown in FIG. 16. In this figure, the operating points b and d of the transistors 102 and 104 are both V(T1) on the abscissa V, whilst the operating points a and c of the transistors 101 and 103 are Vout and V(T2) on the abscissa V, respectively.

If a point of intersection of the characteristic curve 2 and a straight line passing through the operating points a and d is labeled e, a line segment de is equal to ΔV(t), as in FIG. 15.

Since the line segment ae and the line segment bc, interconnecting the operating points, are equal to each other, the output voltage Vout is equal to a voltage, externally dividing (extrapolating) the voltages V(T1) and V(T2) with a ratio of 1:2, minus ΔVt, and thus may be expressed by the following equation (7):

$$V\text{out}=2 \cdot V(T1)-V(T2)-\Delta Vt \quad (7)$$

If, in the differential amplifier of FIG. 1, the transistor 104 has the threshold value variation ΔV(t), the output voltage Vout has an offset of +ΔV(t) and −ΔVt, during the first and second time periods of FIG. 2, as shown in the equations (6) and (7), respectively, as described above.

However, in the present embodiment, the output offsets are time-averaged when the first and second time periods of FIG. 2 are repeated at a preset cycle, so that the equation of Vout becomes equivalent to the equation (4).

The operation in case $V(T1) \leqq V(T2)$ may readily be derived from the above graph illustrating the operation. Although the operating points and the directions of offset differ from the case where $V(T1) \geqq V(T2)$, the output voltage Vout during the first time period and that during the second time period have offsets which are same in magnitude but opposite in polarity, so that, by repeating the first and second time periods, at a preset cycle, the output offset is time-averaged, and hence the equation of Vout becomes equivalent to the equation (4).

The foregoing description is directed to the threshold variations in the transistor 104. However, the output offsets may be canceled by time averaging for cases where other transistors constituting the two differential pairs having threshold variations.

Hence, the differential amplifier of FIG. 1 is able to output a voltage with high voltage accuracy in case of the transistor variations being present.

Figure 3:
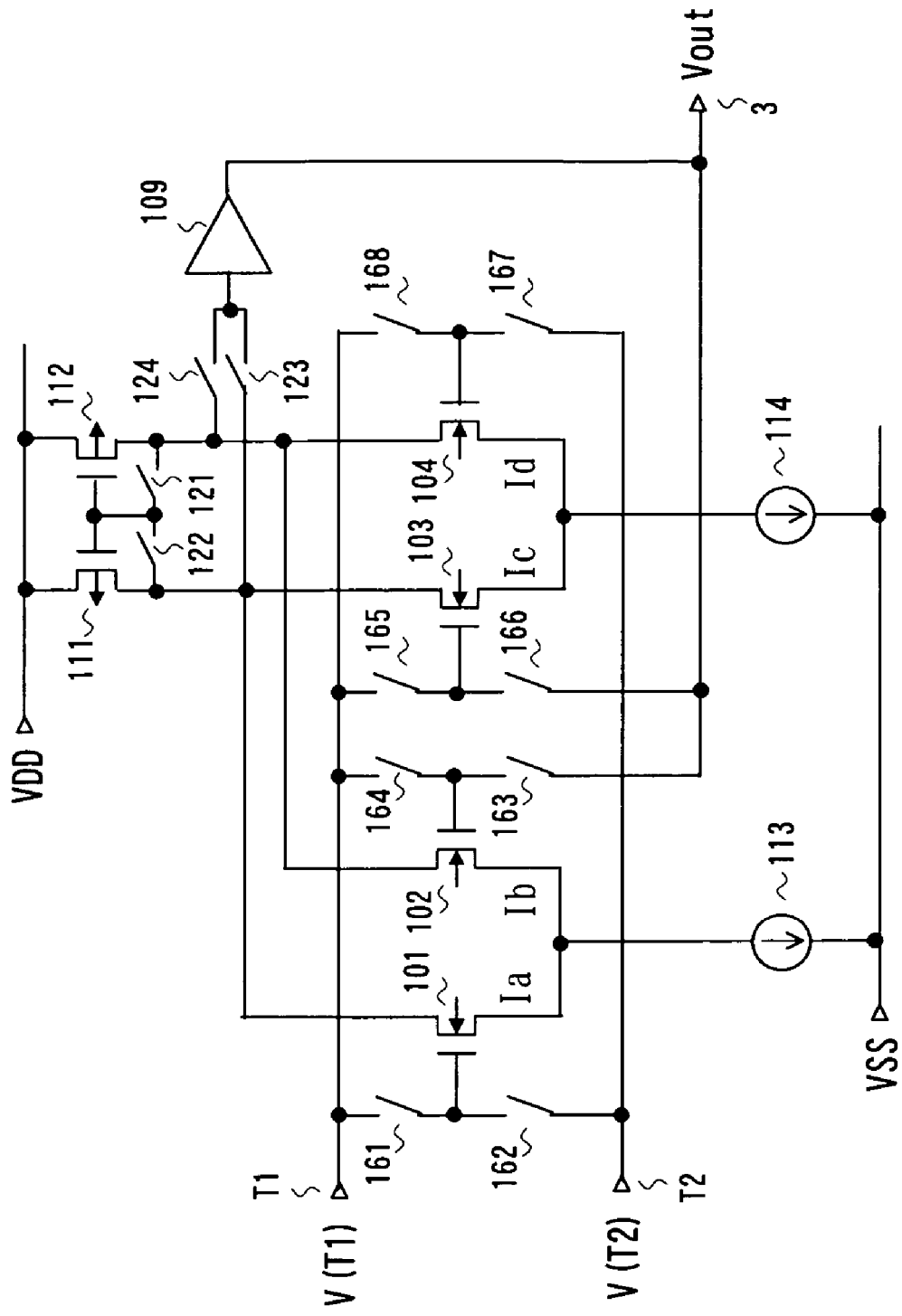
FIG. 3 is a diagram showing a differential amplifier according to a second embodiment of the present invention.

Another embodiment of the present invention is hereinafter described. FIG. 3 shows a differential amplifier according to a second embodiment of the present invention. Referring to FIG. 3, the differential amplifier of the present embodiment differs from the differential amplifier of the first embodiment, shown in FIG. 1, as to switches connected between the gates of the n-channel transistors 101 to 104 on one hand and the terminals T1, T2 and the output terminal 3 on the other. In the following, the points of difference from the differential amplifier shown in FIG. 1 will be described with reference to FIG. 3. The differential amplifier of the present embodiment includes a switch 161 which is connected between the terminal T1 and a gate of the n-channel transistor 101, a switch 162 which is connected between the terminal T2 and the gate of the n-channel transistor 101, a switch 164 which is connected between the terminal T1 and a gate of the n-channel transistor 102, a switch 163 which is connected between the gate of the n-channel transistor 102 and the output terminal 3, a switch 165 which is connected between the terminal T1 and the gate of the n-channel transistor 103, a switch 166 which is connected between the gate of the n-channel transistor 103 and the output terminal 3, a switch 168 which is connected between the terminal T1 and the gate of the n-channel transistor 104, and a switch 167 which is connected between the gate of the n-channel transistor 104 and the terminal T2. The present embodiment is otherwise the same as the differential amplifier shown in FIG. 1.

FIG. 4 shows a method for on/off control of the switches 121 to 124 and 161 to 168 of the differential amplifier shown in FIG. 3. The first and second time periods are changed over at a preset cycle. The differential amplifier of FIG. 3 in the first time period and that in the second time period in FIG. 4 may be expressed by equivalent circuits shown in FIGS. 13 and 14, respectively.

Figure 13:
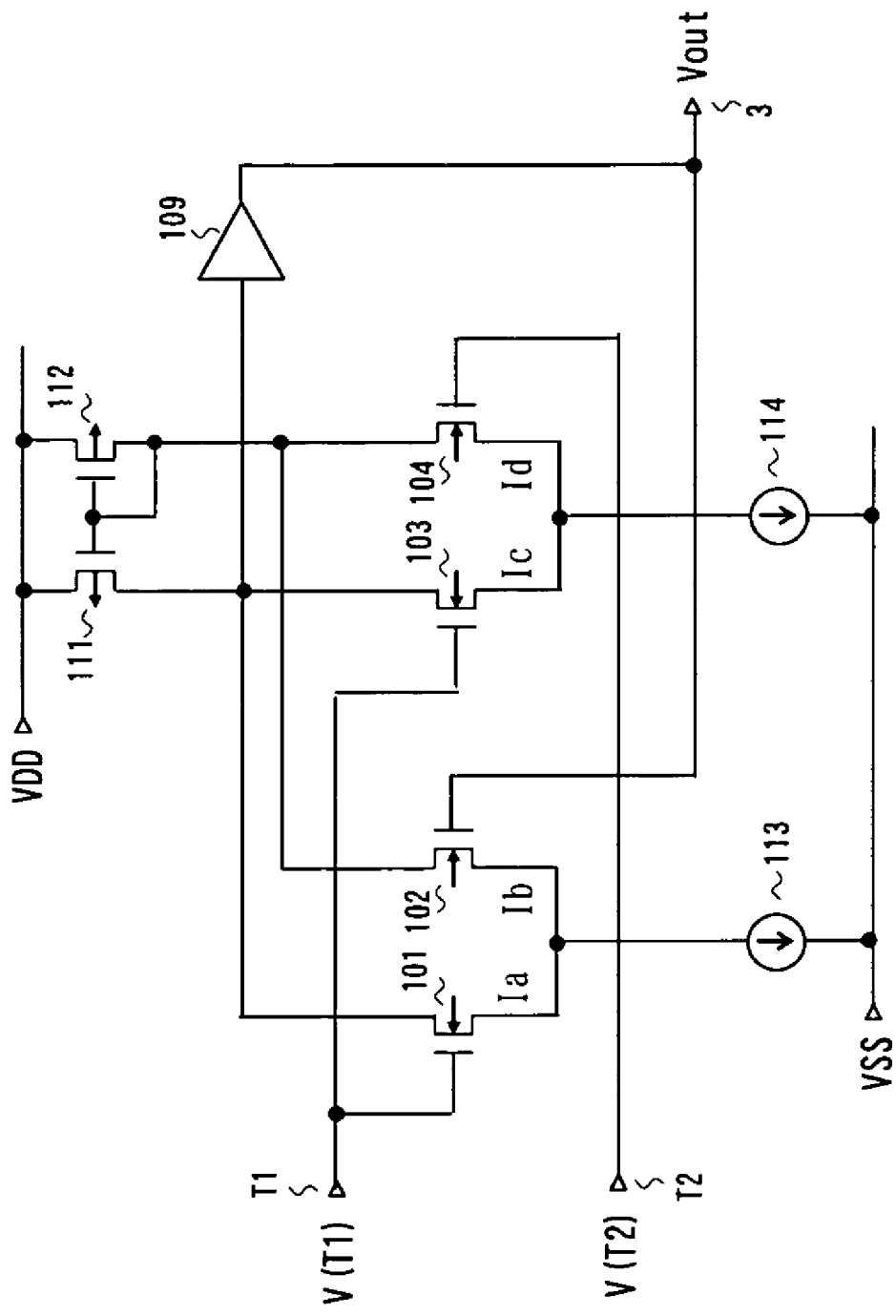
FIG. 13 is a diagram showing an equivalent circuit of a differential amplifier of FIG. 3 or FIG. 7 during the first time period of FIG. 4 or FIG. 8.

That is, if, during the first time period of FIG. 4, the switches 121, 123, 161, 163, 165 and 167 of FIG. 3 are in an on state, and the switches 122, 124, 162, 164, 166 and 168 are in an off state, the differential amplifier of FIG. 3 takes the configuration of a differential amplifier shown by the equivalent circuit of FIG. 13. At this time, the gates of the transistors 101 and 102 of the first differential pair are connected to the input terminal T1 and to the output terminal 3, respectively, whilst the gates of the transistors 103 and 104 of the second differential pair are connected to the input terminals T1 and T2, respectively. The transistor 112, out of the transistors 111 and 112, constituting the current mirror, forms an input side of the current mirror, and has its gate and drain connected to each other and to the connection node of the drains of the transistors 102 and 104. The drain of the output side transistor 111 of the current mirror is connected to the connection node of the drains of the transistors 101 and 103, and to an input end of the amplifier stage 109.

Figure 14:
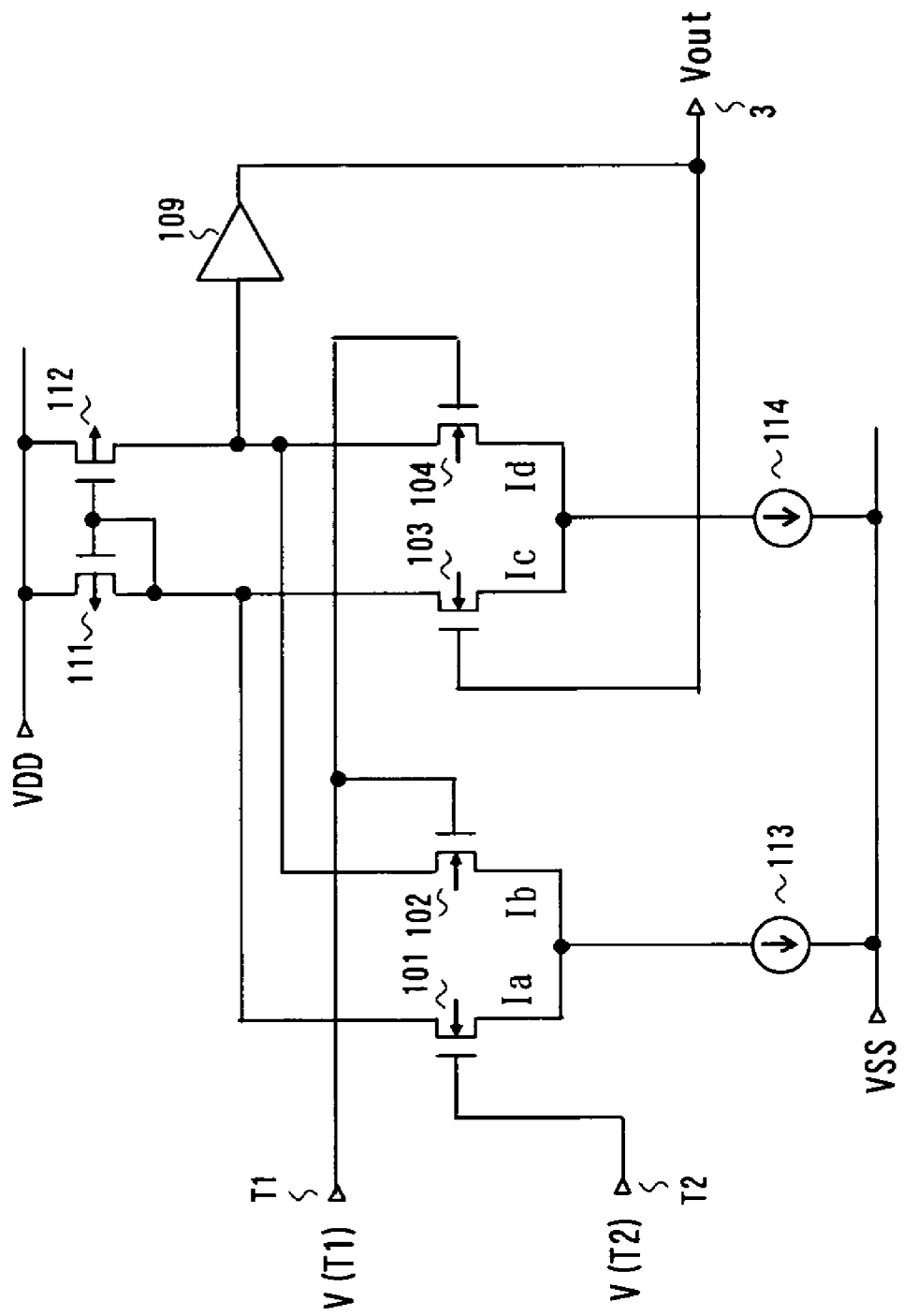
FIG. 14 is a diagram showing an equivalent circuit of a differential amplifier of FIG. 3 or FIG. 5 during the first time period of FIG. 4 or FIG. 6.

On the other hand, if, during the second time period of FIG. 4, the switches 121, 123, 161, 163, 165 and 167 of FIG. 3 are in an on state, and the switches 122, 124, 162, 164, 166 and 168 are in an off state, the differential amplifier of FIG. 3 takes the configuration of a differential amplifier shown by the equivalent circuit of FIG. 14. At this time, the gates of the transistors 101 and 102 of the first differential pair are connected to the input terminals T2 and T1, respectively, whilst the gates of the transistors 103 and 104 of the second differential pair are connected to the output terminal 3 and to the input terminal T1, respectively. The transistor 111, out of the transistors 111 and 112 of the current mirror, forms an input side of the current mirror, and has its gate and drain connected to each other and to a connection node of the drains of the transistors 101 and 103. The drain of the output side transistor 112 of the current mirror is connected to a connection node of the drains of the transistors 102 and 104, and to an input end of the amplifier stage 109.

FIGS. 13 and 14 both show differential amplifiers having two transistors, one of which has an input pair connected to the terminal T1 and the terminal T2, respectively, and the other of which has an input pair connected to the terminal T1 and to the output terminal 3. The differential amplifier is able to amplify and output a voltage which externally divides (extrapolates) the voltages V(T1) and V(T2) with a ratio of 1:2. Meanwhile, FIGS. 13 and 14 are equivalent to FIG. 11, provided that the first differential pair (101, 102) and the second differential pair (103, 104) are transistors of the same characteristics free from variations. However, if the transistor characteristics have variations, the operation become different.

The operation of canceling the output offset, ascribable to transistor threshold variations, by the differential amplifier of FIG. 3, will now be described. The operation in case only the threshold value of the transistor 104 has deviated from those of the other transistors will be described, as in the above description of the operation of FIG. 1. The definition of the four operating points a to d and the point of intersection e is the same as before, and it is assumed that V(T1)≧V(T2).

Figure 17:
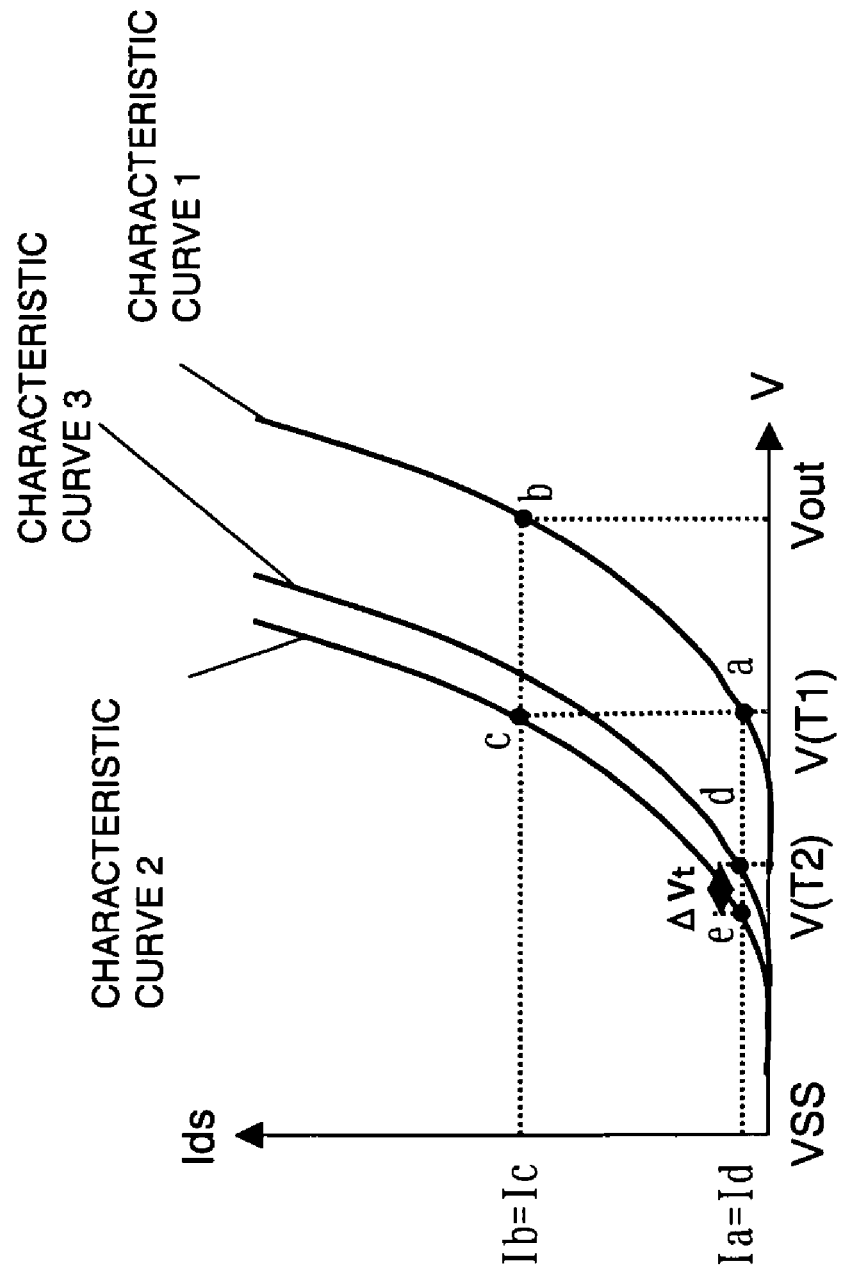
FIG. 17 is a graph for illustrating the operation of FIG. 13 in the case of variations in Vt.

FIG. 17 is a graph for illustrating the operation of the circuit of FIG. 13. In FIG. 13, the equations (1), (2) and (3) are valid, and the four operating points a to d and the point of intersection e are determined as shown in FIG. 17. The operating points a and c of the transistors 101 and 103 are both V(T1) on the abscissa V, while the operating points b and d of the transistors 102 and 104 are Vout and V(T2) on the abscissa V, respectively. The length of the line segment de is equal to $\Delta Vt$. Since the line segment ae and the line segment bc are equal to each other, the output voltage Vout is equal to a voltage, externally dividing (extrapolating) the voltages V(T1) and V(T2) with a ratio of 1:2, plus $\Delta Vt$, and may be expressed by the equation (6).

Figure 18:
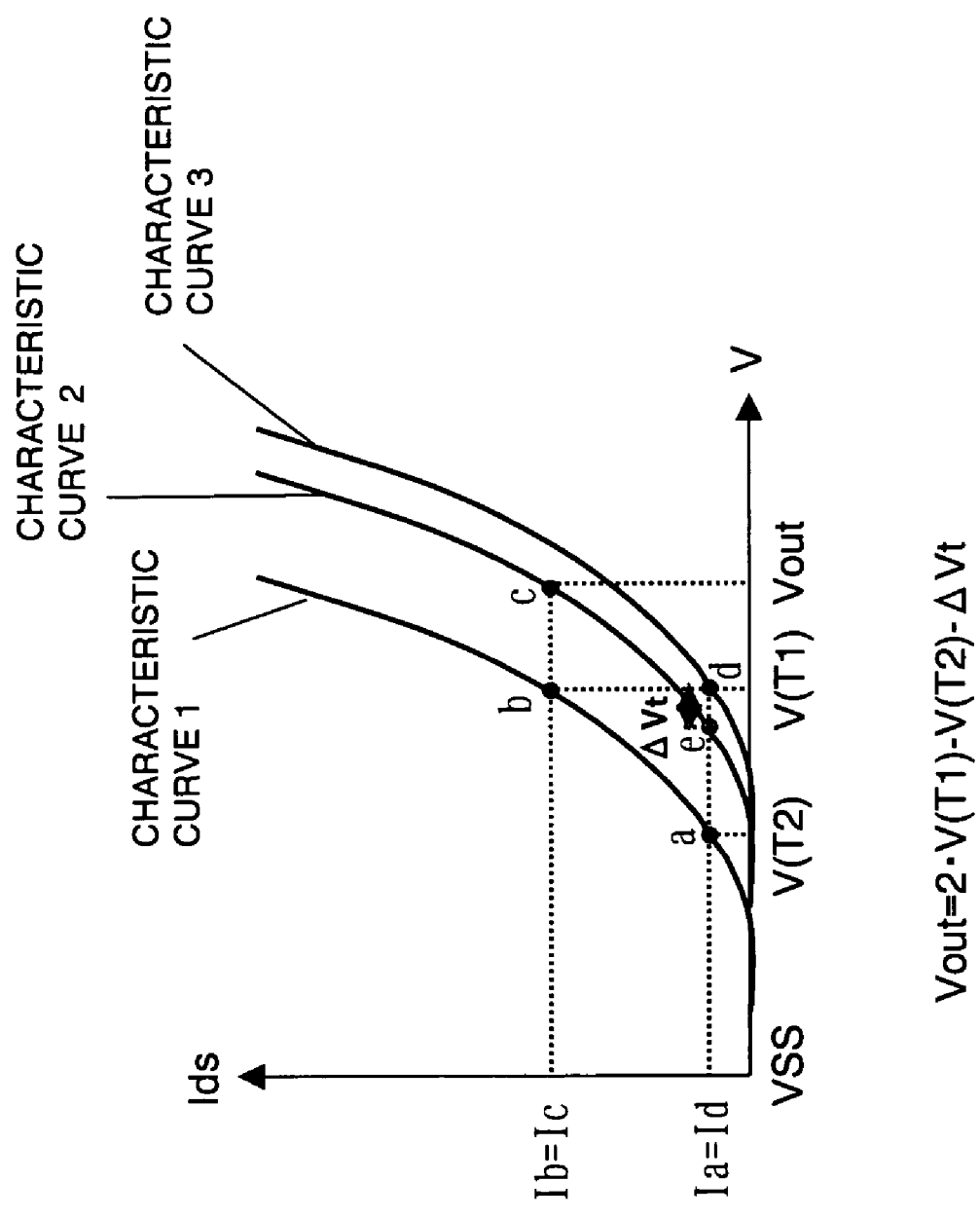
FIG. 18 is a graph for illustrating the operation of FIG. 14 in the case of variations in Vt.

FIG. 18 is a graph for illustrating the operation of the circuit of FIG. 14. In FIG. 14, equations similar to the equations (1), (2) and (3) are valid, and the four operating points a to d and the point of intersection e are determined as shown in FIG. 18. The operating points b and d of the transistors 102 and 104 are both V(T1) on the abscissa V, while the operating points a and c of the transistors 101 and 103 are V(T2) and Vout on the abscissa V, respectively. The length of the line segment de is equal to $\Delta Vt$. Since the line segment ae and the line segment bc are equal to each other, the output voltage Vout is equal to a voltage, externally dividing (extrapolating) the voltages V(T1) and V(T2) with a ratio of 1:2, minus $\Delta Vt$, and may be expressed by the equation (7).

If, in the differential amplifier of FIG. 3, the transistor 104 has the threshold value variation $\Delta Vt$, the output voltage Vout has an offset of $+\Delta Vt$ and $-\Delta Vt$, during the first and second time periods of FIG. 4, as described above, as shown in the equations (6) and (7), respectively.

However, in the present embodiment, when the first and second time periods of FIG. 4 are repeated as they are changed over at a preset cycle, the output offsets are time-averaged so that the equation of Vout becomes equivalent to the equation (4).

The operation for the case where V(T1)≦V(T2) may readily be derived from the above graph. The output voltage Vout during the first time period and that during the second time period have the offsets which are same in magnitude but opposite in polarity, so that, by repeating the first and second time periods at a preset cycle, the output offset is time-averaged, and hence the equation of Vout becomes equivalent to the equation (4).

The foregoing description is directed to the case of the transistor 104 having threshold variations. However, the output offsets may similarly be canceled by time averaging for cases where other transistors making up the two differential pairs have threshold variations.

Hence, the differential amplifier of FIG. 3 is able to output a voltage with high voltage accuracy even if the transistors have threshold variations.

Figure 5:
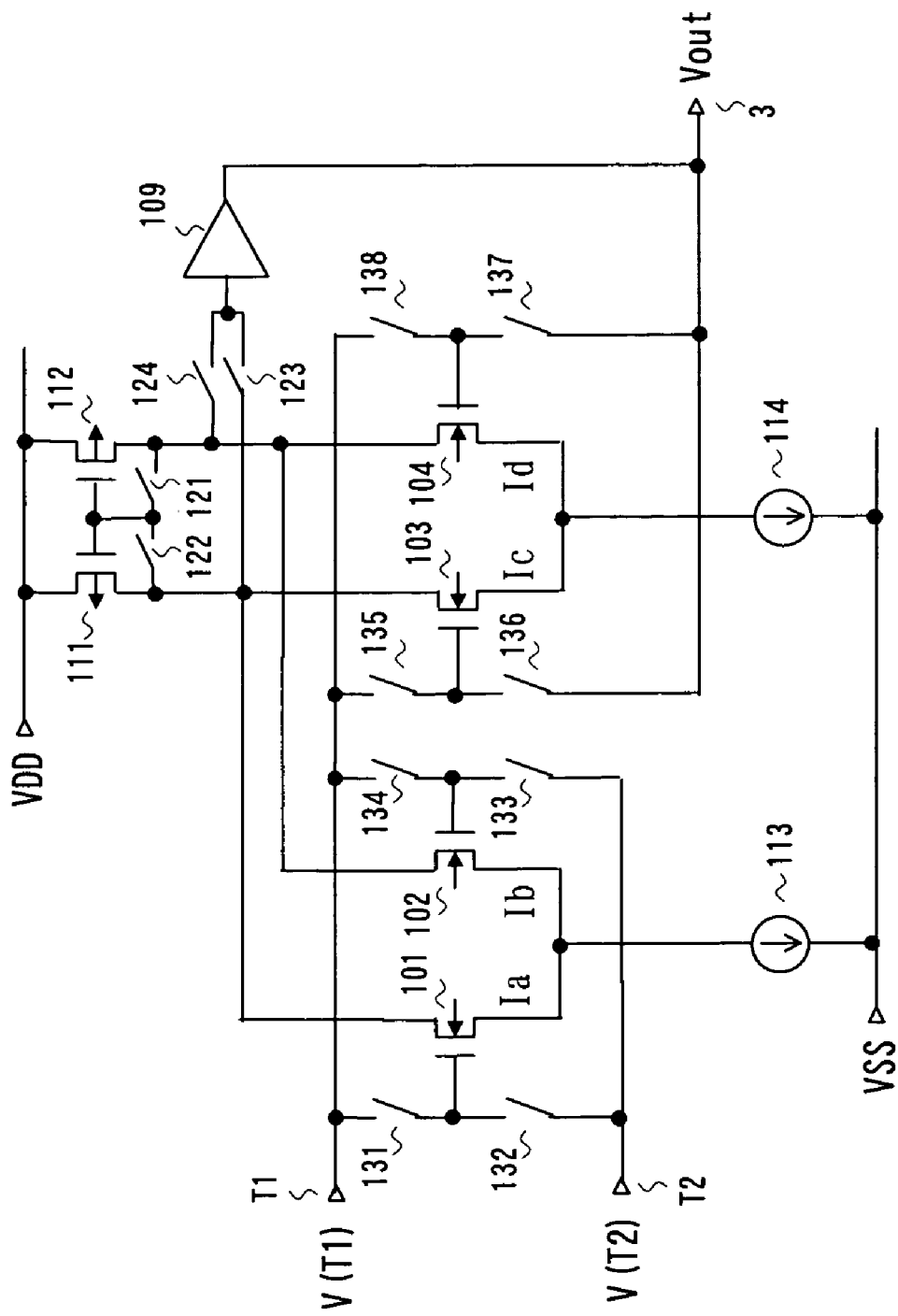
FIG. 5 is a diagram showing a differential amplifier according to a third embodiment of the present invention.

FIG. 5 shows a differential amplifier according to a third embodiment of the present invention. Referring to FIG. 5, the differential amplifier of the present embodiment differs from the differential amplifier, shown in FIG. 1, as to switches connected between the gates of the n-channel transistors 101 to 104 on one hand and the terminals T1, T2 and the output terminal 3 on the other. In the following, the points of difference from the differential amplifier shown in FIG. 1 will be described with reference to FIG. 5. The differential amplifier of the present embodiment includes a switch 131 which is connected between the terminal T1 and a gate of the n-channel transistor 101, a switch 132 which is connected between the gate of the n-channel transistor 101 and the terminal T2, a switch 134 which is connected between the terminal T1 and the gate of the n-channel transistor 102, a switch 133 which is connected between the gate of the n-channel transistor 102 and the terminal T2, a switch 135 which is connected between the terminal T1 and the gate of the n-channel transistor 103, a switch 136 which is connected between the gate of the n-channel transistor 103 and the output terminal 3, a switch 138 which is connected between the terminal T1 and the gate of the n-channel transistor 104 and a switch 137 which is connected between the gate of the n-channel transistor 104 and the output terminal 3. The present embodiment is otherwise the same as the differential amplifier shown in FIG. 1.

FIG. 6 shows a method for on/off control of the switches 121 to 124 and 131 to 138 of the differential amplifier shown in FIG. 5. The first and second time periods are changed over at a preset cycle. The differential amplifier of FIG. 5 in the first time period and that in the second time period in FIG. 6 may be expressed by equivalent circuits shown in FIGS. 11 and 14, respectively.

That is, if, during the first time period of FIG. 6, the switches 121, 123, 131, 133, 135 and 137 of FIG. 5 are in an on state, and the switches 122, 124, 132, 134, 136 and 138 are in an off state, the differential amplifier of the present embodiment takes the configuration of a differential amplifier shown by the equivalent circuit of FIG. 11. The state of connection is as described in the paragraph [0097] above.

That is, if, during the second time period of FIG. 6, the switches 121, 123, 131, 133, 135 and 137 of FIG. 5 are in an off state, and the switches 122, 124, 132, 134, 136 and 138 are in an on state, the differential amplifier of the present embodiment takes the configuration of a differential amplifier shown by the equivalent circuit of FIG. 14. The state of connection is as described in the paragraph [0121] above.

The operation of canceling out the output offset, ascribable to variations in the transistor thresholds, by the differential amplifier of FIG. 5, is similar to the operation of FIGS. 15 and 18 for the circuit of FIGS. 11 and 14, such that, in the circuit of FIGS. 11 and 14, the respective output voltages Vout are subjected to the offsets of the same magnitude opposite in polarity.

Hence, the output offsets are time-averaged by repeating the first and second time periods, at a preset cycle, so that the input/output voltage relationship, shown by the equation (4), is attained. That is, the differential amplifier of FIG. 5 gives an output voltage with high voltage accuracy, in case there are threshold variations of the transistors.

Figure 7:
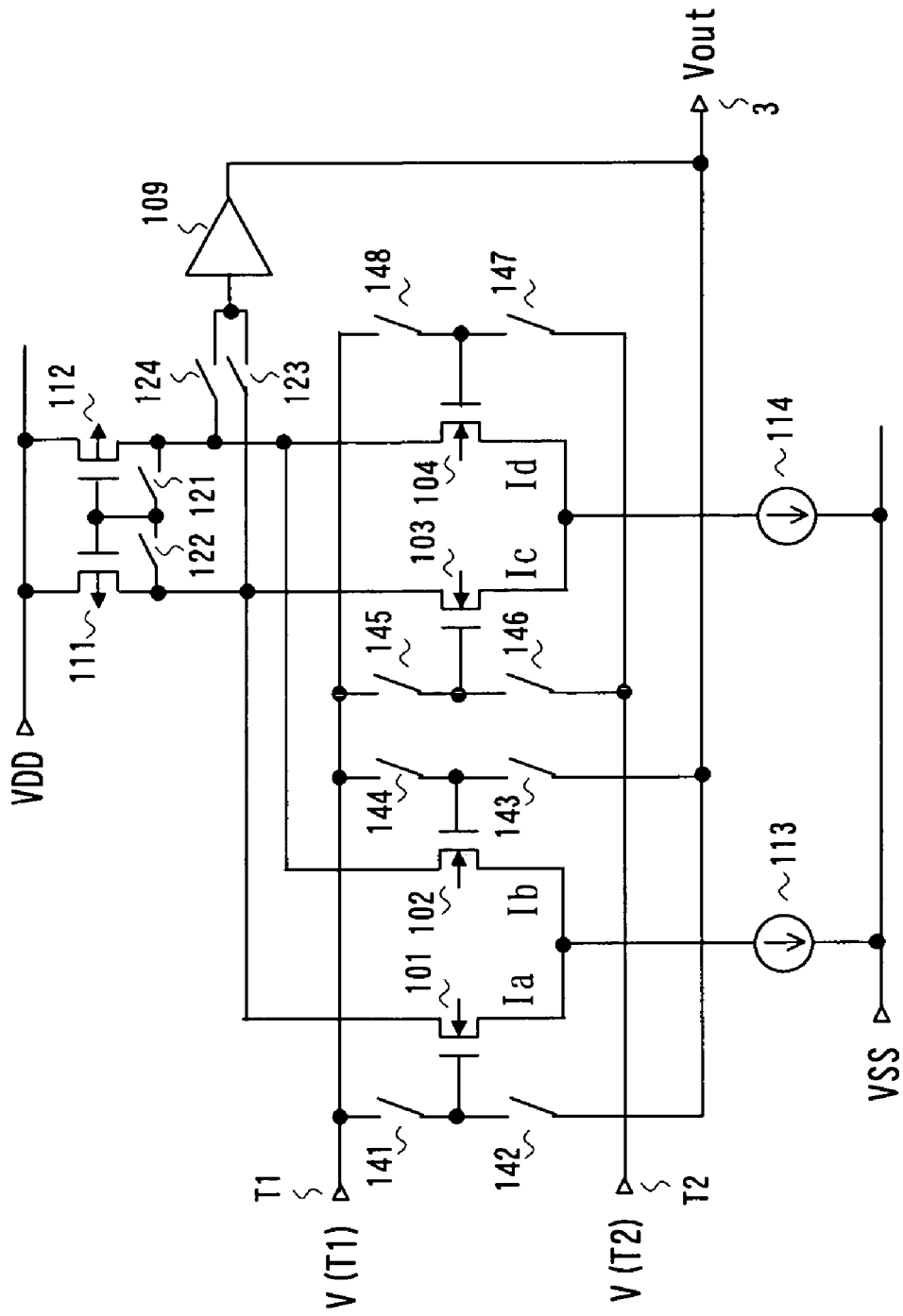
FIG. 7 is a diagram showing a differential amplifier according to a fourth embodiment of the present invention.

FIG. 7 shows a fourth embodiment of the differential amplifier according to the present invention. Referring to FIG. 7, the differential amplifier of the present embodiment differs from the differential amplifier, shown in FIG. 1, as to switches connected between the gates of the n-channel transistors 101 to 104 on one hand and the terminals T1, T2 and the output terminal 3 on the other. In the following, the points of difference from the differential amplifier shown in FIG. 1 will be described with reference to FIG. 7. The differential amplifier of the present embodiment includes a switch 141 which is connected between the terminal T1 and a gate of the n-channel transistor 101, a switch 142 which is connected between the gate of the n-channel transistor 101 and the output terminal 3, a switch 144 which is connected between the terminal T1 and the gate of the n-channel transistor 102, a switch 143 which is connected between the gate of the n-channel transistor 102 and the output terminal 3, a switch 145 which is connected between the terminal T1 and the gate of the n-channel transistor 103, a switch 146 which is connected between the gate of the n-channel transistor 103 and the terminal T2, a switch 148 which is connected between the terminal T1 and the gate of the n-channel transistor 104 and a switch 147 which is connected between the gate of the n-channel transistor 104 and the terminal T2. The present embodiment is otherwise the same as the differential amplifier shown in FIG. 1.

FIG. 8 shows a method for on/off control of the switches 121 to 124 and 141 to 148 of the differential amplifier shown in FIG. 7. The first and second time periods are changed over at a preset cycle. The differential amplifier of FIG. 7 in the first time period and that in the second time period in FIG. 8 may be expressed by equivalent circuits shown in FIGS. 13 and 12, respectively.

That is, if, during the first time period of FIG. 8, the switches 121, 123, 141, 143, 145 and 147 of FIG. 7 are in an on state, and the switches 122, 124, 142, 144, 146 and 148 are in an off state, the differential amplifier of the present embodiment takes the configuration of a differential amplifier shown by the equivalent circuit of FIG. 13. The state of connection is as described in the paragraph [0120] above.

On the other hand, if, during the second time period of FIG. 8, the switches 121, 123, 141, 143, 145 and 147 of FIG. 7 are in an off state, and the switches 122, 124, 142, 144, 146 and 148 are in an on state, the differential amplifier of the present embodiment takes the configuration of a differential amplifier shown by the equivalent circuit of FIG. 12. The state of connection is as described in the paragraph [0098] above.

The operation of canceling out the output offset, ascribable to transistor threshold variations, by the differential amplifier of FIG. 7, is similar to the operation of FIGS. 17 and 16 for the circuit of FIGS. 13 and 12, respectively, so that the respective output voltages Vout are subjected to the offsets which are same in magnitude but opposite in polarity.

Hence, the output offsets are time-averaged by repeating the first and second time periods, at a preset cycle, so that the input/output voltage relationship, shown by the equation (4), is attained. That is, the differential amplifier of FIG. 7 gives an output voltage with high accuracy, in case there are threshold variations of the transistors.

The differential amplifiers of FIGS. 1, 3, 5 and 7, described above, are capable of amplifying and outputting the voltage externally dividing or extrapolating two input voltages V(T1) and V(T2) with a ratio of 1:2. Furthermore, the differential amplifiers are able to cancel out the output offsets ascribable to threshold variations of the transistors to provide an output with high voltage accuracy.

The operation of canceling out the output offset, ascribable to inclination variations in the characteristic curve of the transistor in each of the differential amplifiers of FIGS. 1, 3, 5 and 7, will now be described. For simplicity of explanation, such a case in which the inclination of the characteristic curve of the transistor 104, in the first differential pair (101, 102) and the second differential pair (103, 104), designed to the same transistor size, has an offset from those of the other transistors, will be described. It is assumed that V(T1)≧V(T2).

Initially, the operation of canceling out the output offset, ascribable to inclination variations of the characteristic curves of the transistors of the differential amplifier of FIG. 1 will be described. The switches of the differential amplifier of FIG. 1 are controlled on/off in the same way as in FIG. 2, and the first and second time periods are changed over at a preset cycle. The differential amplifier of FIG. 1 during the first time period and that during the second time period may be expressed by the equivalent circuits of FIGS. 11 and 12, respectively.

Figure 19:
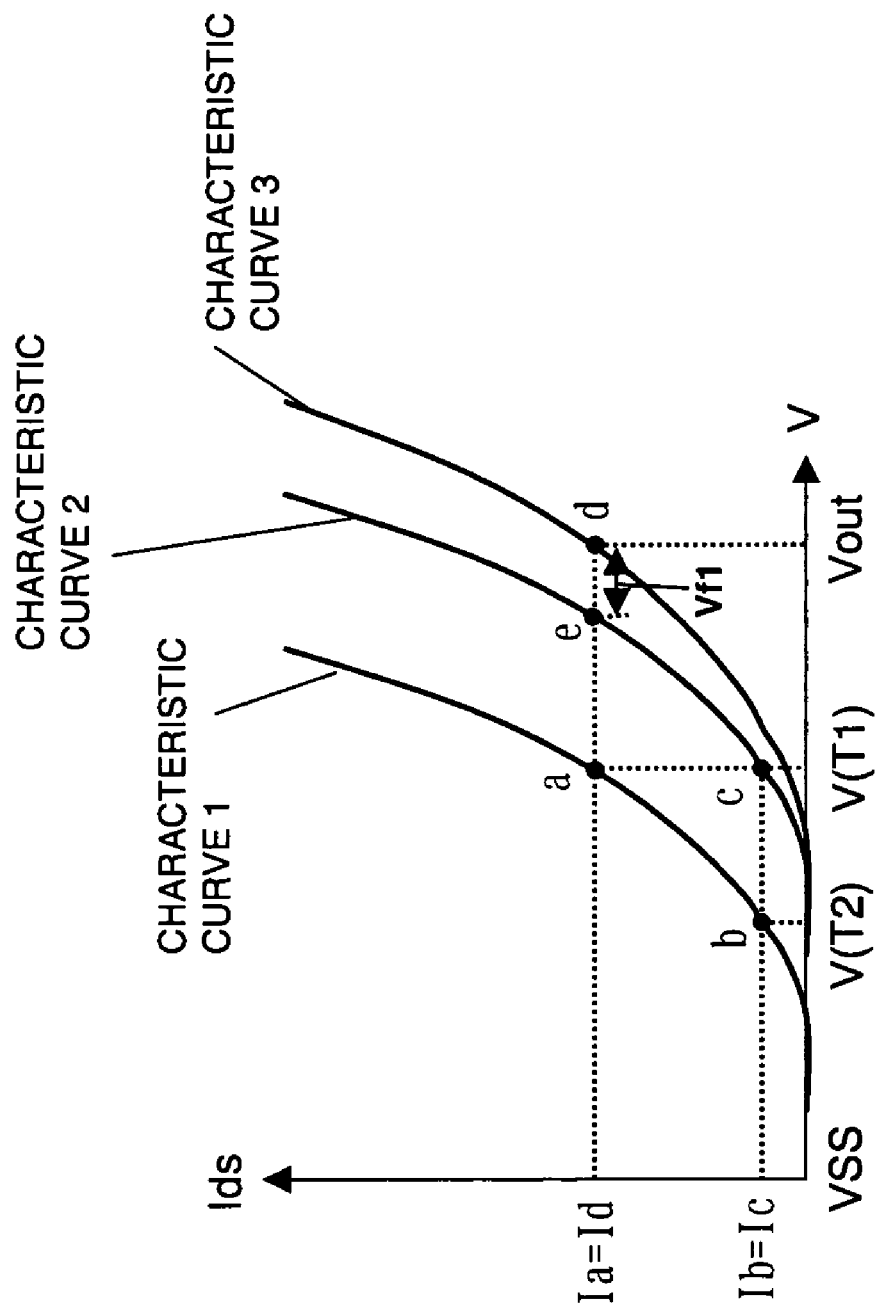
FIG. 19 is a graph for illustrating the operation of FIG. 11 in the case of inclination variations of characteristic curve.

The graph of FIG. 19 illustrates the operation of the circuit of FIG. 11. FIGS. 19 to 22 show that a characteristic curve 3 is more moderate in inclination than the characteristic curve 2, there being no threshold variations. The characteristic curves 1 and 2 and the definition of the operating points and the points of intersection are the same as in FIGS. 15 to 18.

Hence, the four operating points a to d and the point of intersection e are determined as shown in FIG. 19. If the line segment de is expressed as Vf1, the output voltage Vout is a voltage externally dividing or extrapolating the voltages V(T1) and V(T2) with a ratio of 1:2, plus Vf1, and thus may be expressed by the following equation (8):

$$V\text{out}=2\cdot V(T1)-V(T2)+Vf1 \quad (8)$$

Figure 20:
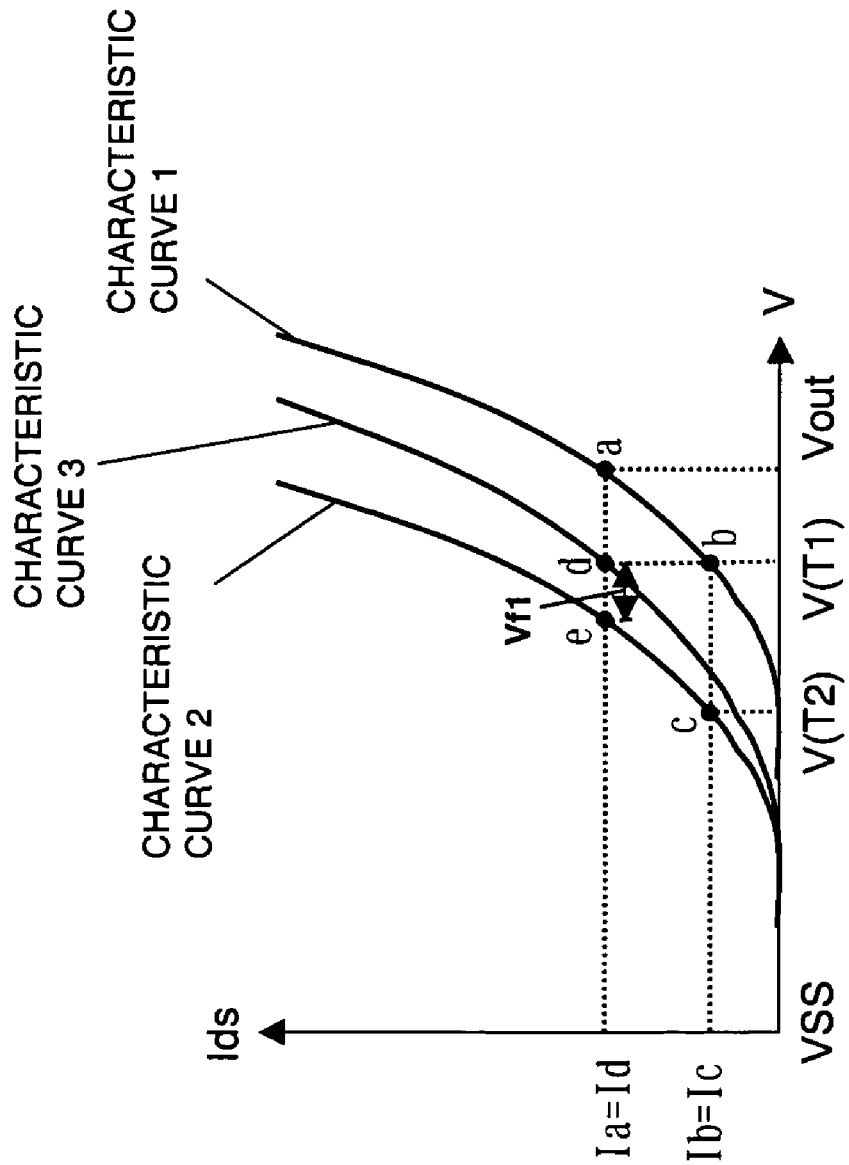
FIG. 20 is a graph for illustrating the operation of FIG. 12 in the case of inclination variations of characteristic curve.

FIG. 20 is a graph illustrating the operation of the circuit of FIG. 12. In FIG. 20, the four operating points a to d and the point of intersection e are determined as shown in FIG. 20. In this case, the length of the line segment de is approximately Vf1, and the output voltage Vout is a voltage externally dividing or extrapolating the voltages V(T1) and V(T2) with a ratio of 1:2, minus Vf1, and may be expressed by the following equation (9):

$$V\text{out}=2\cdot V(T1)-V(T2)-Vf1 \quad (9)$$

Meanwhile, the output offset Vf1 of the equation (8) and that of the equation (9) are not strictly of the same value. The reason is that, although the relationship of the equation (3) is maintained in FIGS. 19 and 20, there is slight deviation in the values of Ids of the respective operating points. However, this deviation of the values of Ids of the respective operating points in the operation of FIGS. 19 and 20 is sufficiently small so that the respective output offsets may be deemed to be of approximately the same value.

With the differential amplifier of FIG. 1, the output voltage Vout has an offset of +Vf1 or −Vf1, during the first and second time periods of FIG. 2, as shown by the equations (8) and (9), in case there are variations in characteristic curves of the transistor 104, specifically, the inclination variations of the characteristic curve. However, the output offset is time-averaged by repeating the first and second time periods at a preset cycle, so that the input/output relationship is equivalent to that shown by the equation (4).

The operation for the case where V(T1)≦V(T2) may readily be derived from the graph illustrating the operation. Although the operating points and the sign as well as the magnitude of the offset differ from those for V(T1)≧V(T2), the output voltages Vout of the first and second time periods are subjected to the offsets which are the same in magnitude and opposite in polarity.

Hence, the output offset is time-averaged by repeating the first and second time periods at a preset cycle, so that the input/output relationship is equivalent to that shown by the equation (4).

The foregoing description has been described of inclination variations of the characteristic curve of the transistor 104. However, in case the differential amplifier of FIG. 1 has inclination variations of the characteristic curve of the transistor 104, these variations may be canceled in similar manner by time-averaging the output offset.

Hence, the differential amplifier of FIG. 1 may provide an output voltage with high accuracy if there are inclination variations in the characteristic curves of the transistors.

The operation of canceling out the output offset, ascribable to inclination variations of the characteristic curves of the transistors, in the differential amplifier of FIG. 3, will now be described. The on/off control of the respective switches of the differential amplifier of FIG. 3 is similar to that described above with reference to FIG. 4. That is, the first and second time periods are changed over at a preset cycle. During the first and second time periods, the equivalent circuits of the differential amplifier of FIG. 3 are those shown in FIGS. 13 and 14, respectively.

Figure 21:
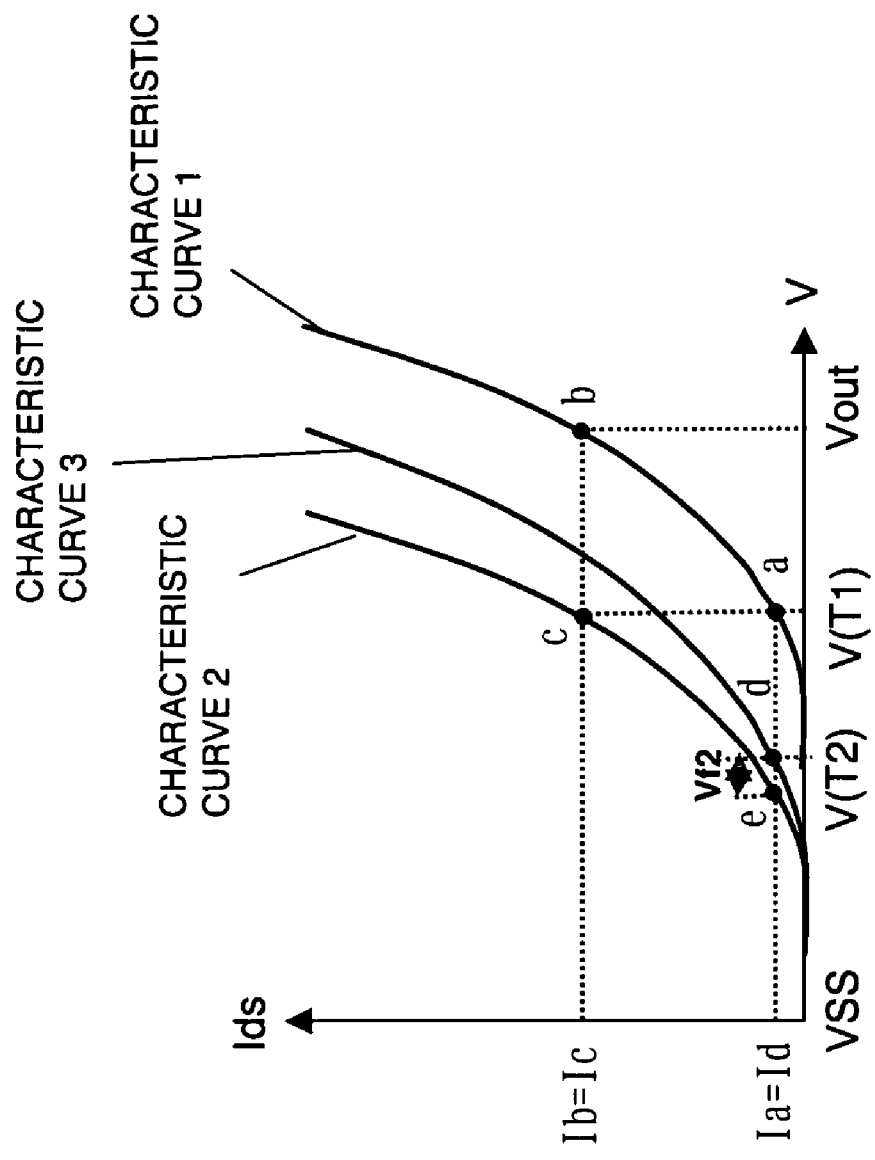
FIG. 21 is a graph for illustrating the operation of FIG. 13 in the case of inclination variations of characteristic curve.

The graph of FIG. 21 illustrates the operation of the circuit of FIG. 13. The four operating points a to d and the point of intersection e are determined as shown in FIG. 21. If the line segment de is expressed as Vf2, the output voltage Vout is a voltage externally dividing or extrapolating the voltages V(T1) and V(T2) with a ratio of 1:2, plus Vf2, and may be expressed by the following equation:

$$V\text{out}=2\cdot V(T1)-V(T2)+Vf2 \quad (10)$$

Figure 22:
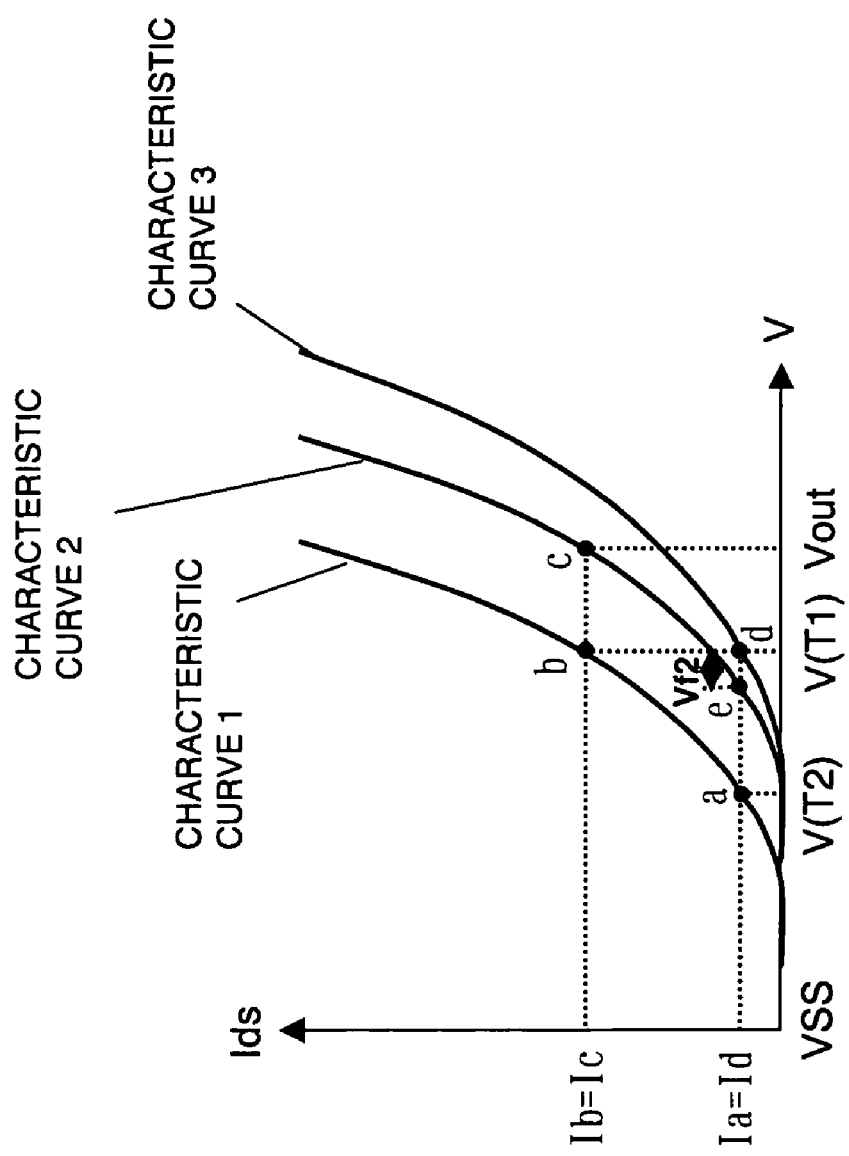
FIG. 22 is a graph for illustrating the operation of FIG. 14 in the case of inclination variations of characteristic curve.

The graph of FIG. 22 illustrates the operation of the circuit of FIG. 14. The four operating points a to d and the point of intersection e are determined as shown in FIG. 22.

In this case, the length of the line segment de is approximately Vf2, and the output voltage Vout is a voltage externally dividing or extrapolating the voltages V(T1) and V(T2) with a ratio of 1:2, minus Vf2, and may be expressed by the following equation (11):

$$V\text{out}=2\cdot V(T1)-V(T2)-Vf2 \quad (11)$$

Meanwhile, the output offset Vf2 of the equation (10) and that of the equation (11) are not strictly of the same value. The reason is that, although the relationship of the equation (3) is maintained in FIGS. 21 and 22, there is a slight deviation in the values of Ids of the respective operating points. However, this deviation of the values of Ids of the respective operating points in the operation of FIGS. 21 and 22 is sufficiently small so that the respective output offsets may be deemed to be of approximately the same value Vf2.

With the differential amplifier of FIG. 3, the output voltage Vout has an offset of +Vf2 or −Vf2, during the first and second time periods of FIG. 4, as shown by the equations (10) and (11), in case the transistor 104 has inclination variations of the characteristic curve.

However, the output offset is time-averaged by repeating the first and second time periods at a preset cycle, so that the input/output relationship is equivalent to that shown by the equation (4).

Meanwhile, the operation for the case where $V(T1) \leq V(T2)$ may readily be derived from the graph illustrating the operation. The output voltage Vout during the first time period and that during the second time period has offsets which are same in magnitude but opposite in polarity.

Thus, the output offset is time-averaged by repeating the first and second time periods at a preset cycle, so that the input/output relationship is equivalent to that shown by the equation (4).

Hence, the differential amplifier of FIG. 3 is able to provide a voltage output with high accuracy in case there are inclination variations of the transistor characteristic curve.

The operation of canceling out the output offset ascribable to inclination variations of the characteristic curve of the transistor in the differential amplifier of FIG. 5 will now be described.

In the differential amplifier of FIG. 5, the on/off control of the switches 121 to 124 and 131 to 138 is the same as that shown in FIG. 6, and switching is made between the first and second time periods at a preset cycle.

The equivalent circuits of the differential amplifier of FIG. 5 for the first time period and that for the second time period are as shown in FIGS. 11 and 14, respectively.

The operation during the first time period of the differential amplifier of FIG. 5 is similar to that shown in FIG. 19 for the circuit of FIG. 11, while that during the second time period is similar to that shown in FIG. 22 for the circuit of FIG. 14.

During the first and second time periods, the output voltages Vout have offsets of +Vf1 and −Vf2, as indicated in the equations (8) and (11), respectively, as described above.

However, the absolute values Vf1 and Vf2 of the respective offsets are varied significantly, as may be seen from FIGS. 19 and 22, for the reason as now described.

When the threshold of the transistor is varied, the characteristic curve is simply shifted along the abscissa. The magnitude of the offset therefore remains unchanged even if the drain-to-source current Ids at the transistor operating point is changed.

On the other hand, when the inclination of the characteristic curve is changed, the magnitude of the offset depends on the drain-to-source current at the transistor operating point.

The drain-to-source current at the operating point d of the transistor 104 in FIG. 19 differs significantly from that in FIG. 21, and hence the absolute values of the offsets Vf1 and Vf2 differ significantly from each other.

The drain-to-source current is also related with the difference voltage between the voltages V(T1) and V(T2) and the difference between the magnitudes of the offset absolute values of Vf1 and Vf2 increases with increase in the difference voltage between the voltages V(T1) and V(T2), Thus, with the differential amplifier of FIG. 5, the output offset cannot be canceled sufficiently even if the first and second time periods of FIG. 6 are changed over at a preset cycle.

The operation of canceling out the output offset, ascribable to inclination variations of the characteristic curves of the transistors, in the differential amplifier shown in FIG. 7, will now be described.

The on/off control of the respective switches of the differential amplifier of FIG. 7 is similar to that shown in FIG. 8.

That is, the first and second time periods are changed over at a preset cycle. The equivalent circuits of the differential amplifier of FIG. 7 during the first and second time periods are shown in FIGS. 13 and 12, respectively.

The operation of the differential amplifier of FIG. 7 during the first time period is similar to the operation of FIG. 21 for the circuit of FIG. 13, while that during the second time period is similar to the operation of FIG. 20 for the circuit of FIG. 12.

As described above, during the first and second time periods, the respective output voltages Vout have offsets of +Vf2 and −Vf1, represented by the equations (10) and (9), respectively.

However, as may be seen from FIGS. 20 and 21, the drain-to-source currents for the two time periods differ significantly, with the absolute values Vf1 and Vf2 of the respective offsets for the two time periods also differing appreciably.

With the differential amplifier of FIG. 7, as with the differential amplifier of FIG. 5, the output offset cannot be canceled out sufficiently even if switching is made between the first and second time periods at a preset cycle.

As described above, the differential amplifiers of FIGS. 1 and 3 cancel out not only the output offset ascribable to transistor threshold variations, but also that ascribable to inclination variations of the characteristic curves, to output the voltage with high accuracy.

On the other hand, the differential amplifiers of FIGS. 5 and 7 are able to cancel out the output offsets, ascribable to transistor threshold variations, but are unable to sufficiently cancel out output offsets, ascribable to inclination variations of the characteristic curves.

The differential amplifiers of FIGS. 1, 3, 5 and 7 may be selectively used depending on characteristics of the variations in the transistors to provide an output voltage with high accuracy.

In the foregoing, the operations in case the transistors 101 to 104, constituting differential pairs of the differential amplifiers of FIGS. 1, 3, 5 and 7, have variations in the thresholds or in the inclination of the characteristic curves, have been described. Next, the operations in case where occurrence of variations in characteristics of the current sources 113 and 114 or the current mirror (111, 112) will be described.

The variations in the transistor characteristics at this time give rise to variations in the currents flowing through the current sources 113 and 114 or to deviations between input/output currents of the current mirror (111, 112). In the following, the operation of canceling out output offsets ascribable to variations in the currents between the current sources 113 and 114 and to deviations between input/output currents of the current mirror (111, 112), in the differential amplifiers of FIGS. 1, 3, 5 and 7, will be described.

First, the operation in case current variations are generated between the current sources 113 and 114 will be described. For simplicity of explanation, it is assumed that transistors other than the current sources 113 and 114 are free from variations. The definitions of the operating points a to d of the transistors 101 to 104 and the currents (drain-to-source currents) are the same as those in FIG. 33, and the graphs for illustrating the operations are for the case where $V(T1) \geq V(T2)$.

If the current value of the current source 114 is larger by $\Delta I$ than that of the current source 113, the equation for the respective currents, which takes this $\Delta I$ into account, is represented by the following equation (12):

$$Ia+Ib=Ic+Id-\Delta I \quad (12)$$

Since the relationship of the input/output currents of the current mirror (111, 112) is the same as the equation (2), the following equation (13):

$$Ia = Id - \Delta I/2,$$

$$Ib = Ic - \Delta I/2 \qquad (13)$$

is derived from the equations (2) and (12).

That is, the relationship of the equation (13) holds for each of the differential amplifiers of FIGS. 1, 3, 5 and 7.

First, the operation of canceling out the output offset in the differential amplifier of FIG. 1, ascribable to current variations between the current sources 113 and 114, will be described.

The on/off control of the respective switches of the differential amplifier of FIG. 1 is the same as that shown in FIG. 2. The first and second time periods are changed over at a preset cycle. The equivalent circuits of the differential amplifier of FIG. 1, during the first and second time periods, are as shown in FIGS. 11 and 12.

Figure 23:
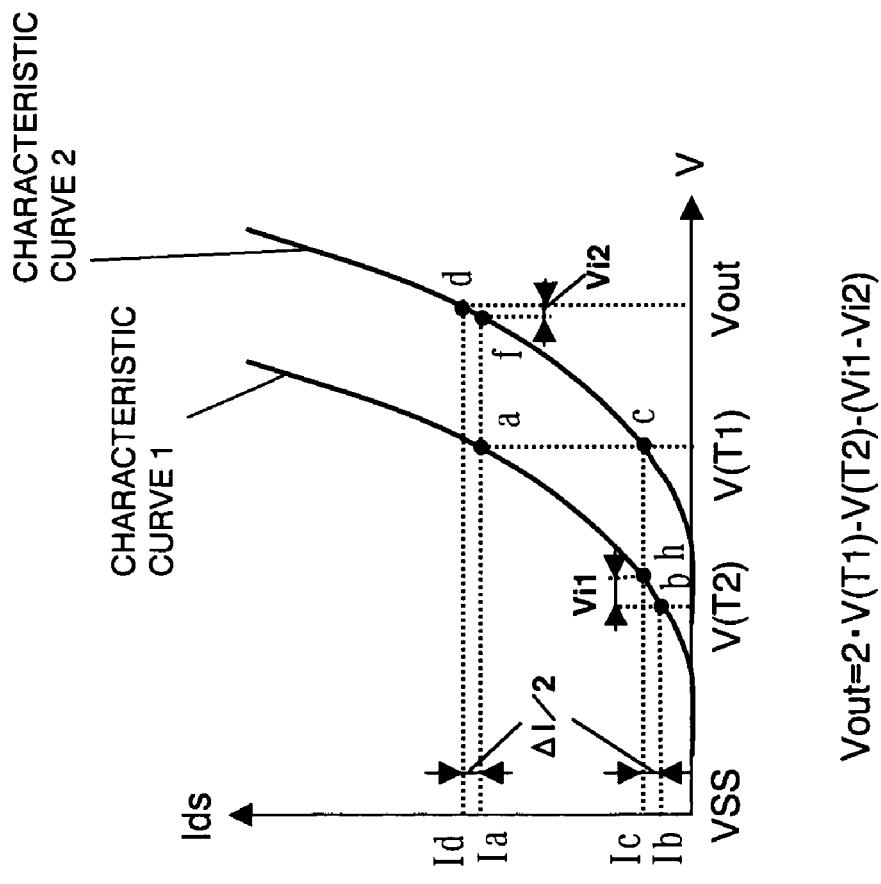
FIG. 23 is a graph for illustrating the operation of FIG. 11 in the case of variations in the current flowing through the current sources.

FIG. 23 shows the operation of the circuit of FIG. 11. In FIG. 23, the four operating points a to d are as defined in the relationship of the equation (13), and may be plotted as shown therein.

A point of intersection of a straight line (Ids=Ia), parallel to the abscissa V, and which passes through the operating point a, with the characteristic curve 2, is f, and a point of intersection of a straight line (Ids=Ic), parallel to the abscissa V, and which passes through the operating point c, with the characteristic curve 1, is h. Also, the potential difference between the operating point b and the point of intersection h is Vi1 and the potential difference between the operating point d and the point of intersection f is Vi2. Since a line segment af is equal to a line segment ch, the output voltage Vout is a voltage which externally divides or extrapolates the voltages V(T1) and V(T2) with a ratio of 1:2, minus (Vi1−Vi2). This output voltage is expressed by the following equation:

$$Vout = 2 \cdot V(T1) - V(T2) - (Vi1 - Vi2) \qquad (14)$$

Figure 24:
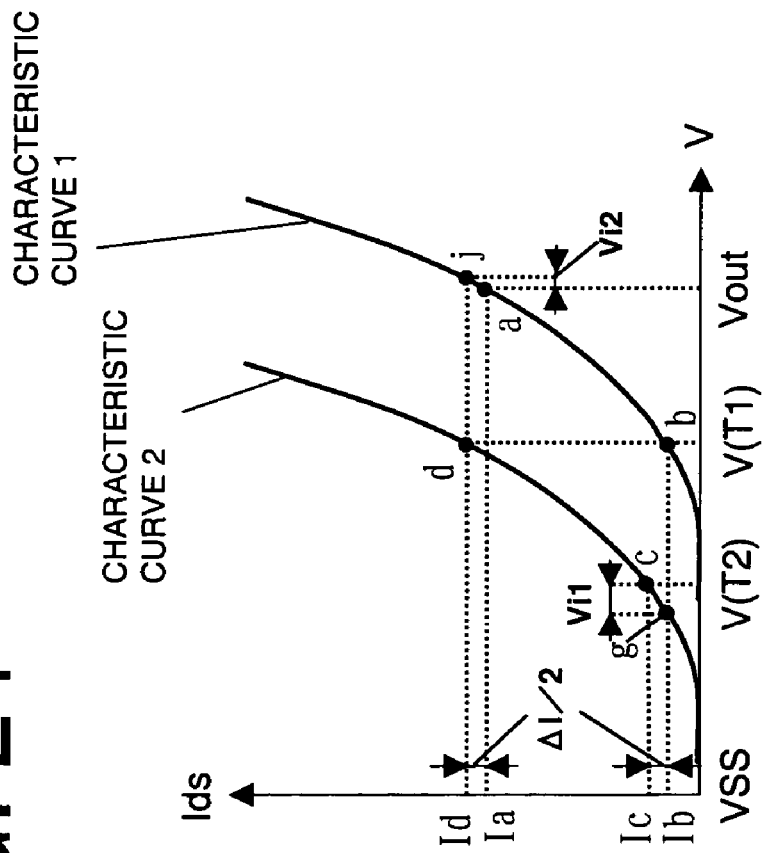
FIG. 24 is a graph for illustrating the operation of FIG. 12 in the case of variations in the current flowing through the current sources.

FIG. 24 shows the operation of the circuit of FIG. 12. In FIG. 24, the currents through four operating points a to d are as defined by the equation (13), and the four operating points a to d are determined as shown. A point of intersection of a straight line (Ids=Ib) parallel to the abscissa V and which passes through the operating point b, with the characteristic curve 2, is g, and a point of intersection of a straight line (Ids=Id) parallel to the abscissa V and which passes through the operating point d, with the characteristic curve 1, is j.

At this time, the potential difference between the operating point c and the point of intersection g is approximately Vi1 and the potential difference between the operating point a and the point of intersection j is approximately Vi2. Since a line segment bg is equal to a line segment dj, the output voltage Vout is a voltage which externally divides or extrapolates the voltages V(T1) and V(T2) with a ratio of 1:2, plus (Vi1−Vi2). This output voltage is expressed by the following equation:

$$Vout = 2 \cdot V(T1) - V(T2) + (Vi1 - Vi2) \qquad (15)$$

Meanwhile, the magnitudes of the output offsets (Vi1−Vi2) by the equations (14) and (15) are strictly not of the same value. It is because the values of Ids at the respective operating points are slightly deviated even though the relationship of the equation (13) is maintained in FIGS. 23 and 24.

However, the deviation of the values of Ids at the respective operating points, in the graphs of FIGS. 23 and 24, is sufficiently small, so that the respective output offsets may be deemed to be of approximately the same magnitude (Vi1−Vi2).

As described above, in case the current sources 113 and 114 have variations in the current values, the differential amplifier of FIG. 1 is subjected to offsets of −(Vi1−Vi2) and +(Vi1−Vi2) during the first time period and during the second time period of FIG. 2, respectively, as indicated by the equations (14), (15), respectively.

However, the above output offsets are time-averaged by repeating the first and second time periods of FIG. 2 at a preset cycle. Hence, a state equivalent to the state shown by the equation (4) is reached.

Meanwhile, the operation for the case where V(T1)≦V(T2) may readily be derived from the graph illustrating the operation. Although the operating points and the signs as well as the magnitudes of the offset differ from those for the case where V(T1)≧V(T2), the output voltage Vout for the first time period and that for the second time period are accompanied by offsets different in polarity and equal in magnitude.

Consequently, the above output offsets are time-averaged by repeating the first and second time periods at a preset cycle. Hence, a state equivalent to the state shown by the equation (4) is reached. The differential amplifier of FIG. 1 therefore is able to provide a voltage output with high accuracy in case there are variations in the currents flowing through the current sources 113 and 114.

The operation of the differential amplifier of FIG. 3 canceling out the output offset ascribable to variations in the currents flowing through the current sources 113 and 114 will now be described.

The on/off control of the respective switches of the differential amplifier of FIG. 3 is the same as that of FIG. 4. That is, switching is made between the first and second time periods at a preset cycle. The equivalent circuit of FIG. 3 during the first time period and that during the second time period are shown in FIGS. 13 and 14, respectively.

Figure 25:
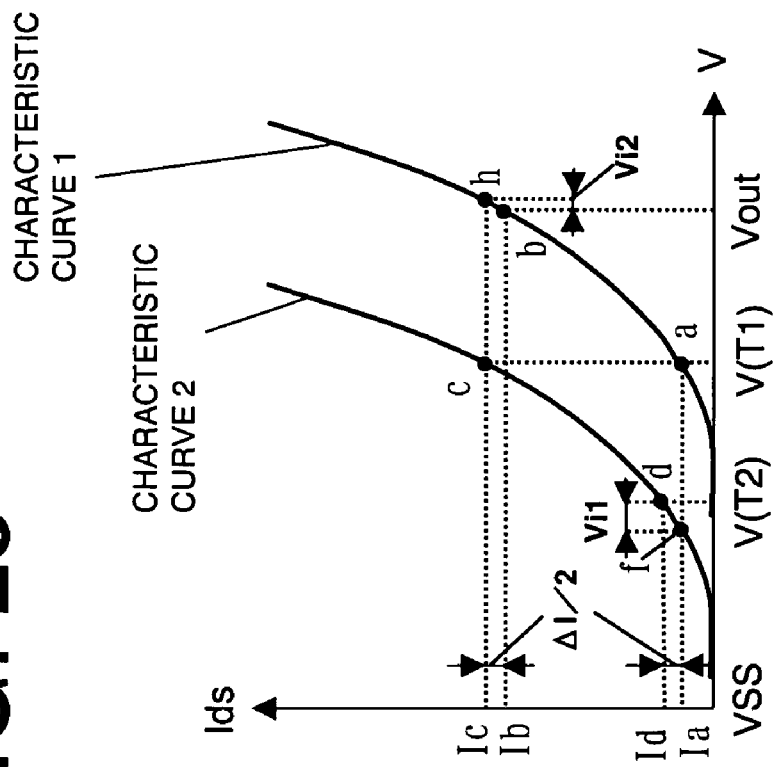
FIG. 25 is a graph for illustrating the operation of FIG. 13 in the case of variations in the current flowing through the current sources.

FIG. 25 illustrates the operation of the circuit of FIG. 13. In case the currents for the operating points a to d are as defined in the relationship of the equation (13), and the definitions of the points of intersection f and h are as shown in FIG. 23, the operating points and the points of intersection are determined as shown in FIG. 25. In this case, the operating points and the points of intersection a, b, c, d, f and h are in the same position relationship as that for the operating points and the points of intersection b, a, d, c, g and j of FIG. 24. The potential difference between the operating point d and the point of intersection f and that between the operating point b and the point of intersection h of FIG. 25 are approximately Vi1 and Vi2, respectively.

Thus, the output voltage Vout is equal to a voltage externally dividing or extrapolating the voltages V(T1) and V(T2) with a ratio of 1:2, plus (Vi1−Vi2), and is expressed by the equation (15).

Figure 26:
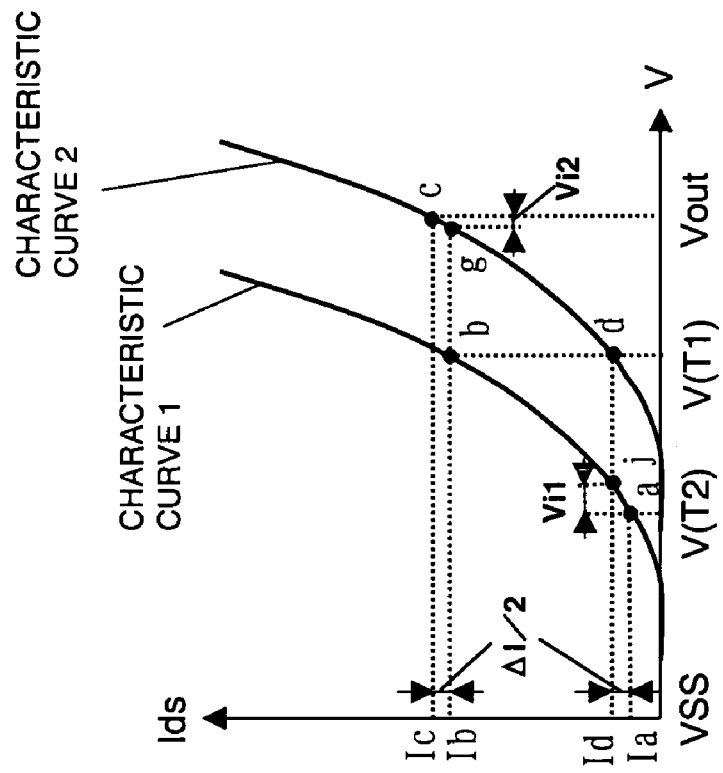
FIG. 26 is a graph for illustrating the operation of FIG. 14 in the case of variations in the current flowing through the current sources.

FIG. 26 shows the operation of the circuit of FIG. 14. In case the currents for the operating points a to d are as set out by the relationship of the equation (13), and the definitions of the points of intersection g and j are as shown in FIG. 24, the operating points and the points of intersection are determined as shown in FIG. 26.

In this case, the operating points and the points of intersection a, b, c, d, g and j are in the same position relationship as that for the operating points and the points of intersection b, a, d, c, f and h of FIG. 23. The potential difference between the operating point a and the point of intersection j and that between the operating point c and the point of intersection g of FIG. 26 are Vi1 and Vi2, respectively. Thus, the output voltage Vout is equal to a voltage externally dividing or extrapolating the voltages V(T1) and V(T2) with a ratio of 1:2, minus (Vi1–Vi2), and is expressed by the equation (14).

As described above, in case there are variations in the currents flowing through the current sources 113 and 114, the output voltage Vout during the first time period and that during the second time period of the differential amplifier of FIG. 3 may be expressed by the equations (15) and (14), respectively, and have offsets of +(Vf1–Vf2) and –(Vf1–Vf2).

Consequently, the above output offsets are time-averaged by repeating the first and second time periods at a preset cycle. Hence, a state equivalent to the state shown by the equation (4) is reached.

The operation for the case where V(T1)≦V(T2) may readily be derived from the graph illustrating the operation. That is, the output voltage Vout during the first time period and that during the second time period are subjected to the offset of the same magnitude and opposite in polarity. Hence, by repeating the first and second time periods, at a preset cycle, the output offset is time-averaged, and hence the equation of Vout becomes equivalent to the equation (4). Thus, the differential amplifier is able to provide a voltage output with high accuracy.

The operation of the differential amplifier of FIG. 5 canceling out the output offset ascribable to current variations in the currents flowing through the current sources 113 and 114 will now be described.

The on/off control of the respective switches of the differential amplifier of FIG. 5 is the same as that of FIG. 6. That is, switching is made between the first and second time periods at a preset cycle. The equivalent circuit of FIG. 5 during the first time period and that during the second time period are shown in FIGS. 11 and 14, respectively.

The operation of the differential amplifier of FIG. 5 during the first time period is similar to the operation of FIG. 23 for the circuit of FIG. 11, while the operation thereof during the second time period is similar to the operation of FIG. 26 for the circuit of FIG. 14.

As described above, during the first and second time periods, the respective output voltages Vout are represented by the equation (14), and have an offset equal to –(Vi1–Vi2).

That is, with the differential amplifier of FIG. 5, the polarity and the magnitude of the offset during the first time period and those during the second time period are equal. Hence, the output offset cannot be canceled despite switching between the first and second time periods at a preset cycle.

The operation of the differential amplifier of FIG. 7 canceling out the output offset ascribable to current variations in the currents flowing through the current sources 113 and 114 will now be described. The on/off control of the respective switches of the differential amplifier of FIG. 7 is the same as that of FIG. 8. That is, switching is made between the first and second time periods at a preset cycle. The equivalent circuit of FIG. 5 during the first time period and that during the second time period are shown in FIGS. 13 and 12, respectively.

The operation of the differential amplifier of FIG. 7 during the first time period is similar to the operation of FIG. 25 for the circuit of FIG. 13, while the operation thereof during the second time period is similar to the operation of FIG. 24 for the circuit of FIG. 12.

As described above, during the first and second time periods, the respective output voltages Vout are represented by the equation (15), and have an offset equal to +(Vi1–Vi2).

That is, with the differential amplifier of FIG. 7, the polarity and the magnitude of the offset during the first time period and that during the second time period are equal. Hence, the output offset cannot be canceled despite switching between the first and second time periods at a preset cycle.

The operation when the input/output currents through the current mirror (111, 112) will now be described. For simplicity of explanation, it is assumed that the transistors other than the current mirror 111, 112 are free from variations, and that the definitions of the operating points a to d, the points of intersection f, g, h and j and the currents (drain-to-source currents) Ia, Ib, Ic and Id are the same as those in FIGS. 23 to 26. The graphs illustrating the operation show the case where V(T1)≧V(T2).

If the drain-to-source current of the transistor 112 has become larger by ΔI than the drain-to-source current of the transistor 111, due to variations in characteristics of at least one of the transistors 111 and 112, the relationship of the currents may be expressed by the following equation (16):

$$Ia+Ic=Ib+Id-\Delta I \tag{16}$$

The relationship of the currents for the current sources 113 and 114 is the same as the equation (1). Hence, the following equation (17):

$$Ia=Id-\Delta I/2,$$

$$Ib=Ic+\Delta I/2 \tag{17}$$

may be derived from the equations (1) and (16).

That is, the relationship of the equation (17) holds for the differential amplifiers of FIGS. 1, 3, 5 and 7.

The operation of the differential amplifier of FIG. 1 canceling out the output offset ascribable to deviations in the input and output currents flowing through the current mirror (111, 112) will now be described. The on/off control of the respective switches of the differential amplifier of FIG. 1 is the same as that of FIG. 2. That is, switching is made between the first and second time periods at a preset cycle.

The equivalent circuit of the differential amplifier of FIG. 1 during the first time period, and that during the second time period, are shown in FIGS. 11 and 12, respectively.

Figure 27:
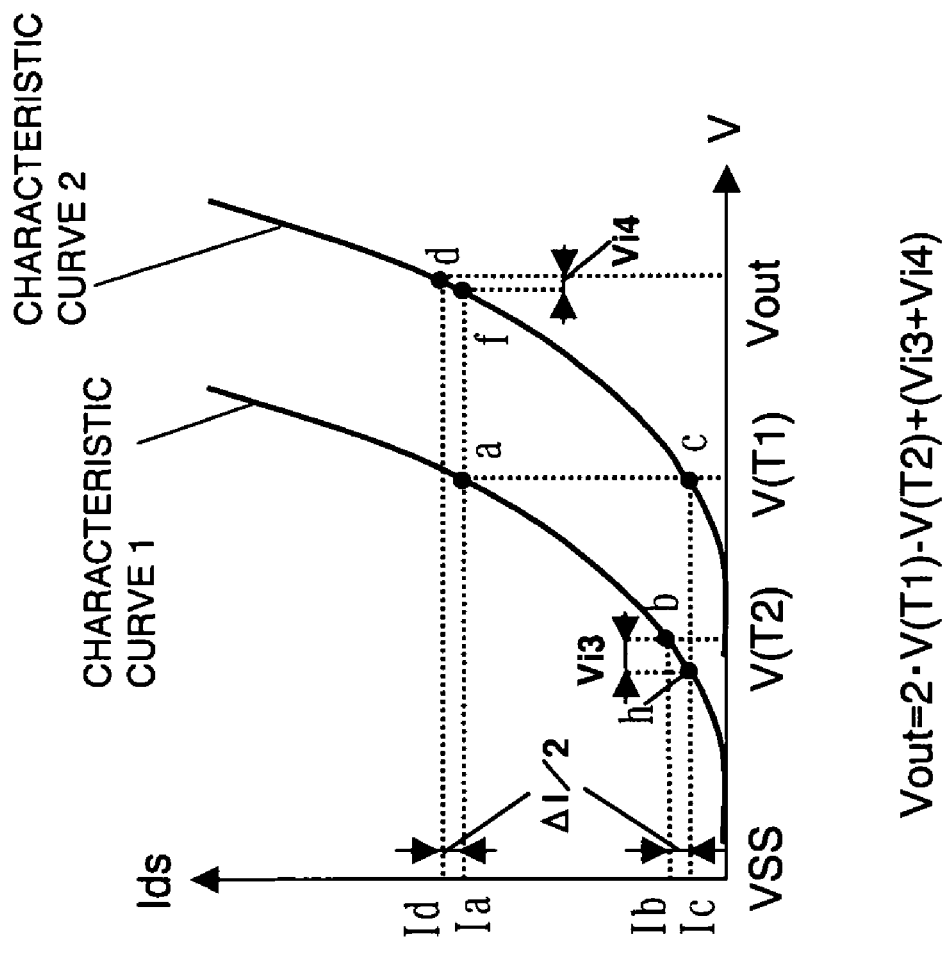
FIG. 27 is a graph for illustrating the operation of FIG. 11 in the case of variations in the current flowing through the current mirror.

FIG. 27 shows the operation of the circuit of FIG. 11. If the currents at the operating nodes a, b, c and d are kept at the relationship of the equation (17) and the points f and h are as shown in FIG. 23, the operating points and the points of intersection are defined as shown in FIG. 27.

The potential difference between the operating point b and the point of intersection h is Vi3 and that between the operating point d and the point of intersection f is Vi4.

Since the line segments af and ch are of an equal length, the output voltage Vout is equal to a voltage externally dividing or extrapolating the V(T1) and V(T2) with a ratio of 1:2 plus (Vi3+V4), and may be expressed by the following equation (18):

$$Vout=2\cdot V(T1)-V(T2)+(Vi3+Vi4) \tag{18}$$

Figure 28:
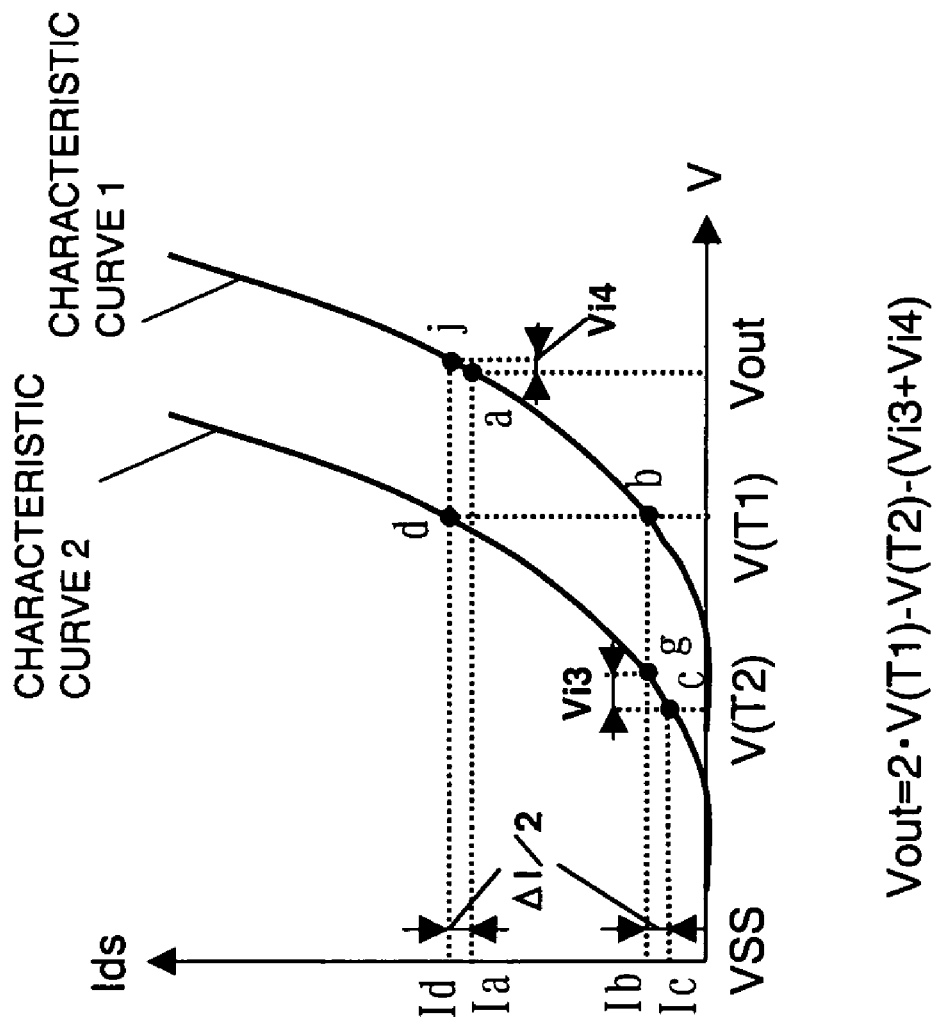
FIG. 28 is a graph for illustrating the operation of FIG. 12 in the case of variations in the current flowing through the current mirror.

FIG. 28 illustrates the operation of the circuit of FIG. 12. If the currents at the operating nodes a, b, c and d are kept at the relationship of the equation (17) and the points g and j are as shown in FIG. 24, the operating points and the points of intersection are defined as shown in FIG. 28. At this time, the potential difference between the operating point c and the point of intersection g is approximately Vi3 and that between the operating point a and the point of intersection j is approximately Vi4. Since the line segments bg and dj are of an equal length, the output voltage Vout is equal to a voltage externally dividing or extrapolating the V(T1) and V(T2) with a ratio of 1:2, minus (Vi3+V4), and thus may be expressed by the following equation (19):

$$Vout=2\cdot V(T1)-V(T2)-(Vi3+Vi4) \tag{19}$$

Meanwhile, the output offset (Vi3+Vi4) of the equation (18) and that of the equation (19) are not strictly of the same value. The reason is that, although the relationship of the equation (17) is maintained in FIGS. 27 and 28, there are slight deviations in the values of Ids of the respective operating points.

However, these deviations of the values of Ids of the respective operating points in the operation of FIGS. 27 and 28 are sufficiently small so that the respective output offsets may be deemed to be of approximately the same value.

As described above, when the input/output currents through the current mirror (111, 112) in the differential amplifier of FIG. 1 are subjected to deviations, the output voltage Vout during the first time period and that during the second time period in FIG. 2 have offsets of +(Vi3+V4) and −(Vi3+V4), as shown by the equations (18) and (19), respectively.

However, the above output offsets are time-averaged by repeating the first and second time periods of FIG. 2 at a preset cycle. Hence, a state equivalent to the state shown by the equation (4) is reached.

Meanwhile, the operation for the case where $V(T1) \leq V(T2)$ may readily be derived from the graph illustrating the operation. Although the operating points and the signs as well as the magnitudes of the offset differ from those for the case where $V(T1) \geq V(T2)$, the output voltage Vout for the first time period and that for the second time period are accompanied by offsets different in polarity and equal in magnitude.

Consequently, the above output offsets are time-averaged by repeating the first and second time periods at a preset cycle. Hence, a state equivalent to the state shown by the equation (4) is reached.

The differential amplifier of FIG. 1 therefore is able to provide a voltage output with high accuracy in case there is a deviation between the input and output currents flowing through the current mirror (111, 112).

The operation of the differential amplifier of FIG. 3 canceling out the output offset ascribable to the deviations in the input/output currents flowing through the current mirror (111, 112) will now be described.

The on/off control of the respective switches of the differential amplifier of FIG. 3 is the same as that of FIG. 4. That is, switching is made between the first and second time periods at a preset cycle. The equivalent circuit of FIG. 3 during the first time period and that during the second time period are shown in FIGS. 13 and 14, respectively.

Figure 29:
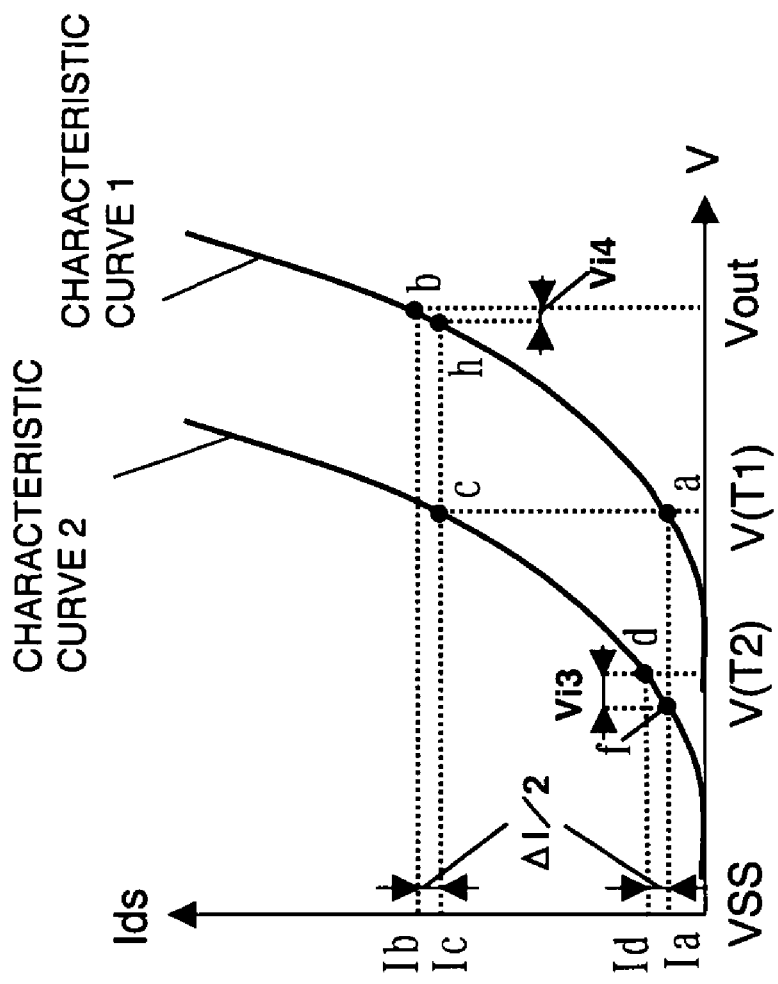
FIG. 29 is a graph for illustrating the operation of FIG. 13 in the case of variations in the current flowing through the current mirror.

FIG. 29 illustrates the operation of the circuit of FIG. 13. In case the currents for the operating points a to d are as defined in the relationship of the equation (17), and the definitions of the points of intersection f, h are as shown in FIG. 23, the operating points and the points of intersection are determined as shown in FIG. 29. In this case, the operating points and the points of intersection a, b, c, d, f and h are in the same position relationship as that for the operating points and the points of intersection c, d, a, b, h and f of FIG. 27. The potential difference between the operating point d and the point of intersection f and that between the operating point b and the point of intersection h of FIG. 29 are approximately Vi3 and Vi4, respectively.

Thus, as in FIG. 27, the output voltage Vout is equal to a voltage externally dividing or extrapolating the voltages V(T1) and V(T2) with a ratio of 1:2, plus (Vi3+Vi4), and is expressed by the equation (18).

Figure 30:
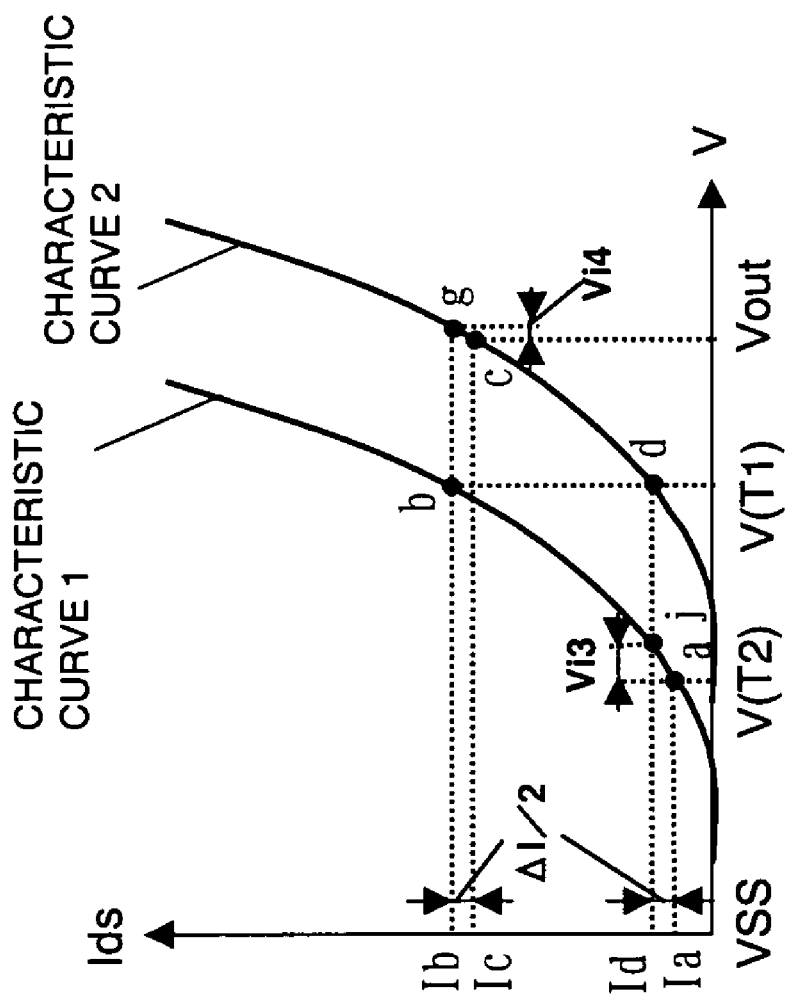
FIG. 30 is a graph for illustrating the operation of FIG. 14 in the case of variations in the current flowing through the current mirror.

FIG. 30 illustrates the operation of the circuit of FIG. 14. In case the currents for the operating points a to d are as defined by the relationship of the equation (17), and the definitions of the points of intersection g and j are as shown in FIG. 24, the operating points and the points of intersection are determined as shown in FIG. 30. In this case, the operating points and the points of intersection a, b, c, d, g and j are in the same position relationship as that for the operating points and the points of intersection c, d, a, b, j and g of FIG. 28. The potential difference between the operating point a and the point of intersection j and that between the operating point c and the point of intersection g of FIG. 30 are Vi3 and Vi4, respectively.

Thus, as in FIG. 28, the output voltage Vout is equal to a voltage externally dividing or extrapolating the voltages V(T1) and V(T2) with a ratio of 1:2, minus (Vi3+Vi4), and is expressed by the equation (19).

As described above, when there is a deviation between the input/output currents through the current mirror (111, 112) in the differential amplifier of FIG. 3, the output voltage Vout during the first time period and that during the second time period in FIG. 4 have offsets of +(Vi1+V2) and −(Vi1+V2), as shown by the equations (18) and (19), respectively.

However, the above output offsets are time-averaged by repeating the first and second time periods of FIG. 4 at a preset cycle. Hence, a state equivalent to the state shown by the equation (4) is reached.

Meanwhile, the operation for the case where $V(T1) \leq V(T2)$ may readily be derived from the graph illustrating the operation. The output voltage Vout for the first time period and that for the second time period are accompanied by offsets different in polarity and equal in magnitude.

Consequently, the above output offsets are time-averaged by repeating the first and second time periods at a preset cycle. Hence, a state equivalent to the state shown by the equation (4) is reached, thus providing an output with high voltage accuracy.

The differential amplifier of FIG. 5 canceling out the output offset, ascribable to deviations in the input/output currents of the current mirror (111, 112), will now be described.

In the differential amplifier of FIG. 5, the on/off control of the respective switches is the same as that shown in FIG. 6, and switching is made between the first and second time periods at a preset cycle. The equivalent circuits of the differential amplifier of FIG. 5 for the first time period and that for the second time period are as shown in FIGS. 11 and 14, respectively.

The operation of the differential amplifier of FIG. 5 during the first time period is similar to that shown in FIG. 27 for the circuit of FIG. 11, while that during the second time period is similar to that shown in FIG. 30 for the circuit of FIG. 14.

As described above, the respective output voltages Vout for the first and second output voltages are represented by the equations (18) and (19), respectively.

Thus, with the differential amplifier of FIG. 5, the above output offsets are time-averaged by repeating the first and second time periods at a preset cycle. Hence, a state equivalent to the state shown by the equation (4) is reached, thus assuring an output with high voltage accuracy.

The operation of the differential amplifier of FIG. 7 canceling out the output offset ascribable to deviations in the input/output currents flowing through the current mirror (111, 112) will now be described. The method for on/off control of the respective switches of the differential amplifier of FIG. 7 is the same as that of FIG. 8. That is, switching is made between the first and second time periods at a preset cycle. The equivalent circuit of FIG. 7 during the first time period and that during the second time period are shown in FIGS. 13 and 12, respectively.

The operation of the differential amplifier of FIG. 7 during the first time period is similar to that shown in FIG. 29 for the circuit of FIG. 13, while that during the second time period is similar to that shown in FIG. 28 for the circuit of FIG. 12.

As described above, the respective output voltages Vout for the first and second output voltages are represented by the equations (18) and (19), respectively. Thus, with the differential amplifier of FIG. 7, the above output offsets are time-averaged by repeating the first and second time periods at a preset cycle. Hence, a state equivalent to the state shown by the equation (4) is reached, thus assuring an output with high voltage accuracy.

As described above, the differential amplifiers of FIGS. 1 and 3 are able to cancel out the output offset ascribable to current variations in the current sources 113 and 114 and to the deviation between the input and output currents in the current mirror (111, 112) to provide an output voltage with high accuracy.

On the other hand, the differential amplifiers of FIGS. 5 and 7 are able to cancel out the output offset ascribable to the deviation between the input and output currents in the current mirror (111, 112), however, the differential amplifiers are unable to cancel out the output offset ascribable to variations of the currents supplied from the current sources 113 and 114.

The differential amplifiers of FIGS. 1, 3, 5 and 7 may be selectively used responsive to current deviations in the current sources 113 and 114 or deviations in the input/output currents of the current mirror (111, 112), generated due to variations from one transistor to another.

Figure 9:
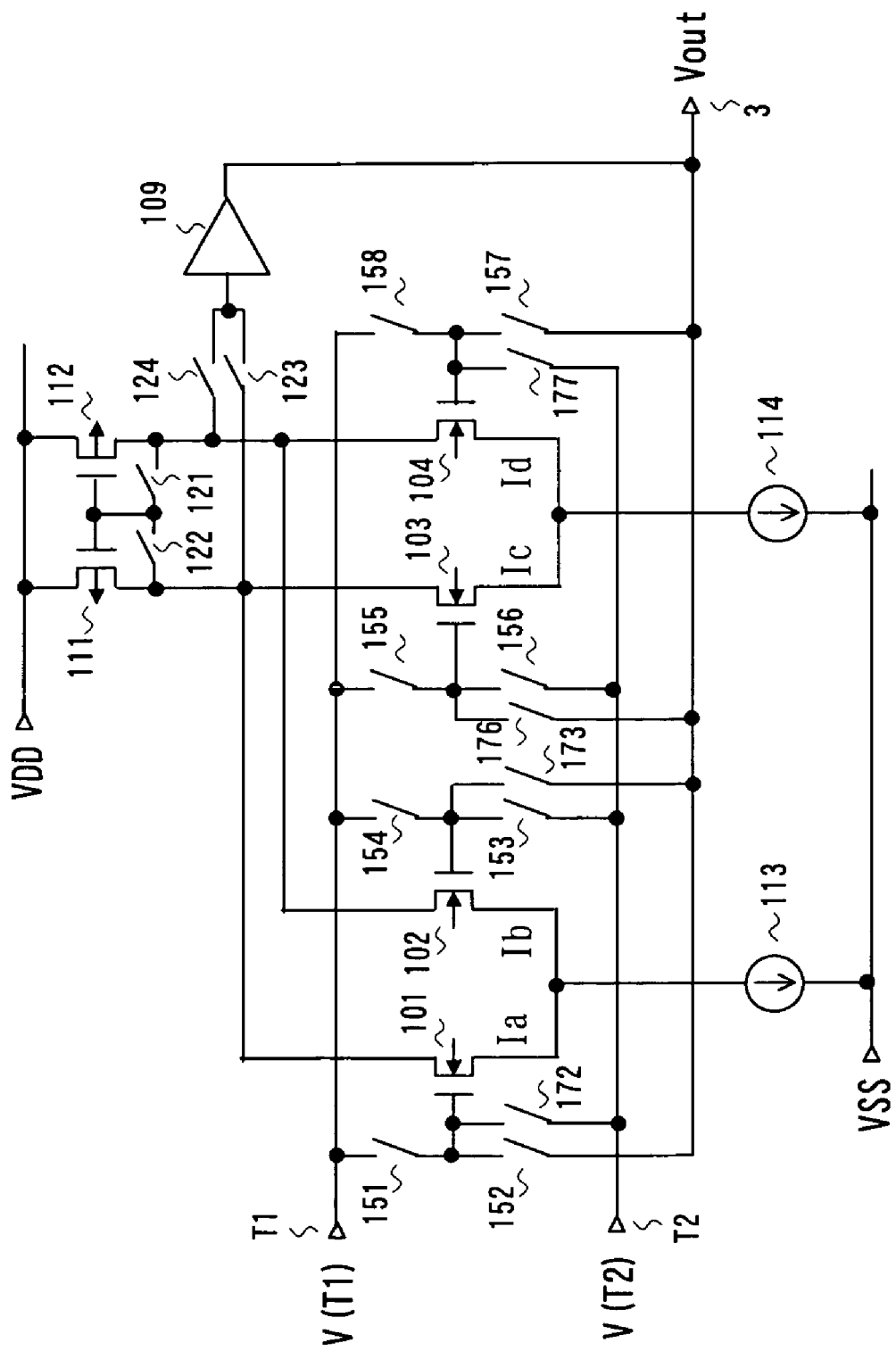
FIG. 9 is a diagram showing a differential amplifier according to a fifth embodiment of the present invention.

FIG. 9 shows a differential amplifier according to a fifth embodiment of the present invention. Referring to FIG. 9, the differential amplifier of the present embodiment corresponds to the configuration of the differential amplifier of FIG. 1, further equipped with switches 172, 173, 176 and 177. That is, the switch 172 is provided between the gate of the n-channel transistor 101 and the terminal T2, the switch 173 is provided between the gate of the n-channel transistor 102 and the output terminal 3, the switch 176 is provided between the gate of the n-channel transistor 103 and the output terminal 3 and the switch 177 is provided between the gate of the n-channel transistor 104 and the terminal T2.

FIG. 10 shows the on/off control of the respective switches of the differential amplifier of FIG. 9. Referring to FIG. 10, during the first time period, the switches 121, 123, 151 and 155 are in an on state, the switches 122, 124, 154 and 158 are in an off state, the switches 153 and 157 are in an on state, the switches 152 and 156 are in an off state, the switches 173 and 177 are in an off state, and the switches 172 and 176 are in an off state. The resulting configuration is the configuration of FIG. 11.

During the second time period, the switches 121, 123, 151 and 155 are in an off state, the switches 122, 124, 154 and 158 are in an on state, the switches 153 and 157 are in an off state, the switches 152 and 156 are in an on state, the switches 173 and 177 are in an off state, and the switches 172 and 176 are in an off state. The resulting configuration is the configuration of FIG. 12.

During the third period, the switches 121, 123, 151 and 155 are in an on state, the switches 122, 124, 154 and 158 are in an off state, the switches 153, 157 are in an off state, the switches 152, 156 are in an off state, the switches 173, 177 are in an on state, and the switches 172, 176 are in an off state. The resulting configuration is the configuration of FIG. 13.

During the fourth period, the switches 121, 123, 151 and 155 are in an off state, the switches 122, 124, 154 and 158 are in an on state, the switches 153, 157 are in an off state, the switches 152, 156 are in an off state, the switches 173, 177 are in an off state, and the switches 172, 176 are in an on state. The resulting configuration is the configuration of FIG. 14. The first to fourth time periods are changed over at a preset cycle. In the differential amplifier of FIG. 9, the four equivalent circuits are changed over periodically, so that, by the operation described in FIGS. 15 to 30, output offsets ascribable to variations in transistor characteristics may be canceled out to assure an output voltage with high accuracy. The sequence of the first to fourth time periods is optional.

With the differential amplifier of FIG. 9, the output accuracy is highest among the above-described embodiments. However, the number of the switches and control signals used and the circuit area are more than those of the differential amplifiers of FIGS. 1, 3, 5 and 7. Hence, the respective differential amplifiers may be selectively used depending on the voltage accuracy as required or on the circuit area.

In each of the above-described differential amplifiers of FIGS. 1, 3, 5, 7 and 9, there are provided two differential pairs formed by n-channel transistors. However, similar favorable results may, of course, be achieved with the differential amplifier configuration including two differential pairs formed by p-channel transistors or with the differential amplifier configuration of a rail-to-rail type including two differential pairs each of which is formed by a p-channel transistor and an n-channel transistor.

As a comparison of the embodiment of the present invention, undesirable connection switching will be described hereinbelow. In periodically switching between two connection states, for the first and second time periods, such as between the equivalent circuits of FIGS. 11 and 13, the sign of the offset becomes the same for threshold variations of the transistors of the differential pair, inclination variations of characteristic curves, or deviation between the input and output currents in the current mirror (111, 112)

so that offsets can scarcely be canceled out.

The same applies for switching between the equivalent circuits of FIGS. 12 and 14. The offset can effectively be canceled out only with the manner of switching as proposed by the present invention.

Figure 31:
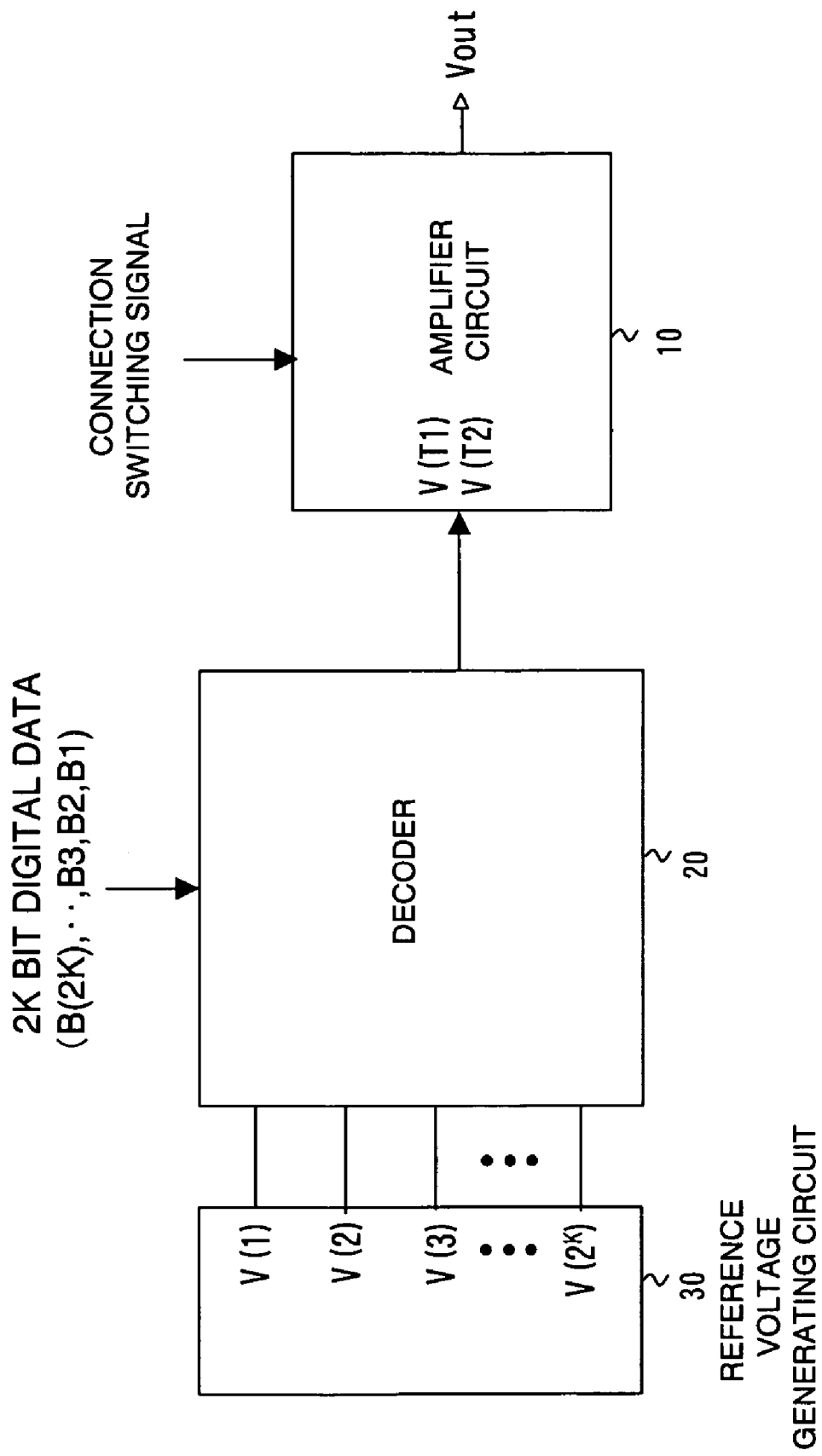
FIG. 31 is a diagram showing the configuration of an embodiment of a digital-to-analog converter employing the differential amplifier of FIG. 1.

FIG. 31 is a diagram showing the configuration of principal functional blocks of a digital-to-analog converter employing a differential amplifier embodying the present invention. Referring to FIG. 31, the digital-to-analog converter of the present embodiment includes a reference voltage generating circuit 30, a decoder 20 and an amplifier 10.

As the amplifier circuit 10, any one of the differential amplifiers described with reference to FIGS. 1, 3, 5, 7 and 9 is used. The amplifier circuit 10 is supplied with connection switching signals to control the switches of each differential amplifier to change over the time periods in FIGS. 2, 4, 6, 8 and 10, associated with the respective differential amplifiers, at a preset cycle.

In this manner, the amplifier circuit 10 is able to amplify and output the voltage, externally dividing or extrapolating the two input voltages V(T1) and V(T2) with a ratio of 1:2. The amplifier circuit is also able to cancel out output offsets ascribable to variations in characteristics of the transistors to provide an output voltage with high accuracy even in case of a large potential difference between V(T1) and V(T2).

The reference voltage generating circuit 30 generates $2^K$ reference voltages V(1), V(2), ... and V($2^K$) to output the so generated voltages to the decoder 20. The decoder 20 is supplied with $2^K$ bit digital data and, depending on the input data, selects two out of the $2^K$ reference voltages, inclusive of double selected voltages, to output the so selected reference voltages as voltages V(T1) and V(T2) to the amplifier circuit 10.

The two voltages V(T1) and V(T2) may be selected by the decoder 20 simultaneously, that is, in parallel, or sequentially, that is, in cascade. It is however necessary that the two voltages V(T1), V(T2) shall be supplied to three input terminals corresponding to the four input terminals of the two differential pairs (101, 102) and (103, 104) of the amplifier circuit 10, less the input terminal to which is connected the output terminal in a feedback fashion.

The digital-to-analog converter, shown in FIG. 31, is able to output up to $4^K$ voltage levels, at the maximum, for $2^K$ reference voltages, depending on digital data.

As described with reference to FIG. 34, when $2^K$ reference voltages are set as in the equation (5), $4^K$ voltage levels may be provided as linear outputs.

Since the number of the reference voltages, generated in the reference voltage generating circuit 30, is smaller than the number of the output voltages, the number of the transistors of the decoder 20 is small, thus achieving area saving in the digital-to-analog converter.

Figure 32:
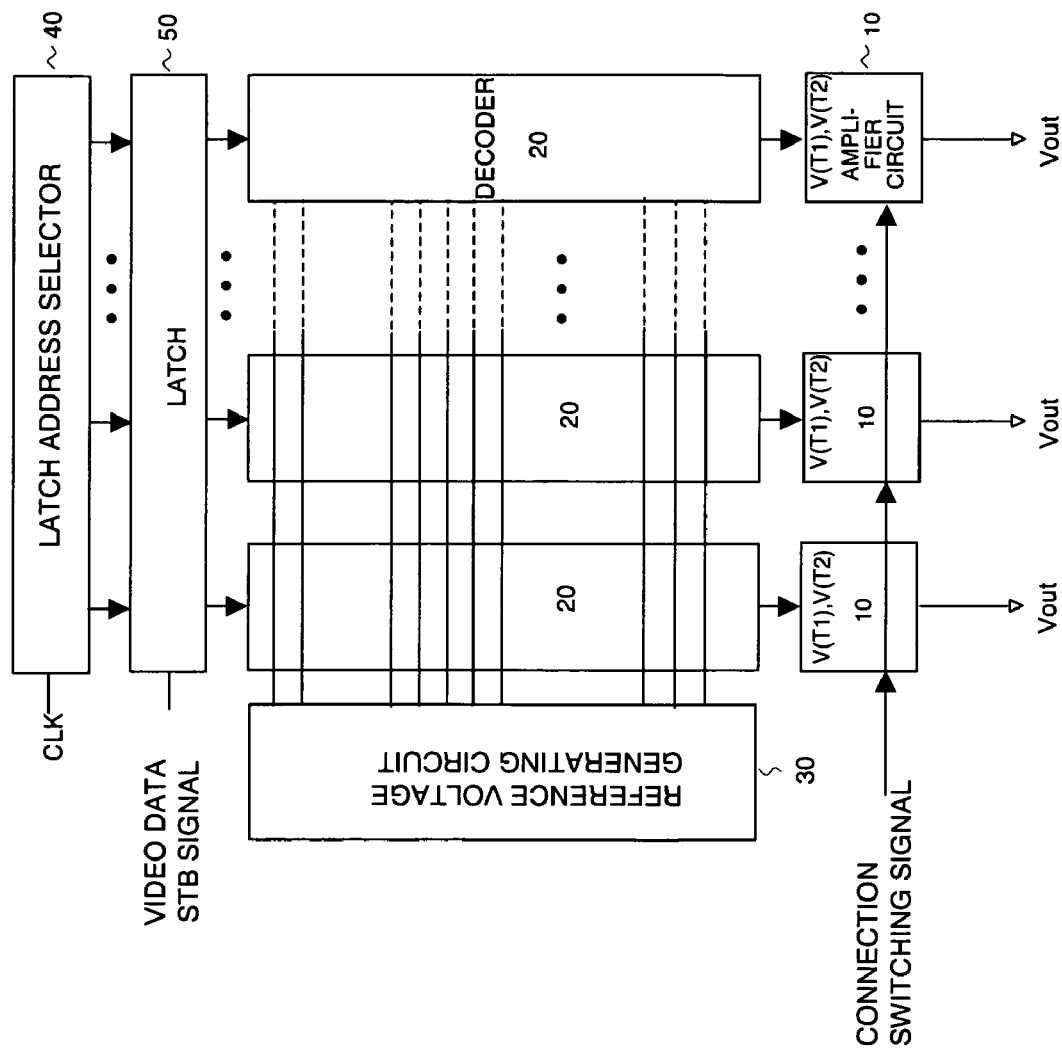
FIG. 32 is a diagram showing a typical configuration of a display of an active matrix driving system.

FIG. 32 is a diagram showing functional blocks of essential portions of an embodiment of a data driver of a display employing the differential amplifier of the present embodiment. Referring to FIG. 32, this data driver includes a latch address selector 40, a latch 50, a reference voltage generating circuit 30, a decoder 20 and an amplifier 10.

For the latch address selector 40 and the latch 50, the circuits similar to the latch address selector 981 and the latch 982 of FIG. 36 may be used.

For the reference voltage generating circuit 30, decoders 20 and the amplifier circuits 10, the digital-to-analog converter of FIG. 31 may be used. It is noted that the decoders 20 and the amplifier circuits 10 may be provided from one output of the data driver to another, whilst the reference voltage generating circuit 30 may be shared by the plural decoders 20. The connection switching control signals are supplied common to the plural amplifier circuits 10.

If, with the reference voltage generating circuit 30, decoders 20 and the amplifier circuits 10, the data driver is to be of linear output characteristics, the configuration of FIG. 31 may directly be applied.

If, on the other hand, the output characteristics of the data driver are to be non-linear, a circuit for linear outputting of $4^K$ voltage levels for $2^K$ reference voltages is implemented as one block which is combined with plural blocks with an optional positive number K. This allows the data driver to be applied to non-linear output characteristics.

With the data driver, shown in FIG. 32, including the digital-to-analog converter of FIG. 31, the number of the reference voltages of the reference voltage generating circuit 30 is lesser than those of the gray-scale voltage generator 986 in the data driver is formed by the circuit of FIG. 36. The number of the devices of the decoder is also diminished appreciably. Hence, an output may be provided to higher accuracy as the circuit area is saved. The result is that the chip size is decreased and a data driver LSI may be implemented at lower cost. If digital data for uses other than the use as video data are supplied to the data driver, the data driver may be used for apparatus other than the display.

The data driver shown in FIG. 32 may be used with advantage for the data driver 980 of the display shown in FIG. 35A. The data driver of FIG. 32, used for the data driver 980, appreciably contributes to cost reduction in the display device. On the other hand, with a display device in which a display unit, a gate driver and a data driver are formed as one with the use of a thin-film-constituting semiconductor material, such as polysilicon (polycrystalline silicon), a narrow frame may be achieved through area saving of the data driver.

The period of switching of the connection switching control signals, supplied to the amplifier circuits 10 of the data driver of FIG. 32, may be an integer number multiple of one frame rewrite period (frame period) of the display or an integer number multiple of the data line rewrite period (line period). Since the luminance of the display for the same video data is averaged at a period equal to the integer number multiple of a picture rewriting period, it is possible to improve the display quality. Of course, the switching similar to that shown in Patent Document 2 is possible in the liquid crystal display.

The connection switching signals may be changed over a plural number of times within one data period within which gray-scale voltage signals are supplied to the data lines. Since the data lines are large capacitive loads, plus and minus offsets of smaller magnitudes, if supplied alternately, may be canceled and averaged on the data lines. This improves the display quality.

The present invention is not limited to the liquid crystal display and may, of course, be applied to an active matrix display in which level voltages are supplied to the data lines to control the luminance of the respective pixels. An example of this type of the active matrix display is an organic EL (Electroluminescence) display which has come into practical use these days.

Figure 39:
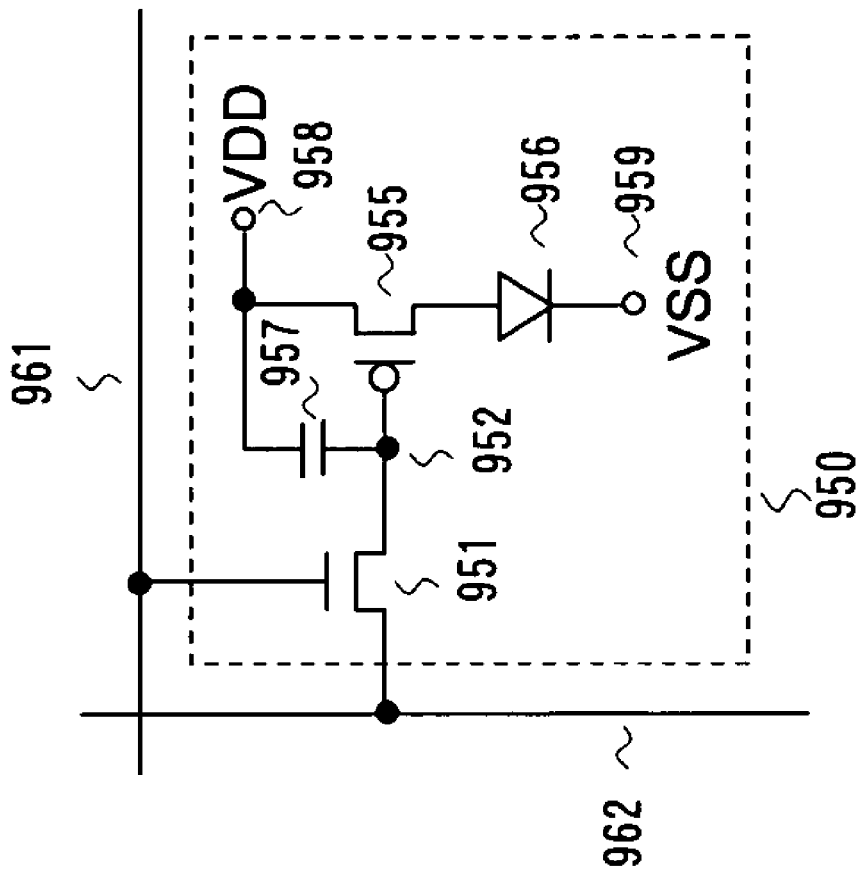
FIG. 39 is a diagram showing principal portions of a pixel part 950 (for one pixel) in an EL display by an equivalent circuit.

FIG. 39 schematically shows, by an equivalent circuit, the principal configuration of a pixel part 950 (for one pixel) of an EL display. In case the pixel part 950 is applied to the pixel part 950 of FIG. 35A, the result is the configuration of an active matrix EL display.

Referring to FIG. 39, the pixel part 950 in an EL display is made up of TFTs (thin-film transistors) 951 and 955, an electrode terminal 952, an EL device (light emitting diode) 956, a capacitor 957 and power supply terminals 958 and 959.

The display part of the organic EL display includes an electrode, a TFT (thin-film transistor) and EL devices formed by thin films of an organic material, all formed as layers on a substrate. The TFT 951, as a switching device, connects a data line 962 and the electrode terminal 952, and has a control end connected to a gate line 961. In FIG. 39, the TFT 951 and the electrode terminal 952 are of the same function as that of the pixel part of the liquid crystal display of FIG. 35B, and hence are depicted by the same reference numerals. The TFT 955 and the EL devices 956 are connected in series with each other between the two power supply terminals 958 and 959. The electrode terminal 952 is connected to the control end of the TFT 955. The capacitor 957 has one end connected to the electrode terminal 952, while having the other end connected to a power supply terminal and to the source terminal of the TFT 955 for maintaining constant the current flowing through the TFT 955.

The display mechanism is such that on/off of the TFT 951, exhibiting the switching function, is controlled by the scan signal and, when the TFT 951 is turned on, the gray-scale voltage signal, corresponding to a video data signal, is supplied to the electrode terminal 952 and thence supplied to the control terminal of the TFT 955. The TFT 955 converts the voltage signal into a current signal corresponding to the gray-scale voltage signal to control the light emitting luminance of the EL device 956 which has luminance characteristics corresponding to the current flowing therethrough. The capacitor 957 holds the potential of the electrode terminal 952, even after the TFT 951 is turned off, and holds the light emitting luminance of the EL device 956 for a preset time period to display a picture.

In FIG. 39, the TFTs 951 and 955 are formed as n-channel and p-channel transistors, respectively. These TFTs may also be formed as transistors of the same polarities. A switching transistor may also be provided in addition to the TFTs 951 and 955. Although a variety of configurations have so far been proposed for improving the performance, only the basic configuration is described herein.

As described above, the differential amplifier embodying the present invention may be used as a data driver for the organic EL display to achieve favorable effects similar to those of the liquid crystal display apparatus.

Figure 40:
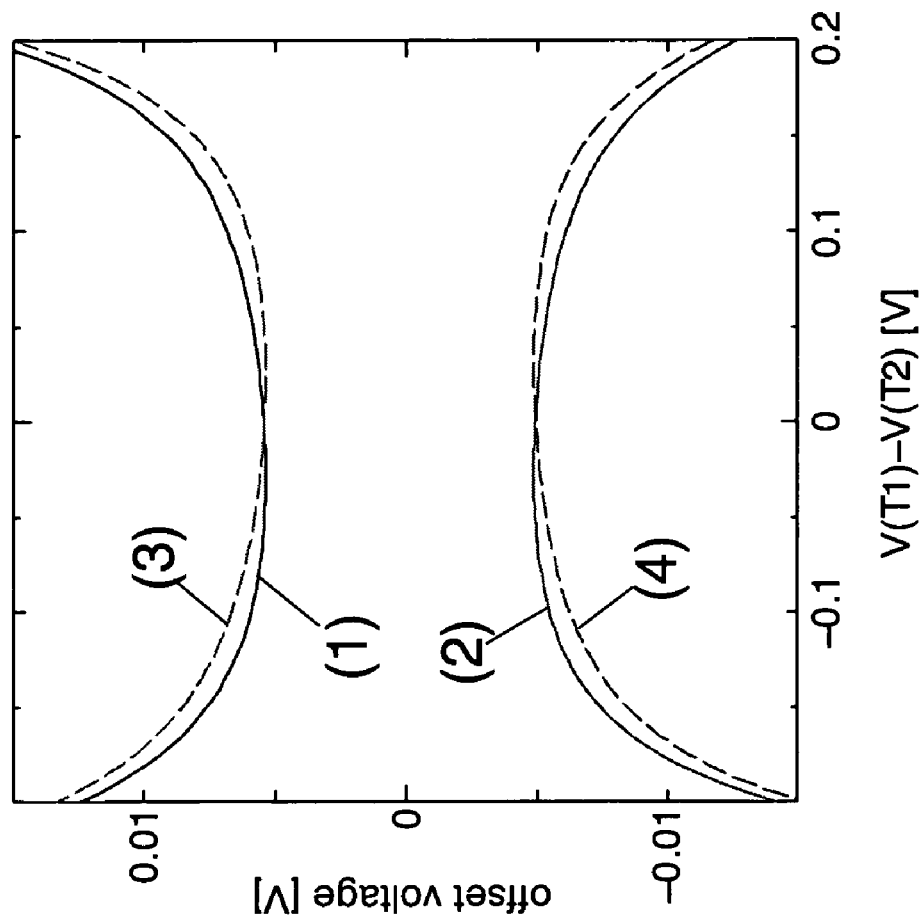
FIG. 40 is a graph showing the results of simulation conducted for affirming the meritorious effect of the present invention.
Figure 41:
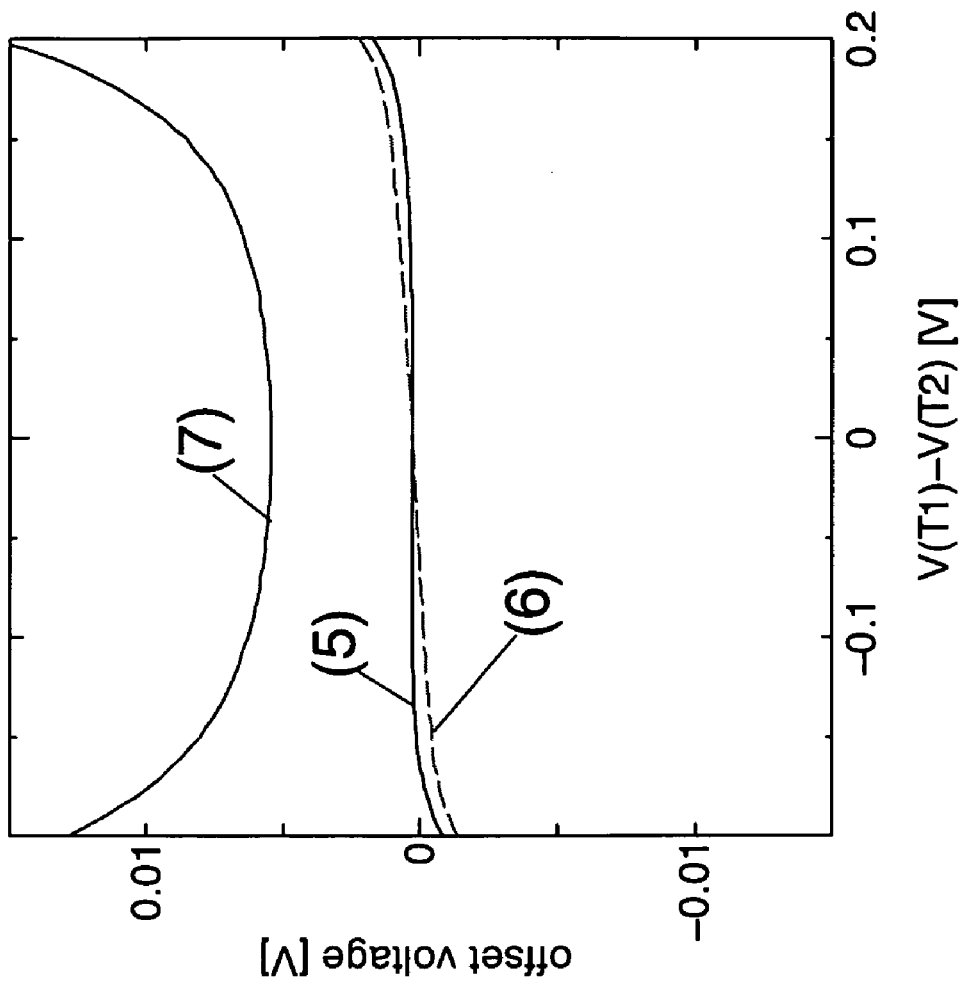
FIG. 41 is a graph showing the results of simulation conducted for affirming the meritorious effect of the present invention.

FIGS. 40 and 41 are graphs showing the results of simulation carried out for confirming the meritorious effect of the present invention. More specifically, FIG. 40 shows the results of simulation in case where the channel width of only the transistor 104, out of the transistors 101 to 104 of the two differential pairs, in the circuits of FIGS. 11 to 14, is smaller by 2%, and when the channel width of the transistor 111 of the current mirror (111, 112), has become smaller by 2% than that of the transistor 112. Since the inclination of the characteristic curve of the transistor 104 is decreased, and the current flowing through the transistor 112 is increased over the current flowing through the transistor 111, there is derived the operation as described with reference to FIGS. 19 to 22 and FIGS. 27 to 30.

FIG. 40 shows output offset characteristic curves (1) to (4) for voltage differences between V(T1) and V(T2), that is, {V(T1)−V(T2)}, showing the results as obtained with the circuits of FIGS. 11 to 14, respectively. The offset characteristic curves (1) to (4) exhibit dependency upon the voltage difference {V(T1)−V(T2)}.

The reason is that, in FIGS. 19 to 22, the magnitudes of Vf1 and Vf2 depend on the voltage difference {V(T1)−V(T2)}, and that, in FIGS. 27 to 30, the magnitudes of Vi3 and Vi4 also depend on the voltage difference {V(T1)−V(T2)}.

In particular, Vi3 in FIGS. 27 to 30 is strongly dependent on the voltage difference {V(T1)−V(T2)}. The reason is that the current value of the operating point of the differential transistor supplied with the voltage V(T2) is decreased with increase in the voltage difference {V(T1)−V(T2)}, and the inclination of the corresponding characteristic curve is also decreased, with the result that Vi3 is increased in magnitude significantly.

It is noted that FIG. 40 is for the case where transistors 104 and 111 have variations in characteristics. If, in addition to these transistors, other transistors are also subjected to variations in characteristics, the offset may be as large as several times that shown in FIG. 40 at the maximum.

FIG. 41 shows the results of simulation in case the circuits of FIGS. 11 to 14, having the offsets shown in FIG. 40, are changed over between two states of connection at a period corresponding to a preset time period, thereby time-averaging the offset.

A characteristic curve (5), showing the connection switching of the circuits of FIGS. 11 and 12 (averaging of the characteristic curves (1) and (2)), represents the operation of the differential amplifier of FIG. 1. On the other hand, a characteristic curve (6), showing the connection switching of the circuits of FIGS. 11 and 14 (averaging of the characteristic curves (1) and (4)), represents the operation of the differential amplifier of FIG. 5.

A characteristic curve (7) shows the connection switching of the circuits of FIGS. 11 and 13 (averaging of the characteristic curves (1) and (3)), and stands for an undesirable switching operation.

It is seen from FIG. 41 that the offset of the characteristic curve (5) is smallest, and that the offset of the characteristic curve (6) also is rather small.

With the characteristic curve (7), on the other hand, the offset is scarcely suppressed.

The foregoing demonstrates the offset suppressing effects by the differential amplifiers of FIGS. 1 and 5.

The offset of the characteristic curve (6) is slightly larger than that of the characteristic curve (5), due to the difference between Vf1 and Vf2 of FIGS. 19 and 22.

The meritorious effects by the operation of the differential amplifiers of FIGS. 3 and 7 are similar to those of the differential amplifiers of FIGS. 1 and 5, respectively.

Figure 42:
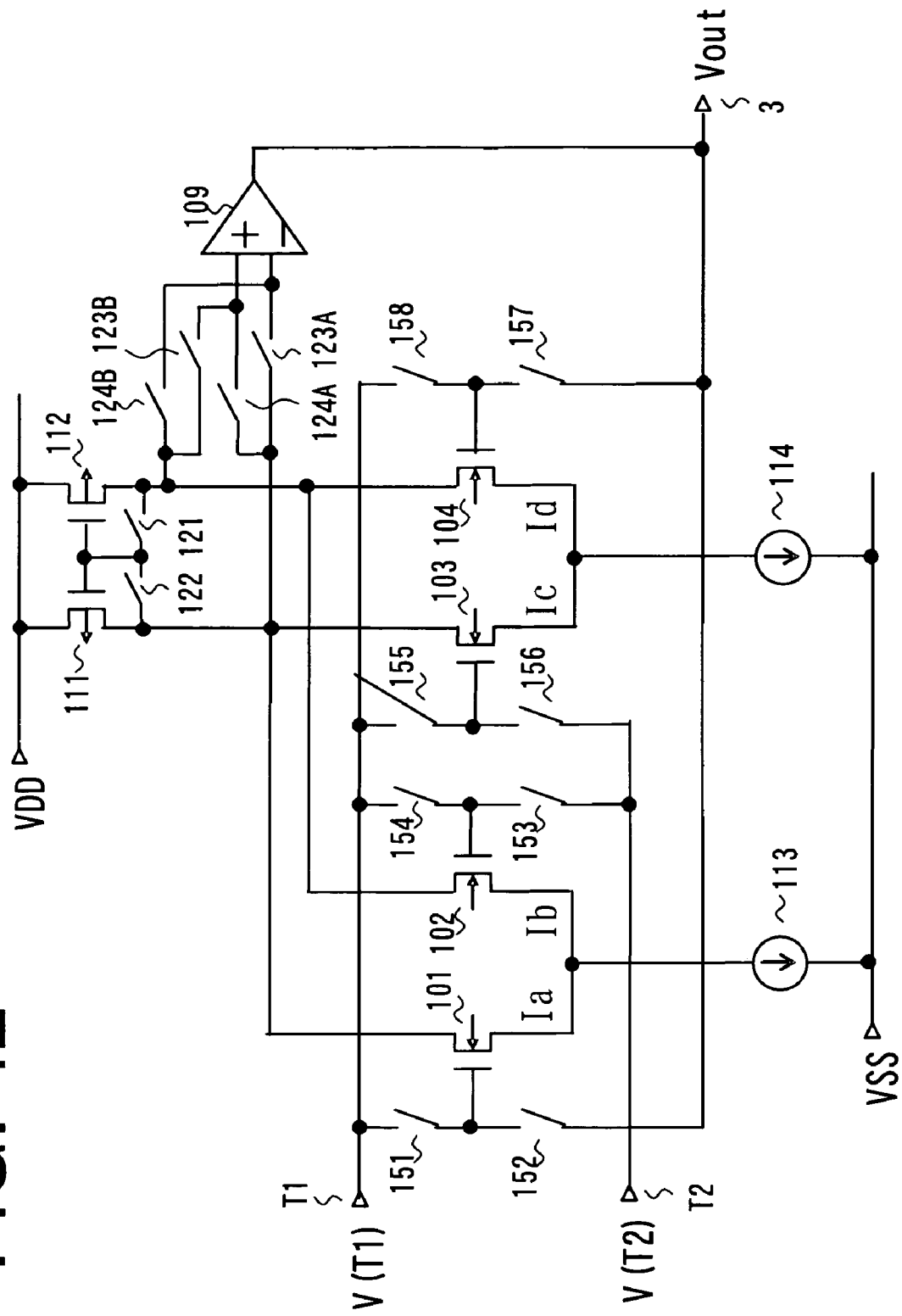
FIG. 42 is a diagram for illustrating a modification of FIG. 1.

The following is further added with regard to the present invention. The amplifier stages 109 of FIGS. 1, 3, 5, 7 and 9 may also be differential amplifier stages. FIG. 42 is a diagram showing the configuration of a differential amplifier in which the amplifier stage 109 of FIG. 1 is arranged as a differential amplifier stage 109. Referring to FIG. 42, there are provided switches 123A, 124A, 124B and 123B, in lieu of the switches 123 and 124 of FIG. 1. The switches 123A and 124A are connected between a connection node of the drains of the n-channel transistors 101 and 103 and the drain of the p-channel transistor 111 on one hand and an inverting input end (−) and a non-inverting input end (+) of the differential amplifier stage 109 on the other. The switches 124B and 123B are connected between a connection node of the drains of the n-channel transistors 102 and 104 and the drain of the p-channel transistor 112 on one hand and the inverting input end (−) and the non-inverting input end (+) of the differential amplifier stage 109. Otherwise, the configuration of FIG. 42 is the same as that of FIG. 1.

In FIG. 42, the switches 151 to 158, 121 and 122 are on/off controlled in the same way as in FIG. 2. The switches 123A and 123B are on/off controlled in the same way as the switch 123 of FIG. 2, that is, the switches 123A and 123B are turned on and off during the first time period and during the second time period, respectively. The switches 124A and 124B are on/off controlled in the same way as the switch 124 of FIG. 2, that is, the switches 124A and 124B are turned off and on during the first time period and during the second time period, respectively. Hence, an output offsets during the first time period and during the second time period are same in magnitude but opposite in polarity. Consequently, the output offset may be canceled by periodically interchanging the first and second time periods, as in the case of the differential amplifier shown in FIG. 1. Meanwhile, the destinations of connection of the inverting input end (−) and the non-inverting input end (+) of the differential amplifier stage 109 are interchanged during the first and second time periods. Thus, with the differential amplifier of FIG. 42, it becomes possible to cancel out the output offset, inclusive of offset, if any, of the differential amplifier stage 109, ascribable to variations in transistor characteristics.

The following is to be added to the description for a case where the data driver of FIG. 32 is used as a data driver 980 of the display apparatus of FIGS. 35A and 35B (paragraph [0295]). The data driver of FIG. 32 includes a plural number of amplifier circuits 10 for driving the data lines. The connection switching circuits of the amplifier circuits 10 are controlled for connection switching by connection switching signals. In the simplest case, all of the amplifier circuits 10 may periodically be switched, as a sole group of the amplifier circuits, between the connecting state for the first time period and that for the second time period.

On the other hand, the amplifier circuits 10 may be arranged in several groups, such as in two groups, and control may be performed in a different fashion from one of the groups to another. FIG. 43 shows the control of the differential amplifiers for a group 1 and a group 2 into which the differential amplifiers are divided. In FIG. 43, each of the amplifier circuits 10 is made up by the differential amplifier of FIG. 1, while there is shown the on/off state of each switch during the N'th time period and the (N+1)st time period. The differential amplifiers of the group 1 are controlled so that the control of the N'th and the (N+1)st time periods is the control of the first and second time periods of FIG. 2, respectively, whilst the differential amplifiers of the group 2 are controlled so that the control of the N'th and the (N+1)st time periods is the control of the second and first time periods of FIG. 2, respectively. As for the method of dividing the differential amplifiers into the groups 1 and 2, the differential amplifiers, driving the odd number data, and those driving the even number data, may be named the groups 1 and 2, respectively, by way of an example.

The meritorious effect in performing the control shown in FIG. 43 is hereinafter described. The data driver, shown in FIG. 32, is formed by the integrated circuit constituting technique on a single-crystal silicon substrate and an insulating substrate such as a glass substrate, such that variations in characteristics of transistors of plural amplifier circuits 10 are produced in the semiconductor fabrication process. In this case, variations in the transistor characteristics may exist as local distribution and as uniform distribution. It may be surmised that, if the concentration distribution is inclined only slightly in a given direction by e.g. ion implantation into a substrate, for example, the variations in the transistor characteristics become of uniform distribution, and that local distribution may occur in the uniform distribution only by singular effects. If the variations in the transistor characteristics are of the uniform distribution, the plural amplifier circuits 10 are subjected to a common action, from one connection state to the other, so that the amplifier circuits of the same connection state produces output offset in the same positive or negative direction.

If the amplifier circuits 10 are arranged in one group and the connection states of the first time period are switched to that of the second time period with the frame period, the direction of variations in luminance of the respective pixels in the same connection state is the same in the display employing the data driver.

If now the amplifier circuits 10 are divided into two groups and control is performed differently from one group to the other, it is possible to average out the luminance in a row of pixels during one driving period, because the direction of variations of the luminance of the respective pixels, connected to the same scan line, differ from one group to the other. Hence, the control of FIG. 43 leads to improved quality of the display. Although FIG. 43 shows the case where the differential amplifier of FIG. 1 is used for the amplifier circuit 10, the same of course holds for the case of using the differential amplifier of FIG. 3, 5 or 7.

Although the present invention has so far been described with reference to the preferred embodiments, the present invention is not limited to the particular configurations of these embodiments. It will be appreciated that the present invention may encompass various changes or corrections such as may readily be arrived at by those skilled in the art within the scope and the principle of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:
1. A differential amplifier comprising:
first and second terminals for receiving signals;
a third terminal for outputting a signal;
first and second differential pairs, each having an input pair and an output pair, said first and second differential pairs being supplied with currents from associated current sources, respectively;
a load circuit connected to output pairs of said first and second differential pairs;
an amplifier stage for receiving, as an input, a signal of at least one connection node of a connection node pair of said load circuit and output pairs of said first and second differential pairs, said amplifier stage having an output connected to said third terminal; and
a connection switching circuit for controlling the switching between
a first connection state in which first and second inputs of the input pair of said first differential pair are connected to said first and second terminals, respectively, and in which first and second inputs of the input pair of said second differential pair are connected to said first terminal and to said third terminal, respectively, and
a second connection state in which the first and second inputs of the input pair of said first differential pair are connected to said third and first terminals, respectively, and in which the first and second inputs of the input pair of said second differential pair are connected to said second terminal and to said first terminal, respectively.

2. A differential amplifier comprising:
first and second terminals for receiving signals;
a third terminal for outputting a signal; first and second differential pairs, each having an input pair and an output pair, said first and second differential pairs being supplied with currents from associated current sources, respectively;
a load circuit connected to output pairs of said first and second differential pairs;
an amplifier stage for receiving, as an input, a signal of at least one connection node of a connection node pair of said load circuit and output pairs of said first and second differential pairs, said amplifier stage having an output connected to said third terminal; and
a connection switching circuit for controlling the switching between
a first connection state in which first and second inputs of an input pair of said first differential pair are connected to said first and second terminals, respectively, and in which first and second inputs of an input pair of said second differential pair are connected to said first terminal and to said third terminal, respectively, and
a second connection state in which the first and second inputs of the input pair of said first differential pair are connected to said second and first terminals, respectively, and in which the first and second inputs of the input pair of said second differential pair are connected to said third terminal and to said first terminal, respectively.

3. The differential amplifier according to claim 1, wherein said connection switching circuit controls, in addition to the switching between said first and second connection states,
a third switching state in which the first and second inputs of the input pair of said first differential pair are connected to said first and third terminals, respectively, and in which the first and second inputs of the input pair of said second differential pair are connected to said first terminal and to said second terminal, respectively, and
a fourth connection state in which the first and second inputs of the input pair of said first differential pair are connected to said second and first terminals, respectively, and in which the first and second inputs of the input pair of said second differential pair are connected to said third terminal and to said first terminal, respectively.

4. The differential amplifier according to claim 1, wherein first outputs of output pairs of said first and second differential pairs are connected to each other at a first connection node;
second outputs of the output pairs of said first and second differential pairs are connected to each other at a second connection node; and
wherein said connection switching circuit performs switching control so that, in said first connection state, said first connection node is connected, as an output end of the output pairs of said first and second differential pairs, to an input end of said amplifier stage, and so that, in said second connection state, said second connection node is connected, as an output end of the output pairs of said first and second differential pairs, to the input end of said amplifier stage.

5. The differential amplifier according to claim 1, wherein first outputs of the output pairs of said first and second differential pairs are connected to each other at a first connection node;
second outputs of the output pairs of said first and second differential pairs are connected to each other at a second connection node;
said amplifier stage is composed by a differential amplifier stage having an input pair; and wherein
said connection switching circuit performs switching control so that, in said first connection state, said first and second connection nodes are connected, as output ends of the output pairs of said first and second differential pairs, to first and second inputs of the input pair of said differential amplifier stage, respectively, and so that, in said second connection state, said first and second connection nodes are connected, as output ends of the output pairs of said first and second differential pairs, to the second and first inputs of the input pair of said differential amplifier stage, respectively.

6. The differential amplifier according to claim 3, wherein first outputs of the output pairs of said first and second differential pairs are connected to each other at a first connection node;
second outputs of the output pairs of said first and second differential pairs are connected to each other at a second connection node; and, wherein
said connection switching circuit performs control so that, in said first and third connection states, said first connection node is connected, as an output end of the output pairs of said first and second differential pairs, to the input end of said amplifier stage, and so that, in said second and fourth connection states, said second connection node is connected, as an output of the output pairs of said first and second differential pairs, to an input end of said amplifier stage.

7. The differential amplifier according to claim 3, wherein first outputs of the output pairs of said first and second differential pairs are connected to each other at a first connection node;
second outputs of the output pairs of said first and second differential pairs are connected to each other at a second connection node;
said amplifier stage is composed by a differential amplifier stage having an input pair; and, wherein
said connection switching circuit performs control so that, in said first and third connection states, said first and second connection nodes are connected, as output ends of the output pairs of said first and second differential pairs, to first and second inputs of the input pair of said differential amplifier stage, respectively, and so that, in said second and fourth connection states, said first and second connection nodes are connected, as output ends of the output pairs of said first and second differential pairs, to said second and first inputs of the input pair of said differential amplifier stage, respectively.

8. The differential amplifier according to claim 1, wherein said load circuit is a current mirror;
first outputs of output pairs of said first and second differential pairs are connected to each other at a first connection node;
second outputs of output pairs of said first and second differential pairs are connected to each other at a second connection node; and, wherein
said connection switching circuit performs control so that in said first connection state, said first connection node is connected to an output of said current mirror and to an input of said amplifier stage, and said second connection node is connected to an input of said current mirror, and so that in said second connection state, said first connection node is connected to the input of said current mirror and said second connection node is connected to the output of said current mirror and to the input of said amplifier stage.

9. The differential amplifier according to claim 3, wherein said load circuit is a current mirror;
first outputs of output pairs of said first and second differential pairs are connected to each other at a first connection node;
second outputs of output pairs of said first and second differential pairs are connected to each other at a second connection node; and, wherein
said connection switching circuit performs switching control so that
in said first and third connection states, said first connection node is connected to an output of said current mirror and to an input of said amplifier stage, and said second connection node is connected to an input of said current mirror, and so that
in said second and fourth connection states, said first connection node is connected to the input of said current mirror and said second connection node is connected to the output of said current mirror and to the input of said amplifier stage.

10. A display comprising a data driver including said differential amplifier as set fourth in claim 1, and a display panel; wherein
a data line of said display panel is driven based on an output signal of said data driver.

11. A display comprising:
a plurality of data lines extending in one direction parallel to one another; a plurality of scan lines extending parallel to one another in a direction perpendicular to said one direction;
a plurality of pixel electrodes arranged in the form of a matrix at points of intersection of said data lines and said scan lines;
a plurality of transistors associated with said pixel electrodes so that first ends of drain inputs and source inputs of the transistors are connected to the pixel electrodes associated therewith, second ends of the drain inputs and the source inputs are connected to said data lines, associated therewith, and so that gates of the transistors are connected to said scan lines; a gate driver for supplying scan signals to said scan lines; and a data driver for supplying gray-scale signals, associated with input data, to said data lines; said data driver being the data driver as set fourth in claim 10.

* * * * *